United States Patent
Mori

(10) Patent No.: US 11,043,934 B2
(45) Date of Patent: Jun. 22, 2021

(54) MULTIPLEXER, RADIO-FREQUENCY FRONT-END CIRCUIT, AND COMMUNICATION DEVICE

(71) Applicant: Murata Manufacturing Co., Ltd., Kyoto (JP)

(72) Inventor: Hirotsugu Mori, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 68 days.

(21) Appl. No.: 16/684,690

(22) Filed: Nov. 15, 2019

(65) Prior Publication Data

US 2020/0083865 A1    Mar. 12, 2020

Related U.S. Application Data

(63) Continuation of application No. PCT/JP2018/018020, filed on May 9, 2018.

(30) Foreign Application Priority Data

May 19, 2017    (JP) .............................. JP2017-100028

(51) Int. Cl.
*H03H 9/70*    (2006.01)
*H03H 7/38*    (2006.01)
(Continued)

(52) U.S. Cl.
CPC .............. *H03H 9/70* (2013.01); *H03H 7/38* (2013.01); *H03H 9/0009* (2013.01); *H03H 9/25* (2013.01);
(Continued)

(58) Field of Classification Search
CPC .......... H03H 7/38; H03H 9/70; H03H 9/0009; H03H 9/25; H03H 9/6453
See application file for complete search history.

(56) References Cited

U.S. PATENT DOCUMENTS 5,999,069 A    12/1999    Ushiroku
9,553,619 B2 *  1/2017    Domino ............... H04B 1/0483
(Continued)

FOREIGN PATENT DOCUMENTS

JP    H11-55067 A    2/1999
JP    2012-519445 A    8/2012
(Continued)

OTHER PUBLICATIONS

International Search Report for International Application No. PCT/JP2018/018020 dated Jul. 17, 2018.
(Continued)

*Primary Examiner* — Samuel S Outten
(74) *Attorney, Agent, or Firm* — Pearne & Gordon LLP

(57) ABSTRACT

A multiplexer (10) includes a common terminal (100c), a filter (21) that supports Band 41, a filter (22) that supports Band 40, and a filter (23) that supports Band 1Rx. A matching circuit (11) includes a capacitor (C1) connected in a path (111), a switch (SW1) connected between a ground and a node in the path (111) between the capacitor (C1) and the filter (21), a resonant circuit connected in a path (112) and having a resonant frequency in Band 40, the resonant frequency being a frequency at which an impedance is minimum, a switch (SW2) connected between the ground and a node in the path (112) between the resonant circuit and the filter (22), an inductor (L1) connected in a path (113), and a switch (SW3) connected between the ground and a node in the path (113) between the inductor (L1) and the filter (23).

20 Claims, 40 Drawing Sheets

(51) Int. Cl.
    *H03H 9/00*     (2006.01)
    *H03H 9/25*     (2006.01)
    *H03H 9/64*     (2006.01)

(52) U.S. Cl.
    CPC ..... *H03H 9/6453* (2013.01); *H03H 2007/386* (2013.01)

(56) References Cited

U.S. PATENT DOCUMENTS

| | | |
|---|---|---|
| 2012/0063368 A1 | 3/2012 | Boyle |
| 2017/0047666 A1* | 2/2017 | Khlat .................. H03H 7/0115 |
| 2017/0244442 A1 | 8/2017 | Mizokami et al. |
| 2019/0140619 A1 | 5/2019 | Takamine |
| 2019/0296708 A1 | 9/2019 | Takeuchi |

FOREIGN PATENT DOCUMENTS

| | | |
|---|---|---|
| JP | 2013-243600 A | 12/2013 |
| WO | 2016/030942 A1 | 3/2016 |
| WO | 2016-033427 A1 | 3/2016 |
| WO | 2016/208670 A1 | 12/2016 |
| WO | 2017/006867 A1 | 1/2017 |

OTHER PUBLICATIONS

Written Opinion for International Application No. PCT/JP2018/018020 dated Jul. 17, 2018.

\* cited by examiner

FIG. 5B
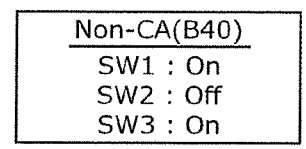
(STATE ii)
B40
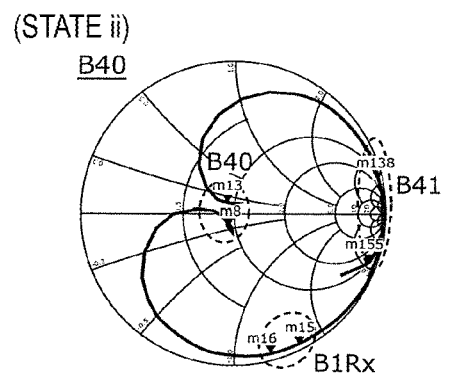
ADDITION OF C1
(STATE viii)
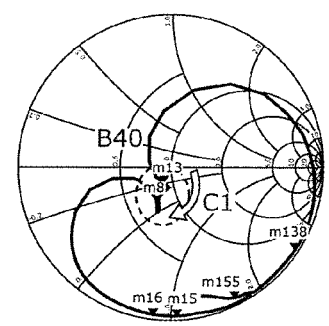
ADDITION OF L1
(STATE ix)
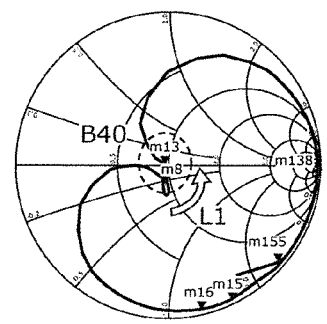

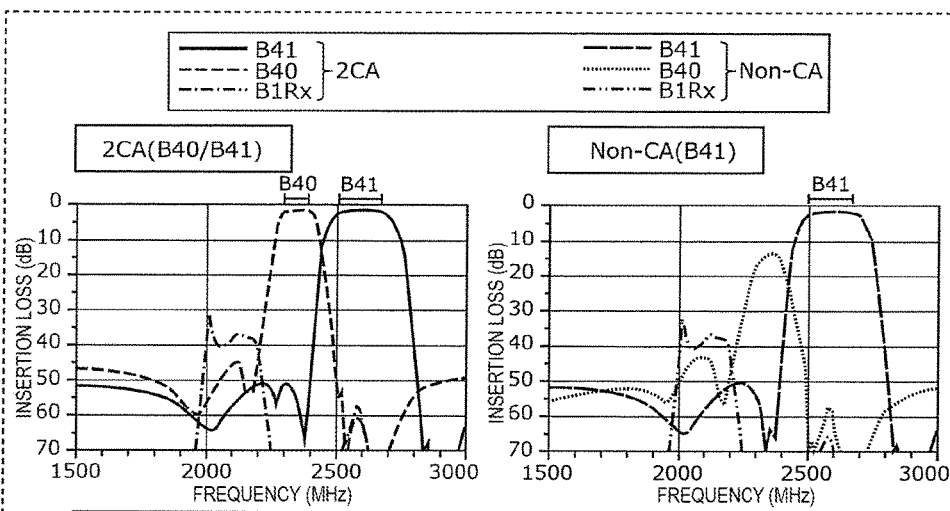
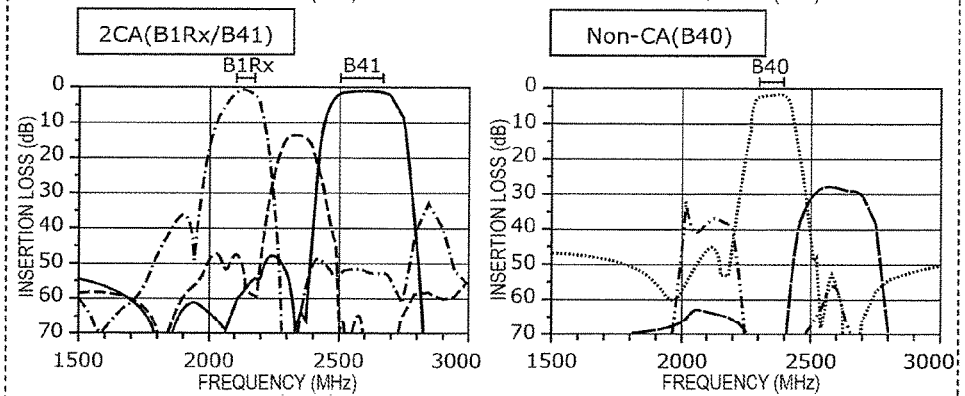
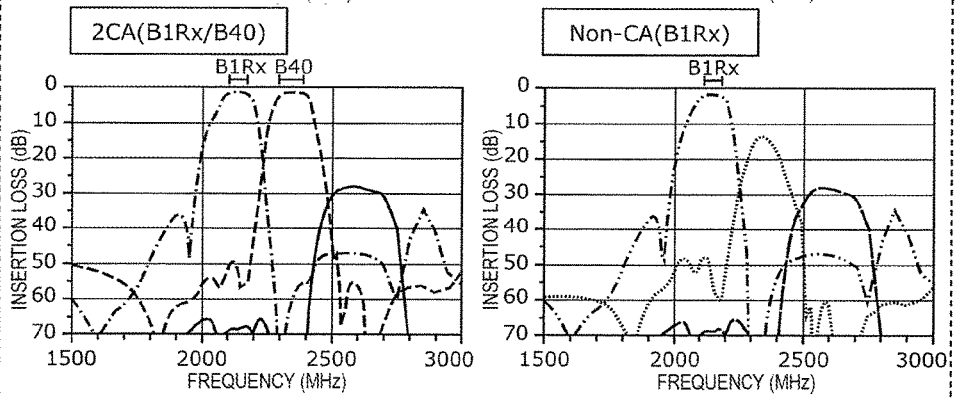
FIG. 9A  FIG. 9B  FIG. 9C  FIG. 9D  FIG. 9E  FIG. 9F

COMPARATIVE EXAMPLE

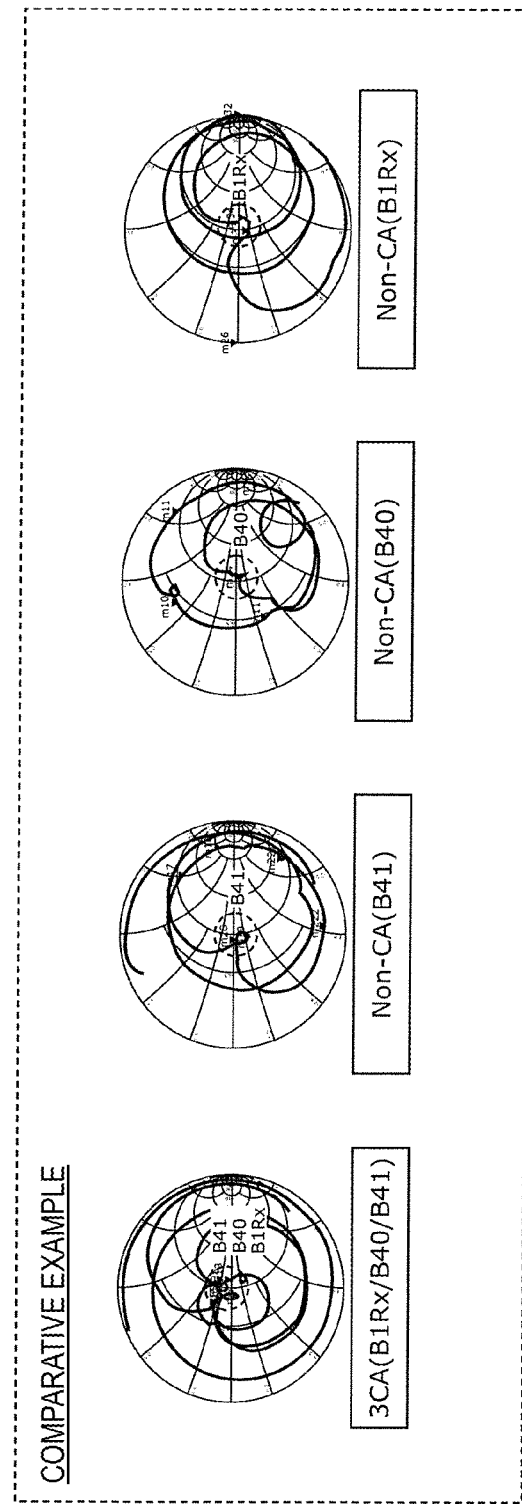

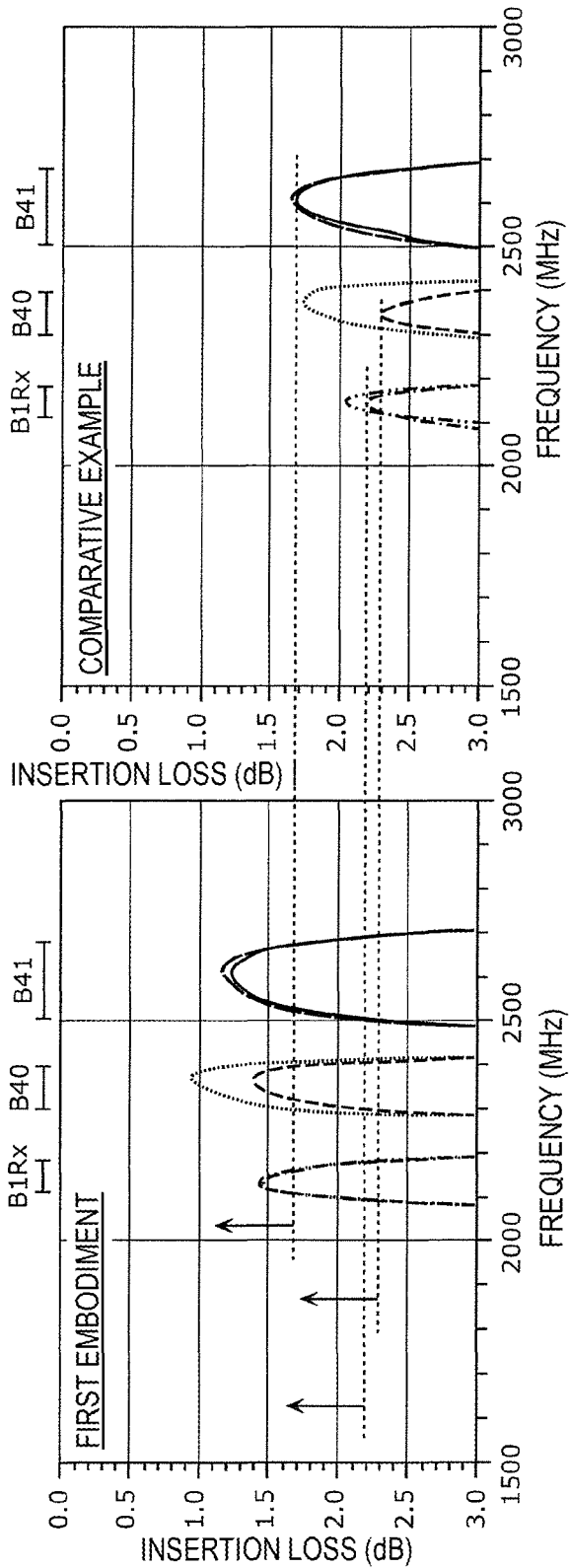
FIG. 13A FIRST EMBODIMENT
FIG. 13B COMPARATIVE EXAMPLE

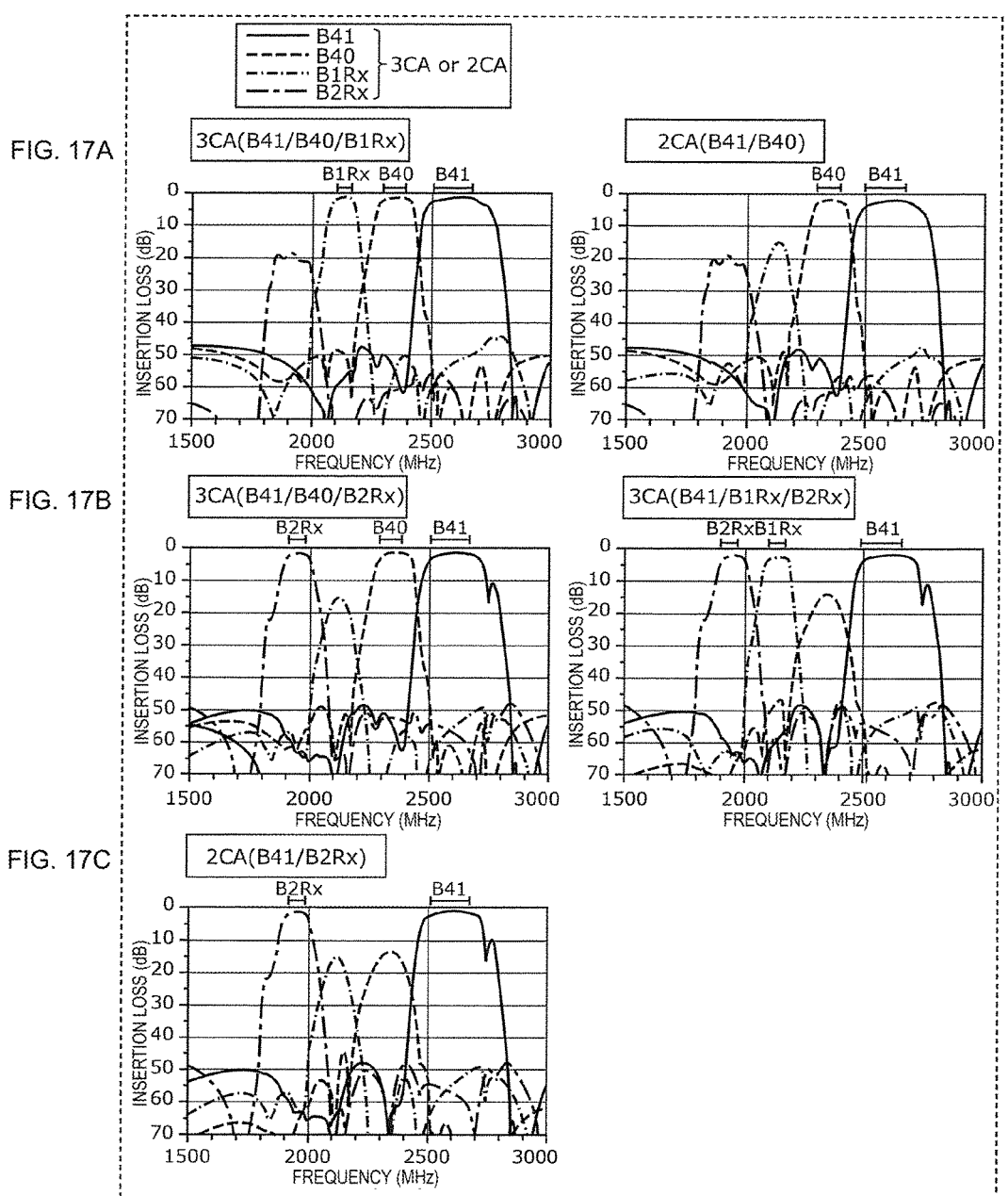

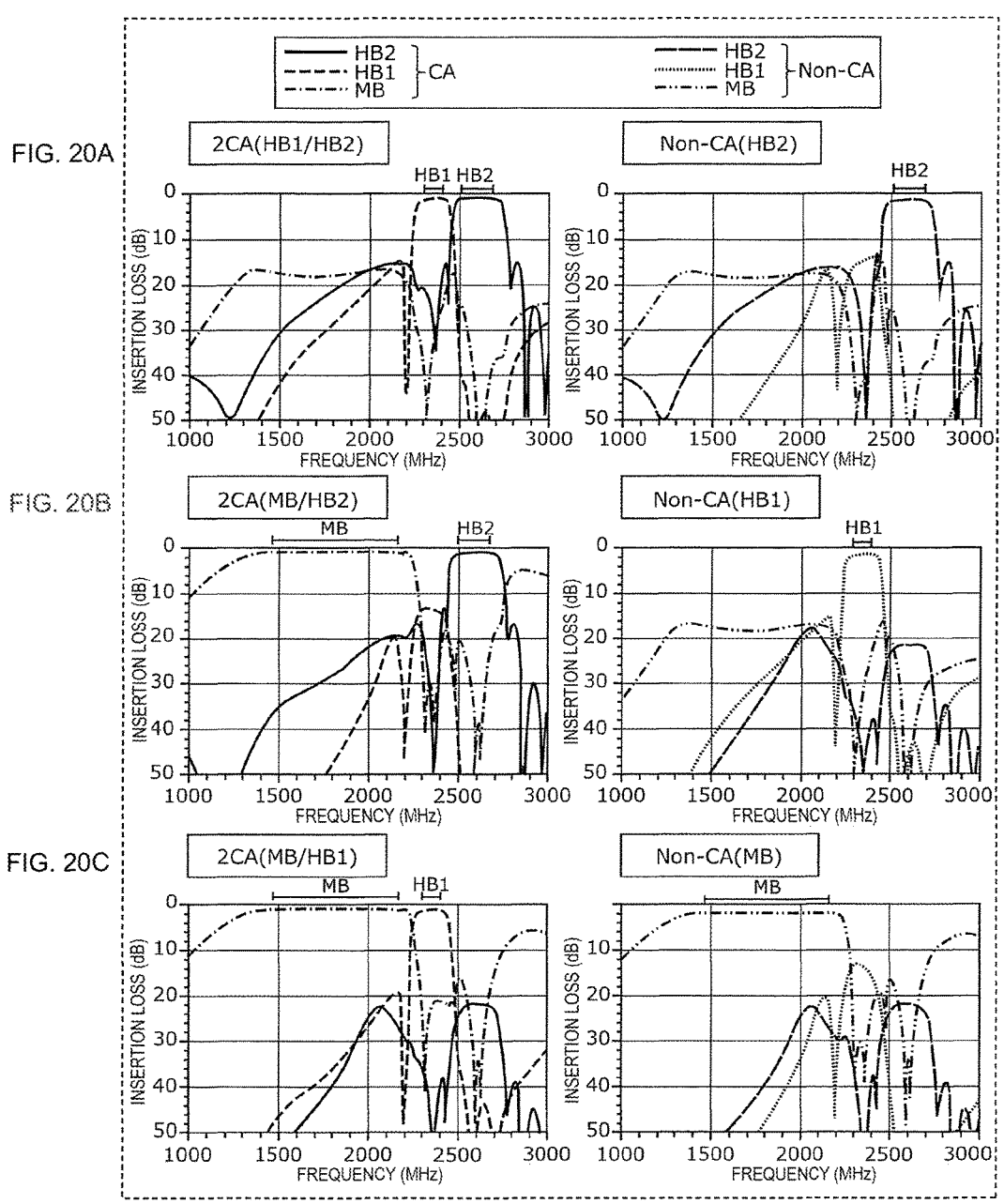

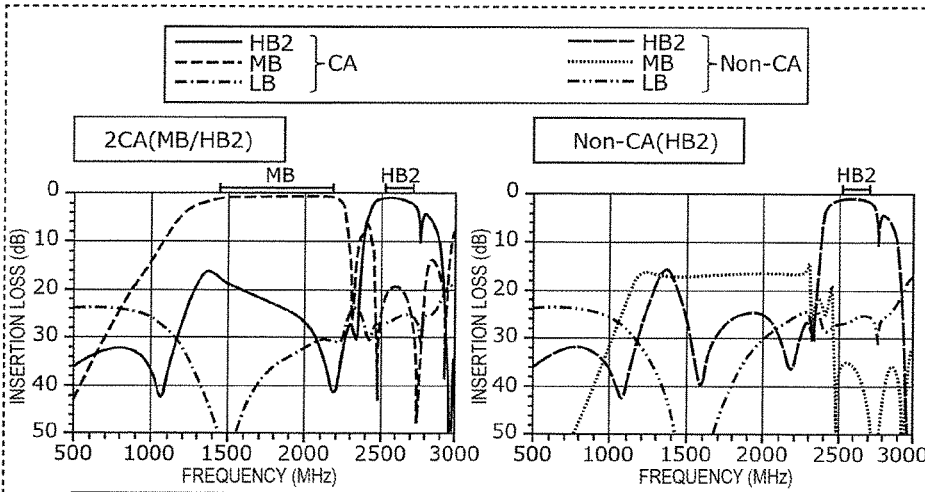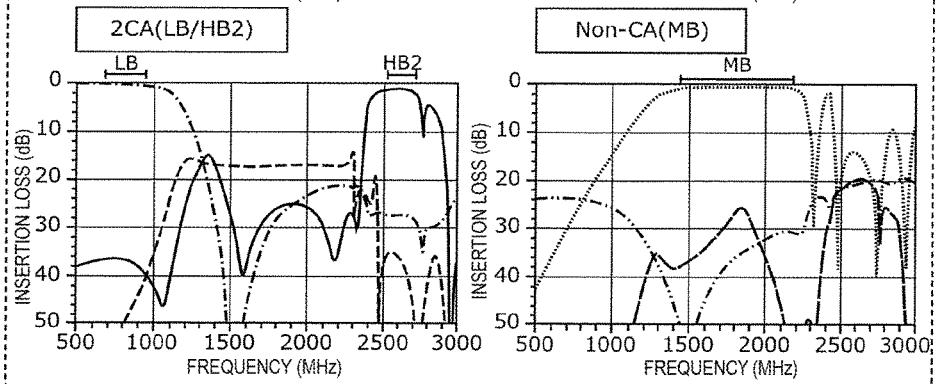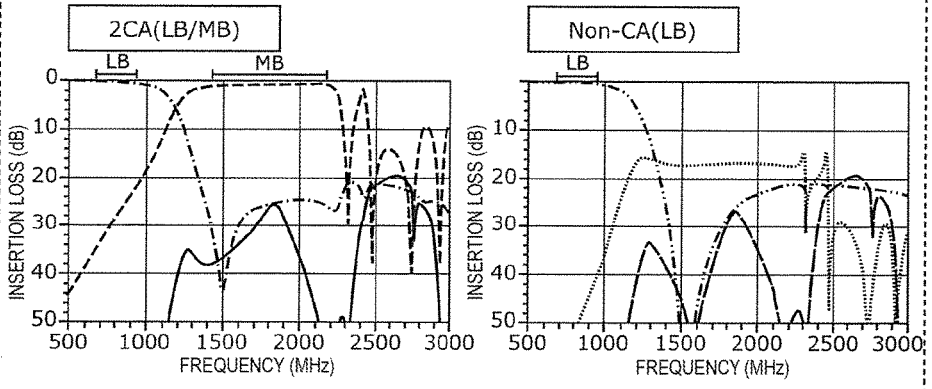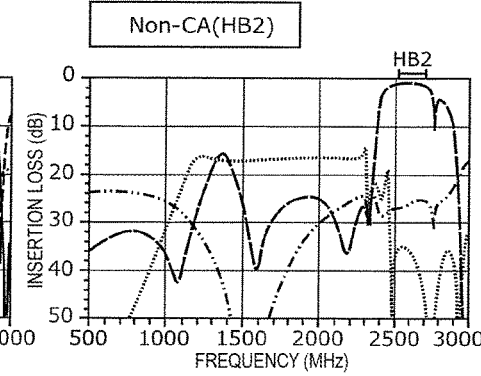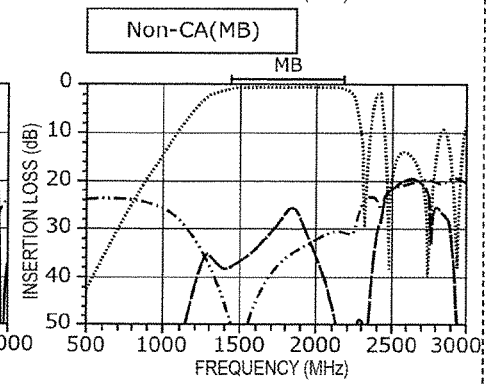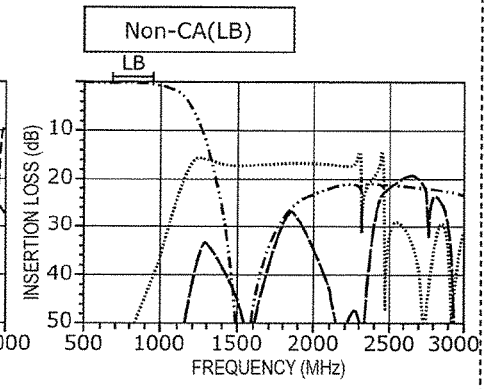

FIG. 32B
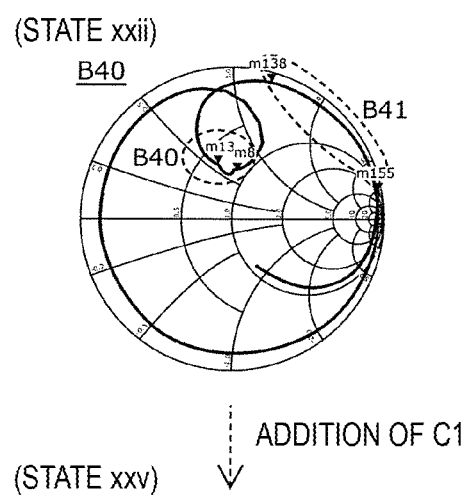
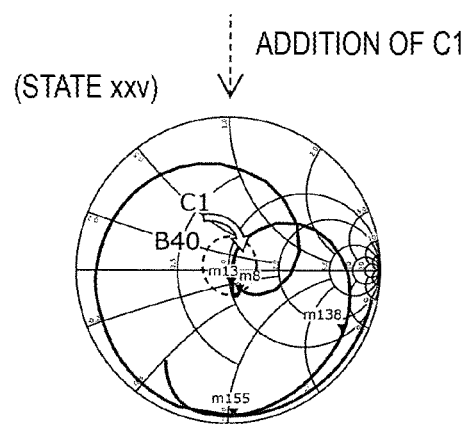

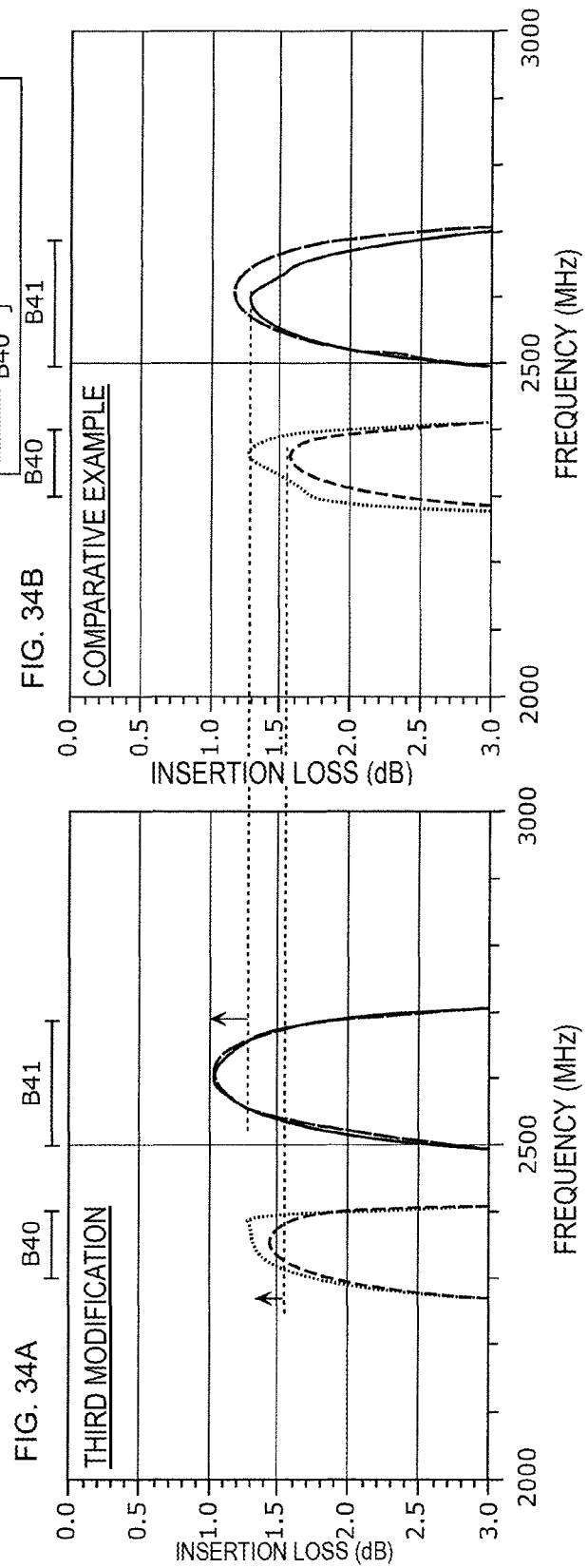

Band-C<Band-B<Band-A

MULTIPLEXER, RADIO-FREQUENCY FRONT-END CIRCUIT, AND COMMUNICATION DEVICE

This is a continuation of International Application No. PCT/JP2018/018020 filed on May 9, 2018 which claims priority from Japanese Patent Application No. 2017-100028 filed on May 19, 2017. The contents of these applications are incorporated herein by reference in their entireties.

BACKGROUND OF THE DISCLOSURE

Field of the Disclosure

The present disclosure relates to a multiplexer, a radio-frequency front-end circuit including the multiplexer, and a communication device including the multiplexer.

Description of the Related Art

To increase the efficiency of frequency use, development of radio-frequency front-end circuits that support a communication system using radio-frequency signals in multiple frequency bands (hereinafter, which may be referred to as bands) at the same time, such as carrier-aggregation (CA), has been proceeding. As such radio-frequency front-end circuits, a radio-frequency circuit including an impedance matching circuit (hereinafter, referred to as matching circuit) that is able to perform impedance matching (hereinafter, referred to as matching) both during CA operation and during non-CA operation is disclosed (see, for example, Patent Document 1).

The radio-frequency circuit supports two-band CA, and includes a matching circuit (a coupling circuit in Patent Document 1) including a first LC circuit associated with a path for one of the bands and a second LC circuit associated with a path for the other one of the bands. The first LC circuit includes a first inductor connected in series in a path and a first capacitor that connects the path and a ground. The second LC circuit includes a second capacitor connected in series in a path and a second inductor that connects the path and the ground. A first grounding switch is connected between the ground and a connection node between the first inductor and the first capacitor. A second grounding switch is connected between the ground and a connection node between the second capacitor and the second inductor.

With this configuration, the on and off states of the first grounding switch and the second grounding switch are switched between during CA operation and during non-CA operation, with the result that matching can be performed in any of CA and non-CA.

Patent Document 1: International Publication No. 2016/033427

BRIEF SUMMARY OF THE DISCLOSURE

However, inductors that are used in radio-frequency circuits often have a low quality factor, so there is a problem that a loss is large with the above-described existing configuration in which an LC circuit is connected one by one in each path.

Particularly, the existing matching circuit is connected one for every two paths respectively associated with the two bands. For this reason, when the existing matching circuit is applied to a multiplexer that supports CA of three or more bands, a plurality of the existing matching circuits is connected, so the influence of a loss due to inductor(s) is large.

It is an object of the present disclosure to reduce a loss in a multiplexer, radio-frequency front-end circuit, and communication device that support CA.

To achieve the above object, a multiplexer according to an aspect of the present disclosure includes a common terminal, a matching circuit, a first filter connected to the common terminal via the matching circuit, the first filter being configured to pass a radio-frequency signal in a first frequency band, a second filter connected to the common terminal via the matching circuit, the second filter being configured to pass a radio-frequency signal in a second frequency band lower in frequency than the first frequency band, a third filter connected to the common terminal via the matching circuit, the third filter being configured to pass a radio-frequency signal in a third frequency band lower in frequency than the second frequency band. The matching circuit includes a first capacitor connected in series in a first path that connects the common terminal and the first filter, a first switch connected between a ground and a node in the first path between the first capacitor and the first filter, a resonant circuit connected in series in a second path that connects the common terminal and the second filter and having a resonant frequency in the second frequency band, the resonant frequency being a frequency at which an impedance is minimum, a second switch connected between the ground and a node in the second path between the resonant circuit and the second filter, a first inductor connected in series in a third path that connects the common terminal and the third filter, and a third switch connected between the ground and a node in the third path between the first inductor and the third filter.

In this way, the first switch is connected between the ground and the node in the first path between the first capacitor and the first filter. The second switch is connected between the ground and the node in the second path between the resonant circuit and the second filter. The third switch is connected between the ground and the node in the third path between the first inductor and the third filter. Therefore, each of the first capacitor, the resonant circuit, and the first inductor functions as a matching element connected between the common terminal and the ground when an associated one of the first switch, the second switch, and the third switch is set to an on state.

Ordinarily, the resonant circuit having a resonant frequency at which the impedance is minimum exhibits an inductive impedance in frequencies higher than the resonant frequency, so the resonant circuit functions as an inductor. On the other hand, the resonant circuit exhibits a capacitive impedance in frequencies lower than the resonant frequency, so the resonant circuit functions as a capacitor. For this reason, the resonant circuit of the matching circuit functions as an inductor in the first frequency band and functions as a capacitor in the third frequency band. Thus, when the second switch is in an on state, the combined impedance can be varied between the first frequency band and the third frequency band.

With this configuration, when the element values of the first capacitor and first inductor are set as appropriate, even when at least any one of the first, second, and third switches is in an off state, matching can be performed for a pass band(s) that is/are the frequency band(s) that pass(es) the path(s) to which the switch(es) set to the off state is/are connected, of the first, second, and third frequency bands.

Therefore, according to this aspect, while the number of inductors is reduced, even in any one of the case where two or more frequency bands are simultaneously transferred (during CA operation) and the case where only one frequency band is transferred (during non-CA operation), matching can be performed for a pass band(s). Thus, a loss due to inductor(s) having a low quality factor is reduced, and a loss due to mismatching (return loss) is reduced, with the result that a low-loss multiplexer that supports CA is achieved.

The first switch may be set to an off state when the multiplexer transfers a radio-frequency signal in the first frequency band, and the first switch may be set to an on state otherwise, the second switch may be set to an off state when the multiplexer transfers a radio-frequency signal in the second frequency band, and the second switch may be set to an on state otherwise, and the third switch may be set to an off state when the multiplexer transfers a radio-frequency signal in the third frequency band, and the third switch may be set to an on state otherwise.

In this way, each of the first switch, the second switch, and the third switch is switched between the on state and the off state in accordance with a frequency band(s) of a radio-frequency signal(s) that the multiplexer transfers. Therefore, when the common terminal-side impedance of each of the first filter, the second filter, and the third filter and the element values of the first capacitor and first inductor are adjusted as appropriate, matching can be performed even during non-CA operation for any frequency band or even during CA operation for any combination of frequency bands, so a low loss in a pass band(s) is possible.

When the multiplexer transfers only a radio-frequency signal in the first frequency band, the first switch may be set to an off state, and the second switch and the third switch each may be set to an on state, when the multiplexer transfers only a radio-frequency signal in the second frequency band, the second switch may be set to an off state, and the first switch and the third switch each may be set to an on state, and, when the multiplexer transfers only a radio-frequency signal in the third frequency band, the third switch may be set to an off state, and the first switch and the second switch each may be set to an on state.

With this configuration, when the multiplexer transfers only a radio-frequency signal in the first frequency band (during non-CA operation for the first frequency band), the resonant circuit and the first inductor are added as the matching elements for the first filter. Thus, matching can be performed by shifting the impedance of the common terminal, which shows a capacitive characteristic in the first frequency band when the second switch and the third switch are in the off state, toward an inductive characteristic side with an inductive combined impedance of the resonant circuit and first inductor as a result of setting the second switch and the third switch to the on state.

When the multiplexer transfers only a radio-frequency signal in the second frequency band (during non-CA operation for the second frequency band), the first capacitor and the first inductor are added as the matching elements for the second filter. Thus, matching can be performed by not shifting the impedance of the common terminal, which is matched in the second frequency band when the first switch and the third switch are in the off state, with a combined impedance whose inductive characteristic and capacitive characteristic are cancelled by the first capacitor and the first inductor as a result of setting the first switch and the third switch to the on state.

When the multiplexer transfers only a radio-frequency signal in the third frequency band (during non-CA operation for the third frequency band), the first capacitor and the resonant circuit are added as the matching elements for the third filter. Thus, matching can be performed by shifting the impedance of the common terminal, which shows an inductive characteristics in the third frequency band when the first switch and the second switch are in the off state, toward a capacitive characteristic side with a capacitive combined impedance of the first capacitor and resonant circuit as a result of setting the first switch and the second switch to the on state.

Therefore, during non-CA operation for the first frequency band, the second frequency band, or the third frequency band, a low-loss in a pass band is achieved even during non-CA for any frequency band.

When the multiplexer simultaneously transfers a radio-frequency signal in the first frequency band and a radio-frequency signal in the second frequency band, the first switch and the second switch each may be set to an off state, and the third switch may be set to an on state, when the multiplexer simultaneously transfers a radio-frequency signal in the first frequency band and a radio-frequency signal in the third frequency band, the first switch and the third switch each may be set to an off state, and the second switch may be set to an on state, and, when the multiplexer simultaneously transfers a radio-frequency signal in the second frequency band and a radio-frequency signal in the third frequency band, the second switch and the third switch each may be set to an off state, and the first switch may be set to an on state.

With this configuration, when the multiplexer simultaneously transfers a radio-frequency signal in the first frequency band and a radio-frequency signal in the second frequency band (during CA operation for the first frequency band and the second frequency band), the first inductor is added as the matching element for each of the first filter and the second filter. Thus, matching can be performed by shifting the combined impedance of the first path and second path, which shows a capacitive characteristic in the first frequency band and the second frequency band when the third switch is in the off state, toward an inductive characteristic side with the inductive impedance of the first inductor as a result of setting the third switch to the on state.

When the multiplexer simultaneously transfers a radio-frequency signal in the first frequency band and a radio-frequency signal in the third frequency band (during CA operation for the first frequency band and the third frequency band), the resonant circuit is added as the matching element for each of the first filter and the third filter. Thus, when the second switch is in the off state, the combined impedance of the first path and the third path, which shows a capacitive characteristic in the first frequency band and shows an inductive characteristic in the third frequency band, can be shifted as follows. In other words, matching can be performed by shifting the impedance toward an inductive characteristic side with the inductive impedance of the resonant circuit in the first frequency band and shifting the impedance toward a capacitive characteristic side with the capacitive impedance of the resonant circuit in the third frequency band as a result of setting the second switch to the on state.

When the multiplexer simultaneously transfers a radio-frequency signal in the second frequency band and a radio-frequency signal in the third frequency band (during CA operation for the second frequency band and the third frequency band), the first capacitor is added as the matching element for each of the second filter and the third filter. Thus, matching can be performed by shifting the combined impedance of the second path and third path, which shows an inductive characteristic in the second frequency band and the third frequency band when the first switch is in the off state, toward a capacitive characteristic side with a capacitive impedance of the first capacitor as a result of setting the first switch to the on state.

Therefore, during CA operation for any two frequency bands (during two-band CA operation) of the first frequency band, the second frequency band, and the third frequency band, a low loss in pass bands is achieved regardless of a combination of frequency bands.

When the multiplexer simultaneously transfers a radio-frequency signal in the first frequency band, a radio-frequency signal in the second frequency band, and a radio-frequency signal in the third frequency band, the first switch, the second switch, and the third switch each may be set to an off state.

With this configuration, by designing the impedances of the first path, second path, and third path viewed from the common terminal as appropriate, matching can be performed for any of the first frequency band, the second frequency band, and the third frequency band in the above case (during three-band CA operation for the first frequency band, the second frequency band, and the third frequency band). Therefore, during three-band CA operation, a low loss in pass bands is achieved.

When the first switch is in an off state, a first impedance of the first path viewed from the common terminal may be located in a third quadrant that is a left lower side to a center on a Smith chart in the first frequency band, when the second switch is in an off state, a second impedance of the second path viewed from the common terminal may be located near a center on a Smith chart in the second frequency band, and, when the third switch is in an off state, a third impedance of the third path viewed from the common terminal may be located in a second quadrant that is a left upper side to a center on a Smith chart in the third frequency band.

In this regard, when at least one of the second switch and the third switch is in an on state, at least one of the resonant circuit and the first inductor is added as the matching element for the first filter, with the result that the impedance of the common terminal shifts in a counterclockwise direction along a constant conductance circle on a Smith chart. Therefore, the first impedance is located in the third quadrant on the Smith chart, so the impedance of the common terminal when the first switch is in the off state and at least one of the second switch and the third switch is in the on state is more easily brought close to the center on the Smith chart in the first frequency band.

When at least one of the first switch and the third switch is in an on state, at least one of the first capacitor and the first inductor is added as the matching element for the second filter, with the result that the impedance of the common terminal can shift in both directions along a constant conductance circle on the Smith chart. Therefore, when the second impedance is located near the center on the Smith chart, the impedance of the common terminal when the second switch is in the off state and at least one of the first switch and the third switch is in the on state is more easily brought close to the center on the Smith chart in the second frequency band.

When at least one of the first switch and the second switch is in an on state, at least one of the first capacitor and the resonant circuit is added as the matching element for the third filter, with the result that the impedance of the common terminal shifts in a clockwise direction along a constant conductance circle on the Smith chart. For this reason, the third impedance is located in the second quadrant on the Smith chart, so the impedance of the common terminal when the third switch is in the off state and at least one of the first switch and the second switch is in the on state is more easily brought close to the center on the Smith chart in the third frequency band.

Therefore, when at least one of the first switch, the second switch, and the third switch is in the off state and the other switch(es) is/are in the on state, matching can be more easily performed for the path(s) to which the switch(es) set to the off state is/are connected. Thus, in this case, a low loss is further reliably achieved for a radio-frequency signal in a pass band, which is transferred through the path.

When the first switch is in an off state, the first impedance may show a capacitive characteristic in the second frequency band and the third frequency band, when the second switch is in an off state, the second impedance may show an inductive characteristic in at least part of the first frequency band, and may show a capacitive characteristic in the third frequency band, and, when the third switch is in an off state, the third impedance may show an inductive characteristic in the first frequency band and the second frequency band.

With this configuration, when any of the first switch, the second switch, and the third switch is in the off state, the first impedance, the second impedance, and the third impedance can be brought close to a complex conjugate relation in any of the first frequency band, the second frequency band, and the third frequency band. Thus, in any of the frequency bands, the combined impedance of the first path, the second path, and the third path can be brought close to a center on a Smith chart.

Therefore, when any of the first switch, the second switch, and the third switch is in the off state, a low loss is achieved for any of the first frequency band, the second frequency band, and the third frequency band.

The resonant circuit may be an acoustic wave resonator connected in series in the second path.

In this regard, the acoustic wave resonator has a resonant frequency at which the impedance is minimum and an anti-resonant frequency at which the impedance is maximum. The anti-resonant frequency is higher in frequency than the resonant frequency. For this reason, with the acoustic wave resonator used as the resonant circuit, when the second switch is in an off state, the impedance of the second path can be increased in the first frequency band. Thus, when the second switch is in the off state, an attenuation in the first frequency band is improved (that is, an attenuation is increased) for a radio-frequency signal that passes through the second filter, so branching characteristics are improved. This is particularly remarkable when the anti-resonant frequency of the acoustic wave resonator is located near the first frequency band. In addition, this configuration is particularly useful when an inter-band gap that is a frequency interval between the first frequency band and the second frequency band is narrow.

The second filter may be an acoustic wave filter made up of one or more acoustic wave resonators, of the one or more acoustic wave resonators that make up the second filter, the acoustic wave resonator connected closest to the common terminal may be a parallel arm resonator or a series arm resonator, and, when the second switch is in an off state, the acoustic wave resonator that is the resonant circuit and the one or more acoustic wave resonators that make up the second filter may make up a ladder circuit that passes a radio-frequency signal in the second frequency band.

With this configuration, the number of acoustic wave resonators that make up the second filter can be reduced, so miniaturization is achieved.

The resonant circuit may be an LC series resonant circuit in which an inductor and a capacitor are connected in series.

When the resonant circuit is made up of an inductor and a capacitor whose element values are easily adjustable, matching can be performed with higher accuracy. Therefore, a loss due to mismatching is further reduced, so a further low loss is achieved.

The first filter may be an acoustic wave filter made up of one or more acoustic wave resonators, and a second inductor may be connected in at least one of the first path between the first filter and the node to which the first switch is connected and a path that connects one of input/output terminals of the first filter and an other one of the input/output terminals of the first filter.

With this configuration, even when the first filter is an acoustic wave filter, a low loss is achieved.

Each of the first filter, the second filter, and the third filter may be an acoustic wave filter made up of one or more acoustic wave resonators.

In this regard, with the acoustic wave filter, a high-selectivity filter is manufactured in small size and low profile. Therefore, when each of the first filter, the second filter, and the third filter is an acoustic wave filter, a miniaturized and low-profile multiplexer having a high selectivity is achieved.

The first path, the second path, and the third path may be connected in common to the common terminal, and the multiplexer may further include a third inductor connected to a common connection portion of the first path, second path, and third path.

With such a third inductor, minute adjustment of matching can be performed with not only the matching circuit but also with the third inductor, so matching can be performed with higher accuracy. Thus, a return loss due to mismatching is further reduced, so a further low loss is achieved. This is particularly remarkable when the first filter, the second filter, and the third filter have an impedance that shows a capacitive characteristic, like an acoustic wave filter, or the like.

The multiplexer may include a plurality of the second filters that respectively pass mutually different radio-frequency signals in the second frequency band, the matching circuit may include a plurality of the resonant circuits associated with the plurality of second filters, and a plurality of the second switches respectively connected between the ground and the node in one of a plurality of the second paths between the plurality of resonant circuits and the plurality of second filters and between the ground and the node in an other one of the plurality of second paths, and each of the plurality of resonant circuits may have a resonant frequency in the second frequency band of an associated one of the plurality of second filters.

With this configuration, a low loss is achieved for a multiplexer that supports CA of four or more bands.

A multiplexer according to another aspect of the present disclosure includes a common terminal, a matching circuit, a first filter connected to the common terminal via the matching circuit, the first filter being configured to pass a radio-frequency signal in a first frequency band, and a third filter connected to the common terminal via the matching circuit, the third filter being configured to pass a radio-frequency signal in a third frequency band lower in frequency than the first frequency band. The matching circuit includes a first capacitor connected in series in a first path that connects the common terminal and the first filter, a first switch connected between a ground and a node in the first path between the first capacitor and the first filter, a first inductor connected in series in a third path that connects the common terminal and the third filter, and a third switch connected between the ground and a node in the third path between the first inductor and the third filter. When the first switch is in an off state, a first impedance of the first path viewed from the common terminal is located in a third quadrant that is a left lower side to a center on a Smith chart in the first frequency band, and shows a capacitive characteristic in the third frequency band. When the third switch is in an off state, an impedance of the third path viewed from the common terminal is located in a second quadrant that is a left upper side to a center on a Smith chart in the third frequency band, and shows an inductive characteristic in the first frequency band.

In this way, the first switch is connected between the ground and the node in the first path between the first capacitor and the first filter. Thus, when the first switch is in an on state, the first capacitor functions as a matching element connected between the common terminal and the ground, for the third filter. The third switch is connected between the ground and the node in the third path between the first inductor and the third filter. Thus, when the third switch is in an on state, the first inductor functions as a matching element connected between the common terminal and the ground, for the first filter.

With this configuration, the first impedance that is located in the third quadrant in the first frequency band when the first switch is in the off state shifts in a counterclockwise direction along a constant conductance circle on a Smith chart and approaches a center as a result of setting the third switch to the on state. Thus, during non-CA operation for the first frequency band, when the first switch is set to the off state and the third switch is set to the on state, a low loss is achieved in the first frequency band.

The third impedance that is located in the second quadrant in the third frequency band when the third switch is in the off state shifts in a clockwise direction along a constant conductance circle on a Smith chart and approaches a center as a result of setting the first switch to the on state. Thus, during non-CA operation for the third frequency band, when the first switch is set to the on state and the third switch is set to the off state, a low loss is achieved in the third frequency band.

When any of the first switch and the third switch is in the off state, the first impedance and the third impedance can be brought close to a complex conjugate relation in any of the first frequency band and the third frequency band. Thus, in any of the above frequency bands, the combined impedance of the first path and third path can be brought close to the center on the Smith chart. As a result, during CA operation for the first frequency band and the third frequency band, when the first switch is set to the off state and the third switch is set to the off state, a low loss is achieved in any of the first frequency band and the third frequency band.

Therefore, according to this aspect, while the number of inductors is reduced, even in any one of the case where two or more frequency bands are simultaneously transferred (during CA operation) and the case where only one frequency band is transferred (during non-CA operation), matching can be performed in the frequency band(s) of a radio-frequency signal(s) to be transferred. Thus, a loss due to the connection of an inductor having a low quality factor is reduced, and a loss due to mismatching (return loss) is reduced, with the result that a low-loss multiplexer that supports CA is achieved.

The multiplexer may further include a second filter connected to the common terminal via the matching circuit, the second filter being configured to pass a radio-frequency signal in a second frequency band lower in frequency than the first frequency band and higher in frequency than the third frequency band. The matching circuit may further include a second capacitor or a second inductor connected in series in a second path that connects the common terminal and the second filter, and a second switch connected between the ground and a node in the second path between the second filter and the second capacitor or the second inductor. When the second switch is in an off state, an impedance of the second path viewed from the common terminal may be located near a center on a Smith chart in the second frequency band, may show an inductive characteristic in at least part of the first frequency band, and may show a capacitive characteristic in the third frequency band.

With this configuration, when the element values of the first capacitor, the second capacitor or second inductor, and the first inductor are set as appropriate, even when at least any one of the first, second, and third switches is in the off state, matching can be performed for a pass band(s) that is/are the frequency band(s) that pass(es) the path(s) to which the switch(es) set to the off state is/are connected, of the first, second, and third frequency bands.

Therefore, according to this aspect, while the number of inductors is reduced, even in any one of the case where two or more frequency bands are simultaneously transferred (during CA operation) and the case where only one frequency band is transferred (during non-CA operation), matching can be performed for a pass band(s). Thus, a loss due to inductor(s) having a low quality factor is reduced, and a loss due to mismatching (return loss) is reduced, with the result that a low-loss multiplexer that supports CA is achieved.

With the multiplexer in which the second capacitor is disposed in series in the second path, an insertion loss in a pass band is reduced. On the other hand, with the multiplexer in which the second inductor is disposed in series in the second path, a large attenuation in a harmonic band is ensured.

The matching circuit may include a filter that includes the first capacitor and that passes a radio-frequency signal in the first frequency band, and a filter that includes the first inductor and that passes a radio-frequency signal in the third frequency band.

The multiplexer may further include a fourth filter connected to the common terminal via the matching circuit, the fourth filter being configured to pass a radio-frequency signal in a fourth frequency band different from the first frequency band or the third frequency band. The matching circuit may further include a filter that includes a capacitor and an inductor connected in a fourth path that connects the common terminal and the fourth filter without including a switch, the filter being configured to pass a radio-frequency signal in the fourth frequency band.

With this configuration, even during any of CA operation and non-CA operation, a loss in a pass band(s) is reduced by the matching circuit.

A radio-frequency front-end circuit according to an aspect of the present disclosure includes the above-described multiplexer and an amplifier circuit connected to the multiplexer.

With this configuration, a low loss is achieved for a radio-frequency front-end circuit that supports CA.

A communication device according to an aspect of the present disclosure includes the above-described radio-frequency front-end circuit, and an RF signal processing circuit configured to process at least one of a radio-frequency signal that is outputted to the radio-frequency front-end circuit and a radio-frequency signal inputted from the radio-frequency front-end circuit. The RF signal processing circuit is further configured to switch between an on state and off state of each of the first switch, the second switch, and the third switch.

With this configuration, a low loss is achieved for a communication device that supports CA.

According to the present disclosure, a low loss is achieved for a multiplexer, radio-frequency front-end circuit, and communication device that support CA.

BRIEF DESCRIPTION OF THE SEVERAL VIEWS OF THE DRAWINGS

Each of FIGS. 1A, 1B and 1C is a diagram that shows the configuration of a multiplexer according to a first embodiment.

FIG. 5B is a schematic view that illustrates the mechanism of matching during non-CA operation for Band 40 in the first embodiment.

FIGS. 9A, 9B, 9C, 9D, 9E and 9F show graphs that individually show bandpass characteristics during two-band CA operation and bandpass characteristics during non-CA operation of the multiplexer according to the first embodiment.

FIG. 11 shows Smith charts that show impedances at a common terminal of the multiplexer according to the comparative example of the first embodiment.

FIGS. 13A and 13B show graphs of bandpass characteristics during three-band CA operation and bandpass characteristics during non-CA operation for comparison between the first embodiment and the comparative example.

FIGS. 17A, 17B, 17C, 17D and 17E show graphs that individually show bandpass characteristics during three-band CA operation and bandpass characteristics during two-band CA operation of the multiplexer according to the second embodiment.

FIGS. 20A, 20B, 20C, 20D, 20E and 20F show graphs that individually show bandpass characteristics during two-band CA operation and bandpass characteristics during non-CA operation of the multiplexer according to the third embodiment.

FIGS. 27A, 27B, 27C, 27D, 27E and 27F show graphs that individually show bandpass characteristics during two-band CA operation and bandpass characteristics during non-CA operation of the multiplexer according to the first modification.

FIG. 32B is a schematic view that illustrates the mechanism of matching during non-CA operation for Band 40 in the third modification.

FIGS. 34A and 34B show graphs of bandpass characteristics during CA operation and bandpass characteristics during non-CA operation for comparison between the third modification and a comparative example of the third modification.

DETAILED DESCRIPTION OF THE DISCLOSURE

Figure 1:
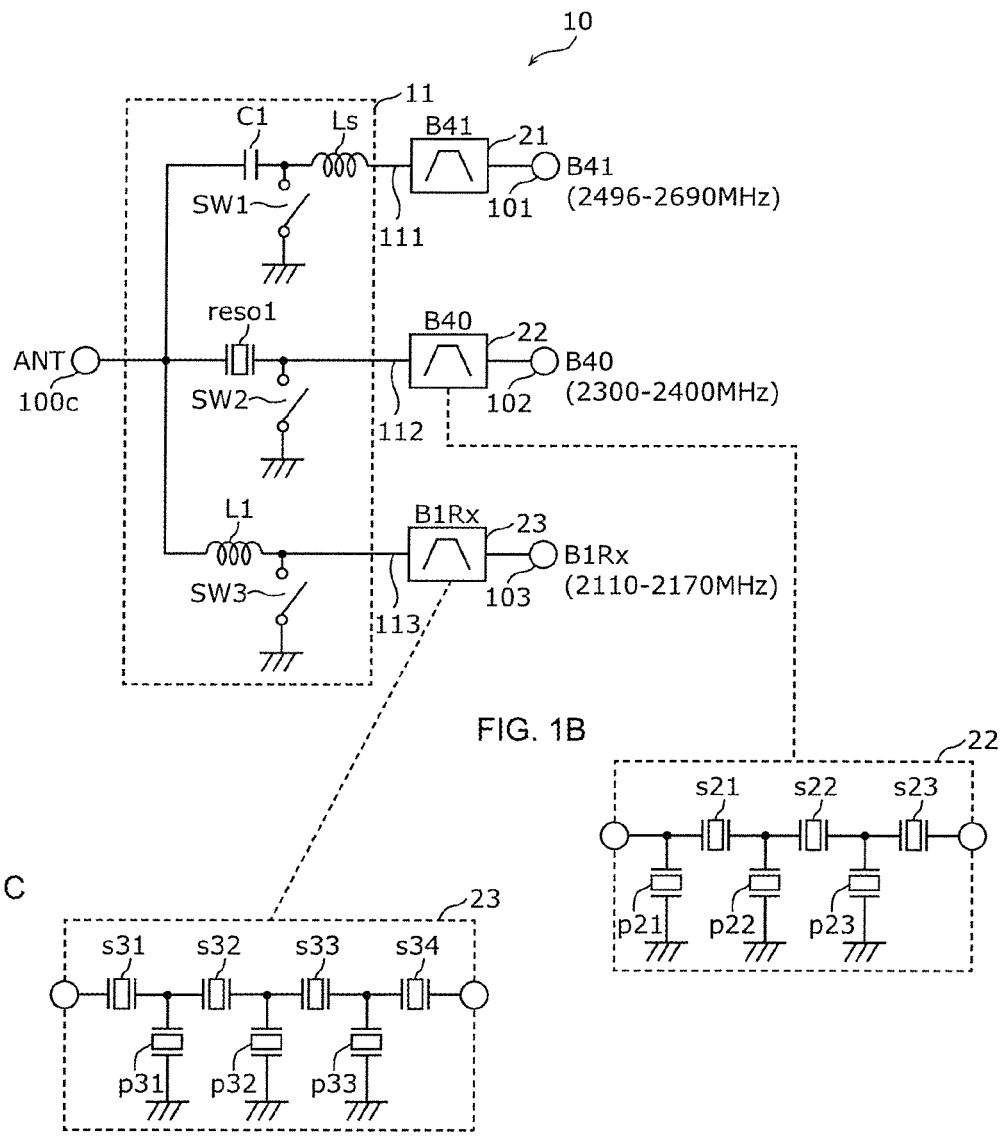

Hereinafter, a multiplexer, and other devices, according to embodiments of the present disclosure will be described in detail with reference to the drawings. All the embodiments that will be described below are general or specific examples. Numeric values, shapes, materials, elements, disposition and connection modes of the elements, and the like, that will be described below are illustrative, and are not intended to limit the present disclosure. Of the elements in the following embodiments, the elements not included in the independent claims will be described as optional elements. In addition, the size or size ratio of elements shown in the drawings is not necessarily strict. In the drawings, like reference numerals denote substantially identical components, and the overlap description may be omitted or simplified. For circuit elements, such as resonators, constants can be adjusted as needed according to required specifications, or the like.

First Embodiment

[1. Configuration]

Each of FIGS. 1A, 1B and 1C is a diagram that shows the configuration of a multiplexer 10 according to a first embodiment. Specifically, in the diagram, FIG. 1A is a circuit block diagram of the multiplexer 10, FIG. 1B is a circuit diagram of a filter 22 shown in FIG. 1A, and FIG. 1C is a circuit diagram of a filter 23 shown in FIG. 1A.

The multiplexer 10 supports CA for simultaneously transmitting or receiving multiband radio-frequency signals, transfers multiband radio-frequency signals during CA operation in which the multiband radio-frequency signals are simultaneously transmitted or received, and transfers only a single-band radio-frequency signal during non-CA operation in which the single-band radio-frequency signal is transmitted or received. In the present embodiment, the multiplexer 10 is a triplexer for receiving Band 41 (2496

MHz to 2690 MHz: "B41" in the diagram), Band 40 (2300 MHz to 2400 MHz: "B40" in the diagram), and the receiving band of Band 1 (2110 MHz to 2170 MHz: "B1Rx" in the diagram; hereinafter, referred to as Band 1Rx), which are frequency standards defined in 3GPP (third generation partnership project).

Specifically, the multiplexer 10 includes a common terminal 100c (ANT terminal in FIG. 1A), a matching circuit 11, and filters 21 to 23.

The number of filters of the multiplexer 10 and supporting frequency bands are not limited to the above. The multiplexer 10 is not limited to a receiving type and may be a transmission type or may include, for example, a duplexer of which some of filters are of a receiving type and the other filters are of a transmission type.

The matching circuit 11 is a circuit that matches the common terminal 100c with the plurality of filters 21 to 23. The matching circuit 11 includes a capacitor C1, a resonator reso1, an inductor L1, and switches SW1 to SW3. In the present embodiment, the matching circuit 11 further includes an inductor Ls. The matching circuit 11 does not need to include the inductor Ls.

The capacitor C1 is a first capacitor connected in series in a path 111 that is a first path connecting the common terminal 100c and the filter 21.

The resonator reso1 is connected in series in a path 112 that is a second path connecting the common terminal 100c and the filter 22. The resonator reso1 is an example of a resonant circuit having a resonant frequency at which an impedance is minimum in Band 40. Specifically, the resonator reso1 is an acoustic wave resonator connected in series in the path 112. In the present embodiment, the resonator reso1 cooperates with series arm resonators s21 to s23 and parallel arm resonators p21 to p23 to make up a ladder circuit that passes a radio-frequency signal in Band 40. The series arm resonators s21 to s23 and the parallel arm resonators p21 to p23 are one or more acoustic wave resonators that make up the filter 22.

The inductor L1 is a first inductor connected in series in a path 113 that is a third path connecting the common terminal 100c and the filter 23.

The switch SW1 is a first switch connected between a ground and a node in the path 111 between the capacitor C1 and the filter 21. The switch SW2 is a second switch connected between the ground and a node in the path 112 between the resonator reso1 and the filter 22. The switch SW3 is a third switch connected between the ground and a node in the path 113 between the inductor L1 and the filter 23.

Each of these switches SW1 to SW3 is, for example, an SPST switch, and is switched between an on state and an off state in accordance with a control signal from a control unit (not shown), such as an RFIC (radio frequency integrated circuit). Specifically, the switch SW1 is set to the off state when the multiplexer 10 transfers a radio-frequency signal in Band 41, and the switch SW1 is set to the on state otherwise. The switch SW2 is set to the off state when the multiplexer 10 transfers a radio-frequency signal in Band 40, and the switch SW2 is set to the on state otherwise. The switch SW3 is set to the off state when the multiplexer 10 transfers a radio-frequency signal in Band 1Rx, and the switch SW3 is set to the on state otherwise. That is, each of the switches SW1 to SW3 is switched between the on state and the off state according to a combination of bands during CA operation or a band during non-CA operation, of Band 41, Band 40, and Band 1Rx.

The inductor Ls is a second inductor connected in series between the filter 21 and the node to which the switch SW1 is connected in the path 111.

The thus configured matching circuit 11 is able to match the common terminal 100c with the plurality of filters 21 to 23 even during CA operation for a combination of any bands or even during non-CA operation for any band of Band 41, Band 40, and Band 1Rx when each of the switches SW1 to SW3 is switched between the on state and the off state as appropriate by a control circuit. The mechanism of matching that is performed by the matching circuit 11 will be described later.

The filter 21 is connected to the common terminal 100c of the multiplexer 10 via the matching circuit 11. The filter 21 is an example of a first filter that passes a radio-frequency signal in a first frequency band. One input/output terminal of the filter 21 is connected to the common terminal 100c via the matching circuit 11, and the other input/output terminal of the filter 21 is connected to an individual terminal 101 of the multiplexer 10. The filter 21 passes a radio-frequency signal in Band 41 in the present embodiment. Specifically, the filter 21 is a band pass filter that has Band 41 as a pass band and that has Band 40 and Band 1Rx as stop bands (also referred to as block bands).

The filter 21 is not limited to a band pass filter and may be, for example, a high pass filter.

The filter 22 is connected to the common terminal 100c of the multiplexer 10 via the matching circuit 11. The filter 22 is an example of a second filter that passes a radio-frequency signal in a second frequency band lower in frequency than the first frequency band. One input/output terminal of the filter 22 is connected to the common terminal 100c via the matching circuit 11, and the other input/output terminal of the filter 22 is connected to an individual terminal 102 of the multiplexer 10. The filter 22 passes a radio-frequency signal in Band 40 in the present embodiment. Specifically, the filter 22 is a band pass filter that has Band 40 as a pass band and that has Band 41 and Band 1Rx as stop bands.

The filter 23 is connected to the common terminal 100c of the multiplexer 10 via the matching circuit 11. The filter 23 is an example of a third filter that passes a radio-frequency signal in a third frequency band lower in frequency than the second frequency band. One input/output terminal of the filter 23 is connected to the common terminal 100c via the matching circuit 11, and the other input/output terminal of the filter 23 is connected to an individual terminal 103 of the multiplexer 10. The filter 23 passes a radio-frequency signal in Band 1Rx in the present embodiment. Specifically, the filter 23 is a band pass filter that has Band 1Rx as a pass band and that has Band 40 and Band 41 as stop bands.

The filter 23 is not limited to a band pass filter and may be, for example, a low pass filter.

In the present embodiment, each of the filters 21 to 23 is an acoustic wave filter made up of one or more acoustic wave resonators. In this regard, with the acoustic wave filter, a high-selectivity filter is manufactured in small size and low profile. Therefore, when each of the filters 21 to 23 is an acoustic wave filter, the miniaturized and low-profile multiplexer 10 having a high selectivity is achieved.

As shown in FIG. 1B, the filter 22 includes, for example, a ladder circuit made up of one or more series arm resonators (here, three series arm resonators s21 to s23) that are acoustic wave resonators and one or more parallel arm resonators (three parallel arm resonators p21 to p23) that are acoustic wave resonators. In this regard, in the filter 22, the acoustic wave resonator connected closest to the common terminal 100c is the parallel arm resonator p21. When the switch SW2 is in the off state, the resonator reso1 that is the acoustic wave resonator that makes up the resonant circuit and the series arm resonators s21 to s23 and parallel arm resonators p21 to p23 that are one or more acoustic wave resonators that make up the filter 22 make up a ladder circuit that passes a radio-frequency signal in Band 40. With such a configuration, the number of acoustic wave resonators that make up the filter 22 is reduced, so miniaturization is achieved.

In the filter 22, the acoustic wave resonator connected closest to the common terminal 100c may be a series arm resonator.

As shown in FIG. 1C, the filter 23 includes, for example, a ladder circuit made up of one or more series arm resonators (here, four series arm resonators s31 to s34) that are acoustic wave resonators and one or more parallel arm resonators (here, three parallel arm resonators p31 to p33) that are acoustic wave resonators. In this regard, in the filter 23, the acoustic wave resonator connected closest to the common terminal 100c is, for example, a series arm resonator.

The configuration of the filter 21 is not specifically limited. For example, as in the case of the filter 22 or the filter 23, the filter 21 is made up of a ladder circuit including series arm resonators and parallel arm resonators.

An SAW resonator that uses surface acoustic waves (SAW), a film bulk acoustic resonator (FBAR) or solidity mounted resonator (SMR) that uses bulk acoustic waves (BAW), a resonator that uses boundary acoustic waves, or the like, is used as the acoustic wave resonator. Each acoustic wave resonator is not limited to a single acoustic wave resonator and may be made up of a plurality of split resonators into which one acoustic wave resonator is split.

In the case of SAW resonator, the SAW resonator includes a substrate and an IDT (interdigital transducer) electrode. The substrate is a substrate having piezoelectricity at least at its surface. For example, the substrate may be made up of a multilayer body of a piezoelectric thin film at its surface, a film having an acoustic velocity different from that of the piezoelectric thin film, a support substrate, and the like. The entire substrate may have piezoelectricity. In this case, the substrate is a piezoelectric substrate made up of one piezoelectric layer.

[2. Property of Resonator]

The property of the resonator reso1 of the matching circuit 11 will be described.

Figure 2:
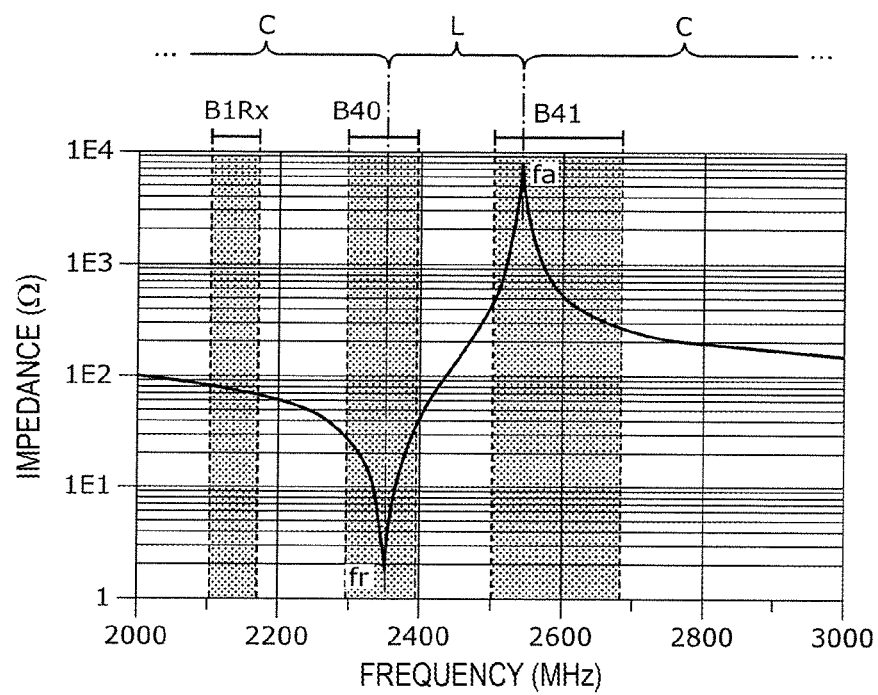
FIG. 2 is a graph that shows the impedance characteristics of a resonator in the first embodiment.

FIG. 2 is a graph that shows the impedance characteristics of the resonator reso1 in the present embodiment.

As shown in the graph, the resonator reso1 has a resonant frequency fr at which the impedance is minimum (ideally, zero) and an anti-resonant frequency fa at which the impedance is maximum (ideally, infinite). The resonator reso1 exhibits a capacitive impedance in a frequency band lower than the resonant frequency fr or in a frequency band higher than the anti-resonant frequency fa, so the resonator reso1 functions as a capacitor. On the other hand, the resonator reso1 exhibits an inductive impedance at frequencies higher than the resonant frequency fr and frequencies lower than the anti-resonant frequency fa, so the resonator reso1 functions as an inductor.

As described above, since the resonant frequency fr of the resonator reso1 is included in Band 40, the resonator reso1 at least functions as an inductor in Band 41 and functions as a capacitor in Band 1Rx. Thus, between Band 41 and Band 1Rx, the direction of the impedance conversion by the resonator reso1 varies.

In the present embodiment, the anti-resonant frequency fa of the resonator reso1 is included in Band 41. Therefore, the resonator reso1 functions as an inductor at frequencies lower than the anti-resonant frequency fa and functions as a capacitor at frequencies higher than the anti-resonant frequency fa in Band 41. Thus, between the higher frequency side and lower frequency side of the band of Band 41, the impedance conversion by the resonator reso1 varies according to whether an inductive characteristic side or a capacitive characteristic side.

[3. Impedance Design for Each Path]

Next, impedance design for the paths 111 to 113 in which the filters 21 to 23 are respectively connected will be described.

Hereinafter, on a Smith chart, the upper right side to the center is defined as the first quadrant, the upper left side to the center is defined as the second quadrant, the lower left side to the center is defined as the third quadrant, and the lower right side to the center is defined as the fourth quadrant. Therefore, the impedance that shows an inductive characteristic is located in the first quadrant or the second quadrant on the Smith chart. On the other hand, the impedance that shows a capacitive characteristic is located in the third quadrant or the fourth quadrant on the Smith chart.

The impedance that shows a capacitive characteristic means that the impedance has a capacitive reactance. On the other hand, the impedance that shows an inductive characteristic means that the impedance has an inductive reactance. In other words, the impedance that shows a capacitive characteristic has a negative complex component (also referred to as imaginary component), and the impedance that shows an inductive characteristic has a positive complex component.

Hereinafter, for a specific band, the fact that an impedance is located in a specific quadrant includes not only the fact that the entire frequency range of the specific band is located in the specific quadrant but also the almost entire (for example, 50% or more; particularly, 80% or more) frequency range of the specific band is located in the specific quadrant. Thus, a part of the frequency range of the specific band may be located in another quadrant.

Figure 3A:
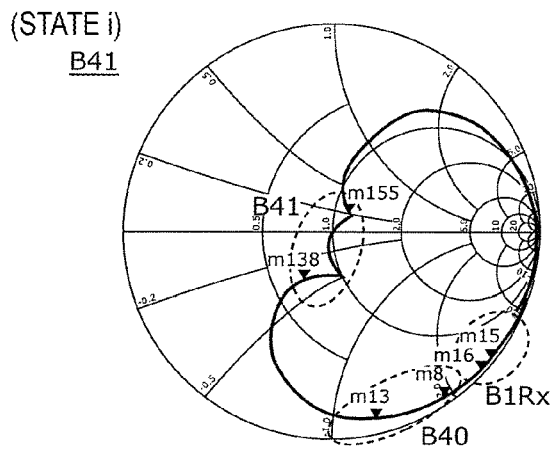
FIG. 3A is a Smith chart that shows the impedance of a path associated with Band 41 and viewed from a common terminal in the first embodiment.

FIG. 3A is a Smith chart that shows the impedance (hereinafter, state i) of the path 111 associated with Band 41 and viewed from the common terminal 100c when the switch SW1 is in the off state in the present embodiment. In other words, the chart shows the impedance of the common terminal 100c when the paths 112, 113 associated with the other bands are not connected to the common terminal 100c. Namely, the impedance shown in the chart is an impedance obtained through the impedance conversion caused by the addition of the inductor Ls and the capacitor C1 from the common terminal 100c-side impedance of the filter 21.

As shown in the chart, when the switch SW1 is in the off state, the impedance (state i) of the path 111 associated with Band 41 when viewed from the common terminal 100c is set so as to be located in the third quadrant on the Smith chart in Band 41. The impedance is set so as to be located in the third quadrant or the fourth quadrant on the Smith chart in Band 40 and Band 1Rx, each of which is lower in frequency than Band 41. In other words, the impedance is set so as to show a capacitive characteristic in Band 40 and Band 1Rx.

In the present embodiment, the impedance is set so as to be located in the fourth quadrant on the Smith chart in Band 40 and Band 1Rx.

Figure 3B:
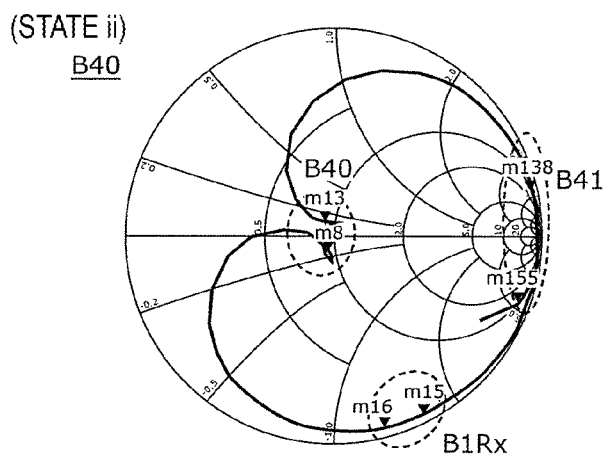
FIG. 3B is a Smith chart that shows the impedance of a path associated with Band 40 and viewed from the common terminal in the first embodiment.

FIG. 3B is a Smith chart that shows the impedance (hereinafter, state ii) of the path 112 associated with Band 40 and viewed from the common terminal 100c when the switch SW2 is in the off state in the present embodiment. In other words, the chart shows the impedance of the common terminal 100c when the paths 111, 113 associated with the other bands are not connected to the common terminal 100c. Namely, the impedance shown in the chart is an impedance obtained through the impedance conversion caused by the addition of the resonator reso1 from the common terminal 100c-side impedance of the filter 22.

As shown in the chart, when the switch SW2 is in the off state, the impedance of the path 112 associated with Band 40 when viewed from the common terminal 100c is set so as to be located near the center on the Smith chart in Band 40. The phrase "near the center on the Smith chart" means, for example, a VSWR (voltage standing wave ratio) falls within the range less than or equal to 1.5. In addition, the impedance is set so as to be at least partially located in the first quadrant or the second quadrant on the Smith chart in Band 41 higher in frequency than Band 40, and is set so as to be located in the third quadrant or the fourth quadrant on the Smith chart in Band 1Rx lower in frequency than Band 40. Namely, the impedance is set so as to show an inductive characteristic in at least part of Band 41 and show a capacitive characteristic in Band 1Rx.

In the present embodiment, the impedance is set so as to show an inductive characteristic in one part of Band 41 and show a capacitive characteristic in the other part of Band 41. Namely, the impedance is set in a range that straddles over the real axis on the Smith chart in Band 41. Specifically, the impedance is located in the first quadrant on the Smith chart in one part of Band 41 and is located in the fourth quadrant on the Smith chart in the other part of Band 41. In addition, the impedance is located in the fourth quadrant on the Smith chart in Band 1Rx.

Figure 3C:
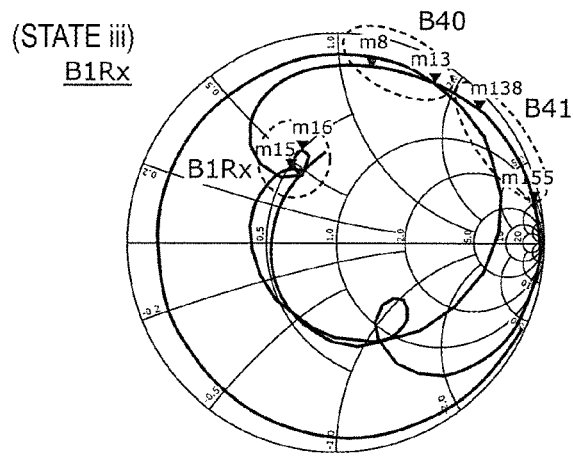
FIG. 3C is a Smith chart that shows the impedance of a path associated with Band 1Rx and viewed from the common terminal in the first embodiment.

FIG. 3C is a Smith chart that shows the impedance (hereinafter, state iii) of the path 113 associated with Band 1Rx and viewed from the common terminal 100c when the switch SW3 is in the off state in the present embodiment. In other words, the chart shows the impedance of the common terminal 100c when the paths 111, 112 associated with the other bands are not connected to the common terminal 100c. Namely, the impedance shown in the chart is an impedance obtained through the impedance conversion caused by the addition of the inductor L1 from the common terminal 100c-side impedance of the filter 23.

As shown in the chart, when the switch SW3 is in the off state, the impedance of the path 113 associated with Band 1Rx when viewed from the common terminal 100c is set so as to be located in the second quadrant on the Smith chart in Band 1Rx. The impedance is set so as to be located in the first quadrant or the second quadrant on the Smith chart in Band 40 and Band 41, each of which is higher in frequency than Band 1Rx. In other words, the impedance shows an inductive characteristic in Band 40 and Band 41.

In the present embodiment, the impedance is set so as to be located in the first quadrant on the Smith chart in Band 40 and Band 41.

The impedance (state i) shown in FIG. 3A, the impedance (state ii) shown in FIG. 3B, and the impedance (state iii) shown in FIG. 3C are set to have a complex conjugate relation in Bands 41, 40, 1Rx. In other words, the states i to iii are set such that the complex components are cancelled by one another in Bands 41, 40, 1Rx. Specifically, in the present embodiment, in each of Bands 41, 40, 1Rx, the combined impedance of the state i and the state ii and the impedance of the state iii are set so as to have a complex conjugate relation.

The phrase "a plurality of impedances has a complex conjugate relation" means that the complex components of a plurality of impedances are cancelled so as to approach zero. In other words, where one of impedances is expressed by $R_1+jX_1$ and the other one of the impedances is expressed by $R_2+jX_2$, the above phrase means that $X_1>0$ and $X_2<0$ are satisfied, and specifically means that $X_1+X_2=0$ is satisfied.

Settings of impedances described above are achieved by adjusting the common terminal 100c-side impedances of the filters 21 to 23 and the element values of the capacitor C1 and inductors L1, Ls that make up the matching circuit 11 as appropriate.

In this regard, in the present embodiment, as described above, the filters 21 to 23 are acoustic wave filters. Therefore, in each of the filters 21 to 23, the common terminal 100c-side impedance can be adjusted by designing the impedance of the acoustic wave resonator connected closest to the common terminal 100c such that the impedance is higher or lower than that of each of the other acoustic wave resonator(s). For example, when the filters 21 to 23 each are made up of SAW resonators, the common terminal 100c-side impedance can be adjusted by adjusting electrode parameters, such as the pitch, overlapped width, number of pairs of electrode fingers, and reflector-to-interdigital transducer electrode gap, of electrode fingers that make up an interdigital transducer electrode.

However, an impedance in the pass band of an acoustic wave filter shows a capacitive impedance under the structural constraints of the acoustic wave filter and is mostly located in the third quadrant or the fourth quadrant on the Smith chart. Thus, through the impedance conversion caused by the addition of only the capacitor C1 to the filter 21 that is an acoustic wave filter, the common terminal 100c-side impedance of the filter 21 can be just changed to an impedance shifted in a counterclockwise direction along a constant resistance circle on the Smith chart. Therefore, in this case, it is difficult that the impedance of the path 111 viewed from the common terminal 100c when the switch SW1 is in the off state is located in the third quadrant on the Smith chart in Band 41. In the present embodiment, the inductor Ls is connected in series in the path 111. Thus, the impedance of the path 111 viewed from the common terminal 100c when the switch SW1 is in the off state is shifted in a clockwise direction along a constant resistance circle on the Smith chart, and the impedance shown in the above state i is achieved. In other words, when the inductor Ls is connected, a low loss is achieved even when the filter 21 is an acoustic wave filter.

The inductor Ls may be provided in the filter 21. In other words, the inductor Ls may be connected in series in a path connecting one of the input/output terminals of the filter 21 and the other one of the input/output terminals of the filter 21. In the thus configured filter 21, in comparison with the present embodiment, the common terminal 100c-side impedance shifts in a clockwise direction along the constant resistance circle on the Smith chart by the addition of the inductor Ls. Thus, with the thus configured filter 21, the above-described setting of the impedance of the path 111 is achieved by adjusting the element value of the inductor Ls as appropriate.

Instead of the inductor Ls, an inductor that connects the path 111 and the ground may be provided. With this configuration, the impedance shifts in a counterclockwise direction along a constant conductance circle on the Smith chart by the addition of the inductor. Therefore, the impedance of the path 111 viewed from the common terminal 100c is located in the third quadrant extremely close to the second quadrant on the Smith chart in Band 41. Thus, the impedances of the paths 111 to 113 are difficult to approach a complex conjugate relation, so the accuracy of matching during CA operation can be deteriorated. Therefore, it is desirable that the inductor Ls to be connected in the path 111 be connected in series in the path 111.

[4. Mechanism of Matching]

With the property of the above-described resonator reso1 and the design of the impedances of the paths 111 to 113, the multiplexer 10 according to the present embodiment is able to perform matching during any operation when each of the switches SW1 to SW3 of the matching circuit 11 is switched between the on state and the off state as appropriate. Hereinafter, the mechanism will be described.

[4-1. During Three-Band CA Operation]

First, the mechanism of matching during three-band CA operation will be described.

Figure 4:
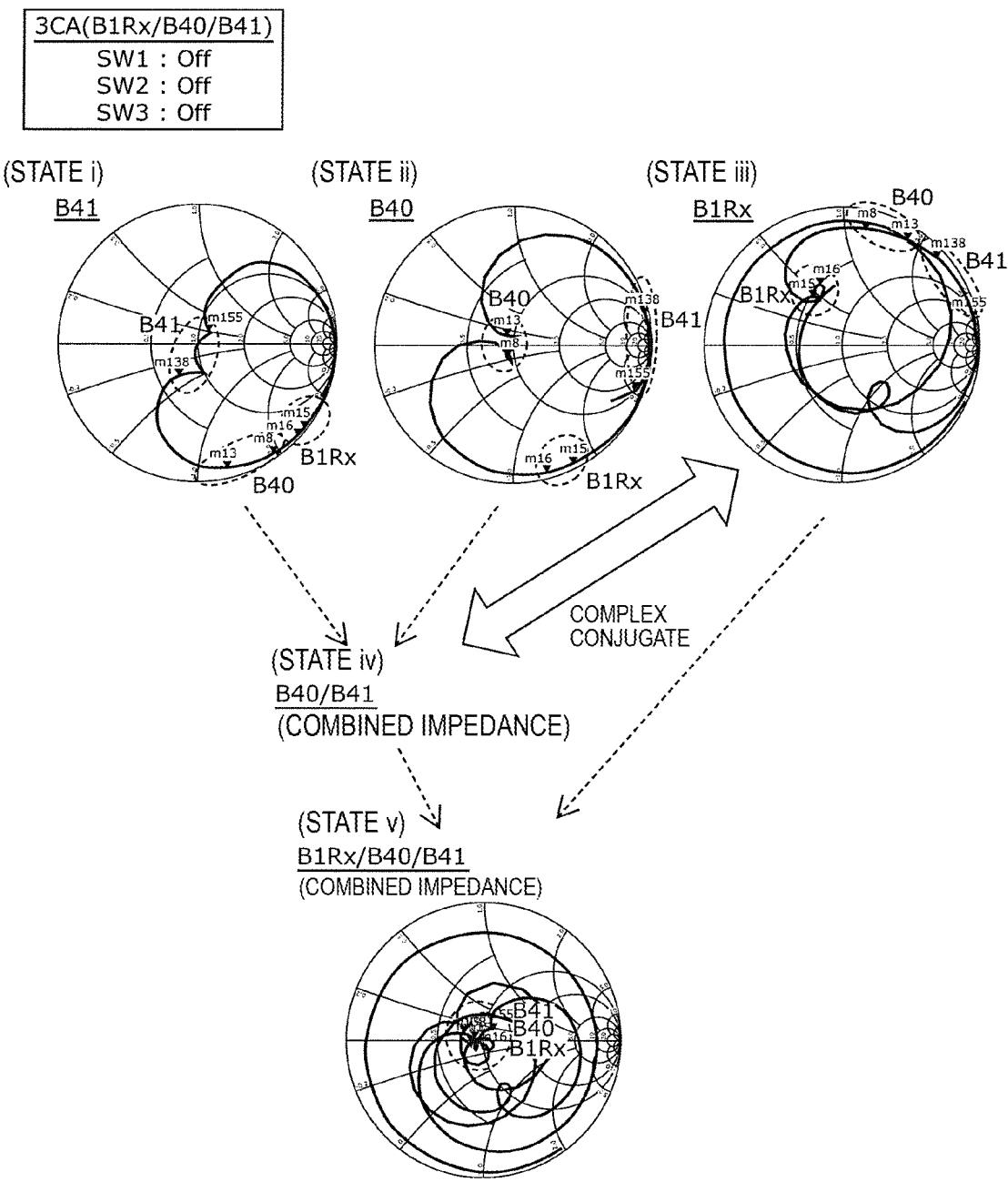
FIG. 4 is a schematic view that illustrates the mechanism of matching during three-band CA operation in the first embodiment.

FIG. 4 is a schematic diagram that illustrates the mechanism of matching during three-band CA operation (3CA (Band 1Rx/Band 40/Band 41)) in the present embodiment.

During three-band CA operation, that is, when the multiplexer 10 simultaneously transfers a radio-frequency signal in Band 41, a radio-frequency signal in Band 40, and a radio-frequency signal in Band 1Rx, each of the switch SW1, the switch SW2, and the switch SW3 is set to the off state.

Thus, the impedance of the common terminal 100c becomes a combined impedance of the states i to iii shown at the top in the chart.

Specifically, in the present embodiment, as described above, the combined impedance of the state i and the state ii (hereinafter, state iv) and the state iii are set so as to have a complex conjugate relation in Bands 41, 40, 1Rx.

Thus, the combined impedance of the state iv and the state iii (hereinafter, state v) gathers near the center on the Smith chart in any of Bands 41, 40, 1Rx.

Therefore, the multiplexer 10 is able to perform matching for all the three bands during three-band CA operation. In other words, the impedance of the common terminal 100c is matched to about 50Ω in any of Bands 41, 40, 1Rx.

[4-2. During Non-CA Operation]

Subsequently, the mechanism of matching during non-CA operation will be described band by band.

<During Non-CA Operation for Band 41>

Figure 5A:
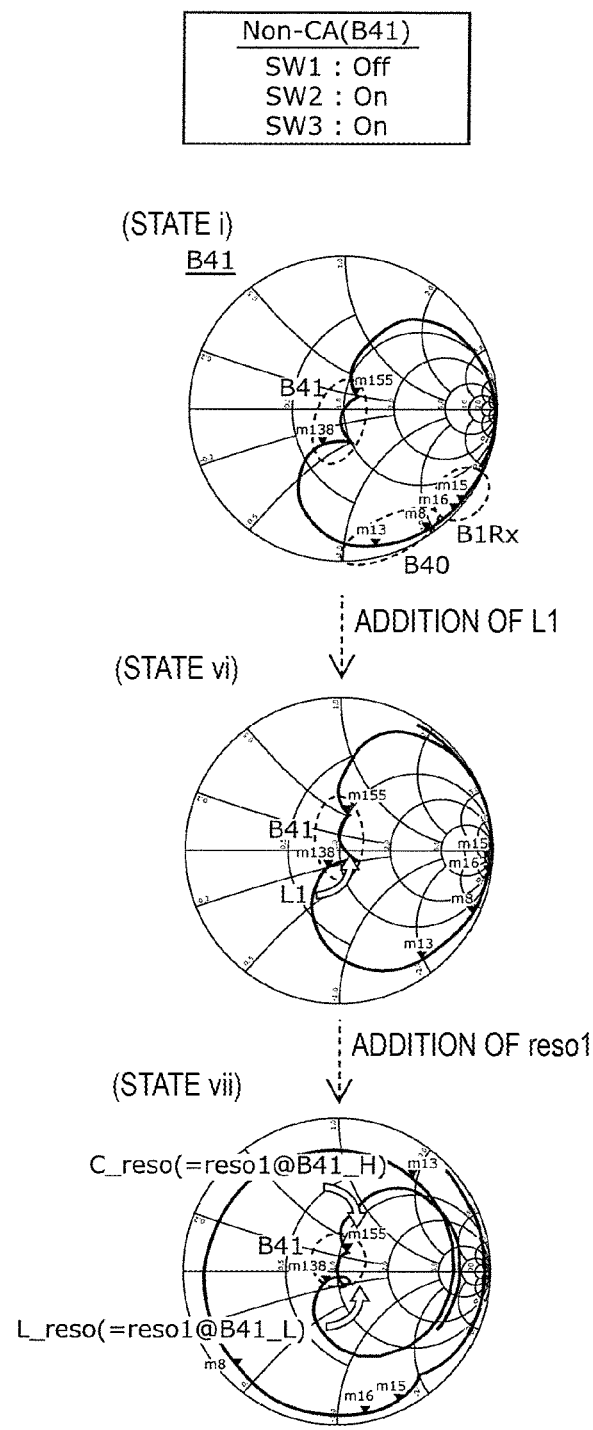
FIG. 5A is a schematic view that illustrates the mechanism of matching during non-CA operation for Band 41 in the first embodiment.

FIG. 5A is a schematic view that illustrates the mechanism of matching during non-CA operation for Band 41 (Non-CA (Band 41)) in the present embodiment.

During non-CA operation for Band 41, that is, when the multiplexer 10 transfers only a radio-frequency signal in Band 41, the switch SW1 is set to the off state, and each of the switch SW2 and the switch SW3 is set to the on state. Thus, at this time, each of the resonator reso1 and the inductor L1 functions as the matching element connected between the common terminal 100c and the ground for the filter 21 of Band 41.

With this configuration, the impedance of the common terminal 100c is an impedance converted by the addition of the inductor L1 and the resonator reso1 to the state i shown at the top of the drawing.

Specifically, the impedance shifts in a counterclockwise direction along a constant conductance circle on the Smith chart by the addition of the inductor L1, so the impedance is converted from the state i to the state vi. In addition, the impedance shifts along a constant conductance circle by the addition of the resonator reso1, so the impedance is converted from the state vi to the state vii, and gathers near the center on the Smith chart in Band 41.

In other words, as described above, the resonator reso1 functions as a capacitor at higher frequencies and functions as an inductor at lower frequencies in Band 41. For this reason, by the addition of the resonator reso1, the impedance shifts in a clockwise direction on the Smith chart at higher frequencies in Band 41 and shifts in a counterclockwise direction on the Smith chart at lower frequencies in Band 41.

Therefore, the multiplexer 10 is able to perform matching for Band 41 during non-CA operation for Band 41. In other words, the impedance of the common terminal 100c is matched to about 50Ω in Band 41.

<During Non-CA Operation for Band 40>

FIG. 5B is a schematic view that illustrates the mechanism of matching during non-CA operation for Band 40 (Non-CA (Band 40)) in the present embodiment.

During non-CA operation for Band 40, that is, when the multiplexer 10 transfers only a radio-frequency signal in Band 40, the switch SW2 is set to the off state, and each of the switch SW1 and the switch SW3 is set to the on state. Thus, at this time, each of the capacitor C1 and the inductor L1 functions as the matching element connected between the common terminal 100c and the ground for the filter 22 of Band 40.

With this configuration, the impedance of the common terminal 100c is an impedance converted by the addition of the capacitor C1 and the inductor L1 to the state ii shown at the top of the drawing.

Specifically, the impedance shifts in a clockwise direction along a constant conductance circle on the Smith chart by the addition of the capacitor C1, so the impedance is converted from the state ii to the state viii. In addition, the impedance shifts in a counterclockwise direction along a constant conductance circle by the addition of the inductor L1, so the impedance is converted from the state viii to the state ix, and gathers near the center on the Smith chart in Band 40.

Therefore, the multiplexer 10 is able to perform matching for Band 40 during non-CA operation for Band 40. In other words, the impedance of the common terminal 100c is matched to about 50Ω in Band 40.

<During Non-CA Operation for Band 1Rx>

Figure 5C:
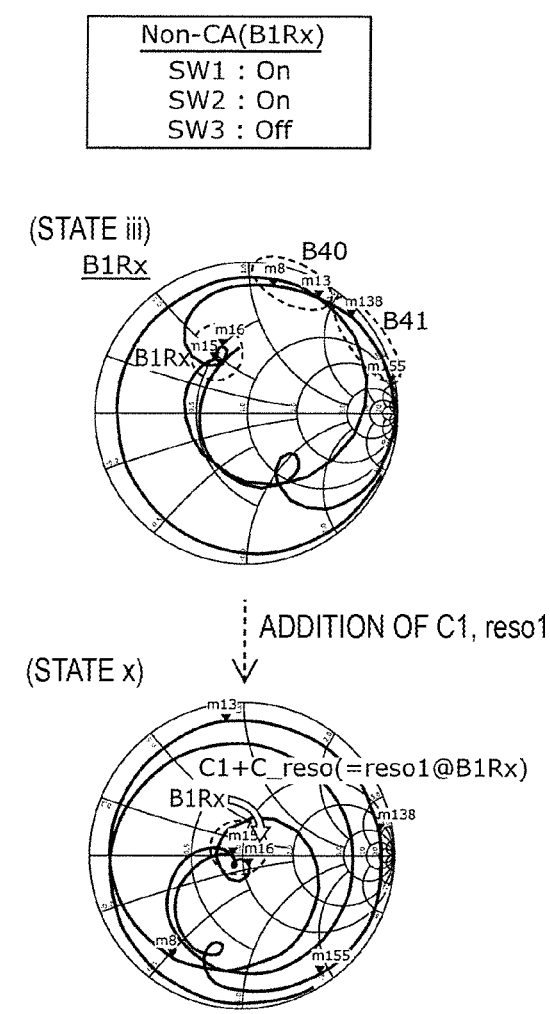
FIG. 5C is a schematic view that illustrates the mechanism of matching during non-CA operation for Band 1Rx in the first embodiment.

FIG. 5C is a schematic view that illustrates the mechanism of matching during non-CA operation for Band 1Rx (Non-CA (Band 1Rx)) in the present embodiment.

During non-CA operation for Band 1Rx, that is, when the multiplexer 10 transfers only a radio-frequency signal in Band 1Rx, the switch SW3 is set to the off state, and each of the switch SW1 and the switch SW2 is set to the on state. Thus, at this time, each of the capacitor C1 and the resonator reso1 functions as the matching element connected between the common terminal 100c and the ground for the filter 23 of Band 1Rx.

With this configuration, the impedance of the common terminal 100c is an impedance converted by the addition of the capacitor C1 and the resonator reso1 to the state iii shown at the top of the drawing.

Specifically, the impedance shifts in a clockwise direction along a constant conductance circle on the Smith chart by the addition of the capacitor C1 and the resonator reso1, so the impedance is converted from the state iii to the state x, and gathers near the center on the Smith chart in Band 1Rx.

In other words, as described above, the reso1 functions as a capacitor in Band 1Rx. For this reason, the impedance shifts in a clockwise direction on the Smith chart by a combined capacitance of the capacitor C1 and the resonator reso1 (that is, a capacitive combined impedance) by the addition of the capacitor C1 and the resonator reso1.

Therefore, the multiplexer 10 is able to perform matching for Band 1Rx during non-CA operation for Band 1Rx. In other words, the impedance of the common terminal 100c is matched to about 50Ω in Band 1Rx.

[4-3. During Two-Band CA Operation]

Subsequently, the mechanism of matching during two-band CA operation will be described. Hereinafter, the mechanism will be described by way of a case during CA operation for Band 1Rx and Band 41 (2CA (Band 1Rx/Band 41)) as an example.

Figure 6:
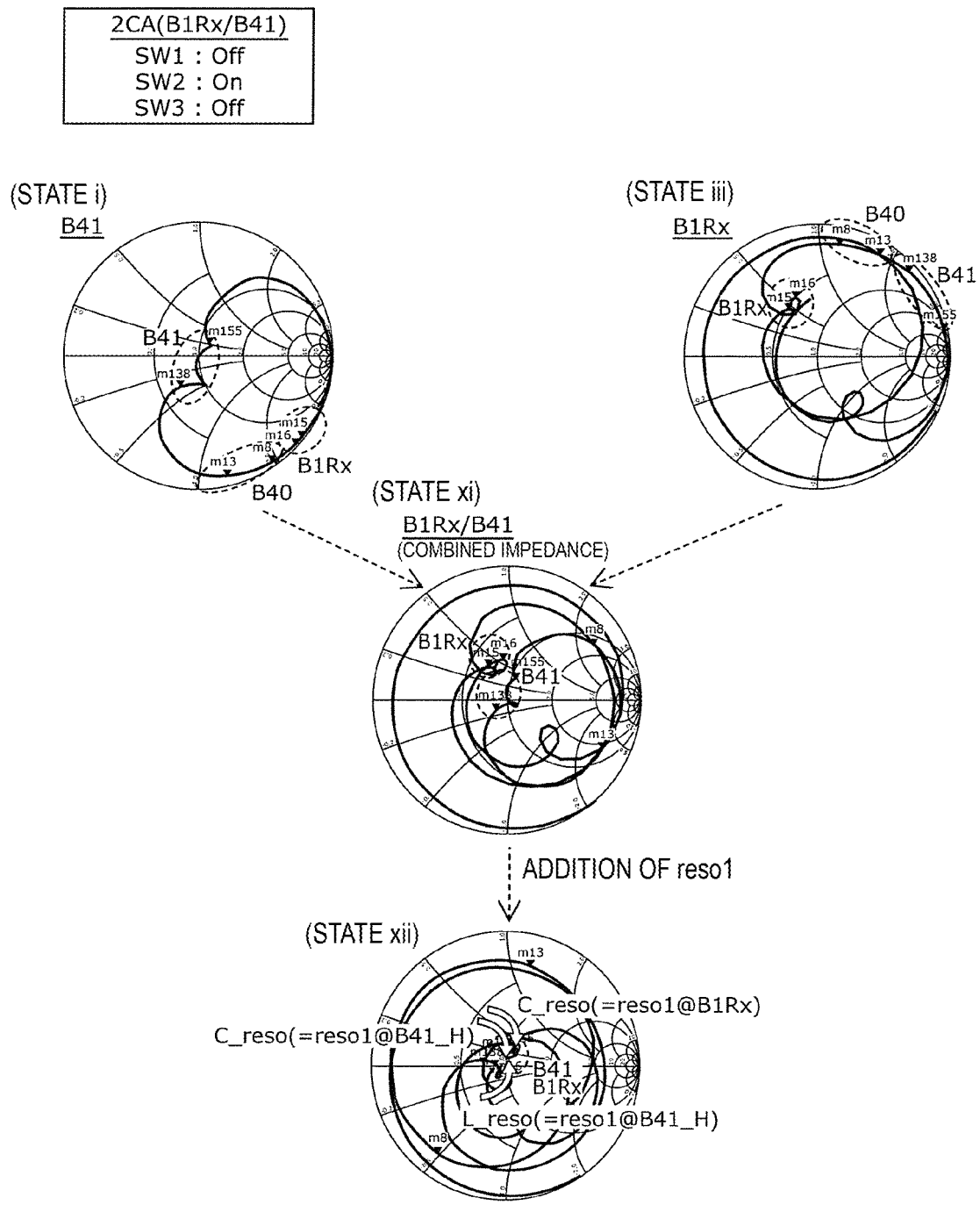
FIG. 6 is a schematic view that illustrates the mechanism of matching during CA operation for Band 1Rx and Band 41 in the first embodiment.

FIG. 6 is a schematic view that illustrates the mechanism of matching during CA operation for Band 1Rx and Band 41 (2CA (Band 1Rx/Band 41)) in the present embodiment.

During CA operation for Band 41 and Band 1Rx, that is, when the multiplexer 10 simultaneously transfers a radio-frequency signal in Band 41 and a radio-frequency signal in Band 1Rx, each of the switch SW1 and the switch SW3 is set to the off state, and the switch SW2 is set to the on state. Thus, at this time, the resonator reso1 functions as the matching element connected between the common terminal 100c and the ground for the filter 21 of Band 41 and the filter 23 of Band 1Rx.

With this configuration, the impedance of the common terminal 100c is an impedance (hereinafter, state xii) converted by the addition of the resonator reso1 from the combined impedance (hereinafter, state xi) of the state i and the state iii shown at the top of the drawing.

Specifically, the combined impedance of the state i and the state iii is not matched to 50Ω as shown in the state xi. The combined impedance shows an inductive characteristic in the band of B1Rx, shows an inductive characteristic in one part of the band of B41, and shows a capacitive characteristic in the other part.

As described above, the resonator reso1 functions as a capacitor in Band 1Rx, functions as a capacitor at higher frequencies in Band 41, and functions as an inductor at lower frequencies in Band 41. For this reason, the impedance of the common terminal 100c shifts in a clockwise direction on the Smith chart in Band 1Rx and at higher frequencies in Band 41 by the addition of the resonator reso1, and shifts in a counterclockwise direction on the Smith chart at lower frequencies in Band 41. Thus, the impedance is converted from the state xi to the state xii by the addition of the resonator reso1, and gathers near the center on the Smith chart in any of Band 1Rx and Band 40.

Therefore, the multiplexer 10 is able to perform matching for any band during CA operation for Band 1Rx and Band 41. In other words, the impedance of the common terminal 100c is matched to about 50Ω in any of Bands 41, 1Rx.

[4-4. Summary]

Figure 7:
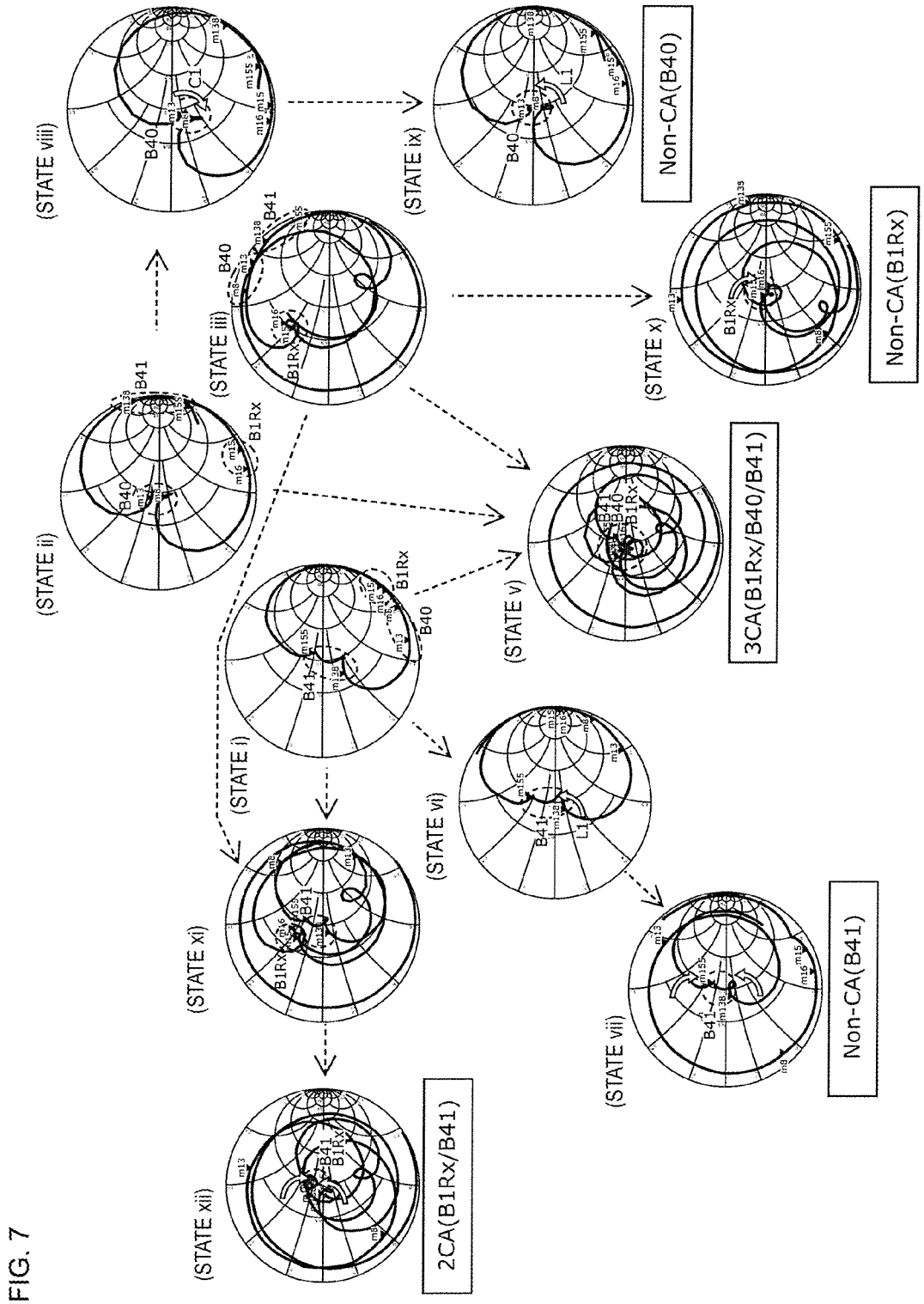
FIG. 7 is a collective view of the mechanism of matching in the first embodiment.

The above-described states i to xii are collectively shown in FIG. 7. FIG. 7 is a collective view of the mechanism of matching in the present embodiment.

As shown in the drawing, the multiplexer 10 according to the present embodiment is able to perform matching for a pass band(s) during any of CA operation and non-CA operation.

A combination of bands to be subjected to CA is not limited to the above-described combination. The mechanism of matching for bands to be subjected to CA in cases other than the described combination can also be described similarly to the above-described mechanism of matching, and matching can be performed for pass bands. In other words, the inductor L1, the resonator reso1, and the capacitor C1 function as the matching elements connected between the common terminal 100c and the ground in response to switching of the switches SW1 to SW3 between the on state and the off state. Thus, the impedance of the common terminal 100c is matched to about 5Ω in pass bands.

Table 1 shows a band(s) to be used, the status (on state or off state) of each of the switches SW1 to SW3 in the paths at that time, and the impedance functions (Z functions) of the capacitor C1, resonator reso1, and inductor L1 at that time. In Table, "Z Function (B41 Path)", "Z Function (B40 Path)", and "Z Function (B1Rx Path)" are respectively the Z function of the capacitor C1, the Z function of the resonator reso1, and the Z function of the inductor L1. In Table, the solid circle represents that an associated switch is in the off state, and the hyphen represents that an associated switch is in the on state.

TABLE 1

| Usage Band | SW1 (B41 Path) | SW2 (B40 Path) | SW3 (B1Rx Path) | Z Function (B41 Path) | Z Function (B40 Path) | Z Function (B1Rx Path) |
|---|---|---|---|---|---|---|
| 3CA (B41/B40/B1Rx) | • | • | • | Capacitive | Capacitive | Inductive |
| Non-CA (B41) | • | — | — | Capacitive | Capacitive (B41 High Side) Capacitive (B41 Low Side) | Inductive |
| Non-CA (B40) | — | • | — | Capacitive | Capacitive | Inductive |
| Non-CA (B1Rx) | — | — | • | Capacitive | Capacitive (B1Rx) | Inductive |
| 2CA (B41/B40) | • | • | — | Capacitive | Capacitive | Inductive |
| 2CA (B41/B1Rx) | • | — | • | Capacitive | Capacitive (B1Rx) Capacitive (B41 High Side) Capacitive (B41 Low Side) | Inductive |
| 2CA (B40/B1Rx) | — | • | • | Capacitive | Capacitive | Inductive |

As shown in "3CA (B41/B40/B1Rx)" in Table, during three-band CA operation, each of the switch SW1, the switch SW2, and the switch SW3 is set to the off state.

With this configuration, when the impedances of the path 111 ("B41 circuit" in Table), path 112 ("B40 circuit" in Table), and path 113 ("B1Rx circuit" in Table) viewed from the common terminal 100c when the switches SW1 to SW3 are set to the on state are designed as appropriate, matching can be performed in any of Band 41, Band 40, and Band 1Rx. Therefore, during three-band CA operation, a low loss in pass bands is achieved.

As shown in "Non-CA (B41)" in Table, during non-CA operation for Band 41, the switch SW1 is set to the off state, and each of the switches SW2, SW3 is set to the on state.

With this configuration, the resonator reso1 (resonant circuit) and the inductor L1 are added as the matching elements connected between the common terminal 100c and the ground for the filter 21. Thus, the impedance of the common terminal 100c, which shows a capacitive characteristic in Band 41 when the switches SW2, SW3 are in the off state, can be matched by shifting the impedance toward an inductive characteristic side by the inductive combined impedance caused by the resonator reso1 and the inductor L1 when the switches SW2, SW3 are set to the on state.

As shown in "Non-CA (B40)" in Table, during non-CA operation for Band 40, the switch SW2 is set to the off state, and each of the switches SW1, SW3 is set to the on state.

With this configuration, the capacitor C1 and the inductor L1 are added as the matching elements for the filter 22. Thus, matching can be performed by not shifting the impedance of the common terminal 100c, matched for Band 40 when the switch SW1 and the switch SW3 are in the off state, with the combined impedance whose inductive characteristic and capacitive characteristic are cancelled by the capacitor C1 and the inductor L1 as a result of setting the switches SW1, SW3 to the on state.

As shown in "Non-CA (B1Rx)" in Table, during non-CA operation for Band 1Rx, the switch SW3 is set to the off state, and each of the switches SW1, SW2 is set to the on state.

With this configuration, the capacitor C1 and the resonator reso1 are added as the matching elements for the filter 23. Thus, matching can be performed by shifting the impedance of the common terminal 100c, which shows an inductive characteristic in Band 1Rx when the switches SW1, SW2 are in the off state, toward a capacitive characteristic side with the capacitive combined impedance caused by the capacitor C1 and the resonator reso1 as a result of setting the switches SW1, SW2 to the on state.

Therefore, during non-CA operation for Band 41, Band 40, or Band 1Rx, a low loss in a pass band is achieved even during non-CA for any frequency band.

As shown in "2CA (B41/B40)" in Table, during CA operation for Band 41 and Band 40, each of the switches SW1, SW2 is set to the off state, and the switch SW3 is set to the on state.

With this configuration, the inductor L1 is added as the matching element for each of the filter 21 and the filter 22. Thus, matching can be performed by shifting the combined impedance of the path 111 ("B41 circuit" in Table) and the path 112 ("B40 circuit" in Table), which shows a capacitive characteristic in Band 41 and Band 40 when the switch SW3 is in the off state, toward an inductive characteristic side with the inductive impedance caused by the inductor L1 as a result of setting the switch SW3 to the on state.

As shown in "2CA (B41/B1Rx)" in Table, during CA operation for Band 41 and Band 1Rx, each of the switches SW1, SW3 is set to the off state, and the switch SW2 is set to the on state.

With this configuration, the resonator reso1 is added as the matching element for each of the filter 21 and the filter 23. Thus, when the switch SW2 is in the off state, the combined impedance of the path 111 ("B41 circuit" in Table) and the path 113 ("B1Rx circuit" in Table), which shows a capacitive characteristic in Band 41 and an inductive characteristic in Band 1Rx, can be shifted as follows. In other words, when the switch SW2 is set to the on state, matching can be performed by shifting the above-described combined impedance toward an inductive characteristic side with the inductive impedance caused by the resonator reso1 in Band 41 and by shifting the above-described combined impedance toward a capacitive characteristic side with the capacitive impedance caused by the resonator reso1 in Band 1Rx.

As shown in "2CA (B40/B1Rx)" in Table, during CA operation for Band 40 and Band 1Rx, each of the switches SW2, SW3 is set to the off state, and the switch SW1 is set to the on state.

With this configuration, the capacitor C1 is added as the matching element for each of the filter 22 and the filter 23. Thus, matching can be performed by shifting the combined impedance of the path 112 ("B40 circuit" in Table) and the path 113 ("B1Rx circuit" in Table), which shows an inductive characteristic in Band 40 and Band 1Rx when the switch SW1 is in the off state, toward a capacitive characteristic side with the capacitive impedance caused by the capacitor C1 as a result of setting the switch SW1 to the on state.

Therefore, during CA operation for any two frequency bands (during two-band CA operation) of Band 41, Band 40, and Band 1Rx, a low loss in a pass band is achieved regardless of a combination of frequency bands.

[5. Characteristics]

According to the above-described mechanism of matching, the multiplexer 10 is able to perform matching during CA operation for any combination of bands and during non-CA operation for any band, so a loss in a pass band(s) is reduced.

Hereinafter, the characteristics of the multiplexer 10 according to the present embodiment will be described.

Figure 8A:
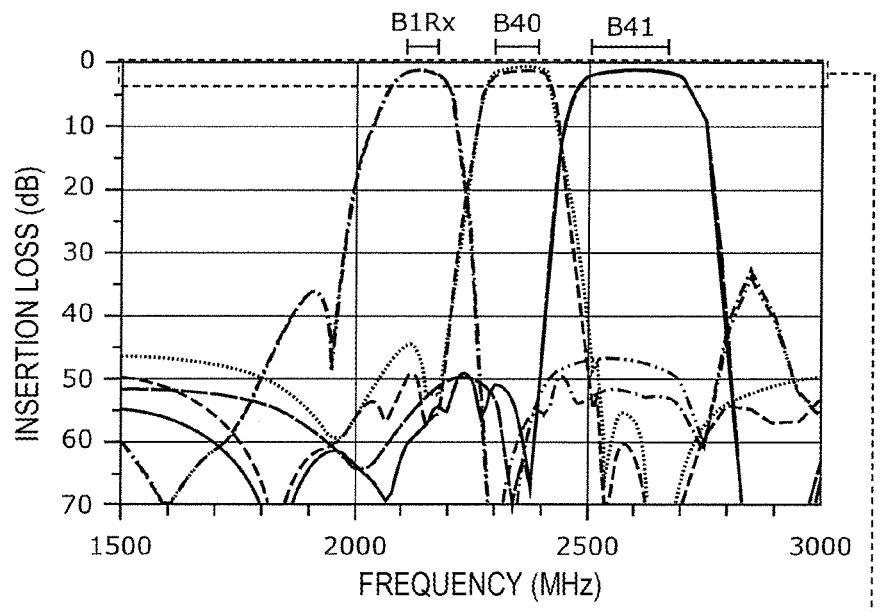
FIGS. 8A and 8B show graphs that show bandpass characteristics during three-band CA operation and bandpass characteristics during non-CA operation of the multiplexer according to the first embodiment.
Figure 8B:
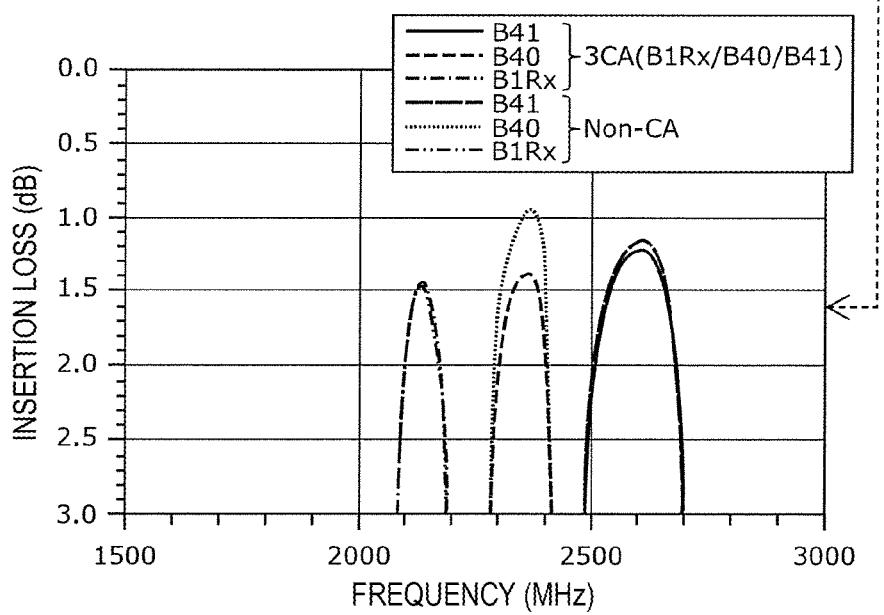

FIGS. 8A and 8B show graphs that show bandpass characteristics during three-band CA operation and bandpass characteristics during non-CA operation of the multiplexer 10 according to the present embodiment. Specifically, the graph of FIG. 8A shows all of these bandpass characteristics, and the graph of FIG. 8B shows a main part of the graph of FIG. 8A in magnified view.

FIGS. 9A, 9B, 9C, 9D, 9E and 9F show graphs that individually show bandpass characteristics during two-band CA operation and bandpass characteristics during non-CA operation of the multiplexer 10 according to the present embodiment. Specifically, the graph of FIG. 9A shows the bandpass characteristics during CA operation for Band 40 and Band 41 (2CA (Band 40/Band 41)). The graph of FIG. 9B shows the bandpass characteristics during CA operation for Band 1Rx and Band 41 (2CA (Band 1Rx/Band 41)). The graph of FIG. 9C shows the bandpass characteristics during CA operation for Band 1Rx and Band 40 (2CA (Band 1Rx/Band 40)). The graph of FIG. 9D shows the bandpass characteristics during non-CA operation for Band 41 (Non-CA (Band 41)). The graph of FIG. 9E shows the bandpass characteristics during non-CA operation for Band 40 (Non-CA (Band 40)). The graph of FIG. 9F shows the bandpass characteristics during non-CA operation for Band 1Rx (Non-CA (Band 1Rx)).

As is apparent from FIGS. 8A and 8B, and FIGS. 9A, 9B, 9C, 9D, 9E and 9F, the multiplexer 10 reduces a loss in a pass band(s) even during CA operation for any combination of bands or even during non-CA operation for any band.

This results from not only the fact that a loss due to mismatching (return loss) is reduced by the above-described mechanism of matching but also the fact that a loss in the multiplexer 10 due to a circuit element(s) having a low quality factor is reduced. This will be described by way of a comparative example.

Figure 10:
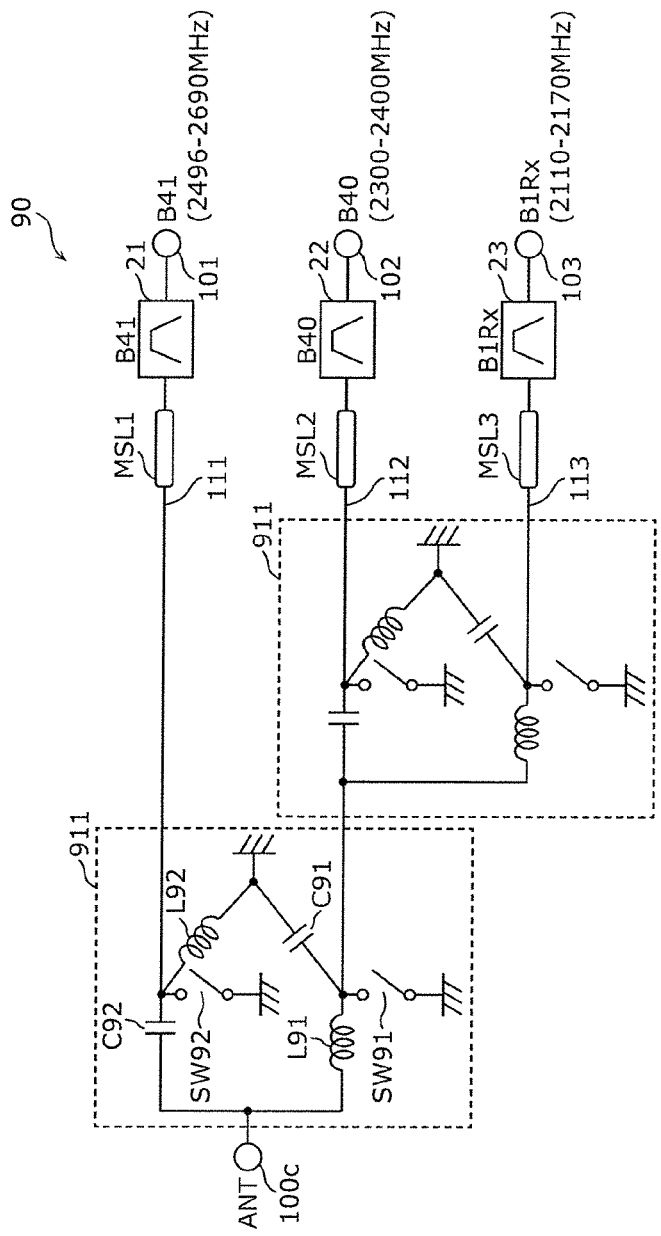
FIG. 10 is a diagram that shows the configuration of a multiplexer according to a comparative example of the first embodiment.

FIG. 10 is a diagram that shows the configuration of a multiplexer 90 according to the comparative example of the present embodiment.

The multiplexer 90 shown in the diagram, as compared to the multiplexer 10 according to the present embodiment, includes two matching circuits 911 instead of the matching circuit 11 and further includes transmission lines MSL1 to MSL3.

Each of the matching circuits 911 corresponds to the coupling circuit 100 described in Patent Document 1, and includes a first LC circuit associated with a path for one of bands and a second LC circuit associated with a path for the other one of the bands. The first LC circuit includes an inductor L91 connected in series in the path and a capacitor C91 that connects the path and a ground. The second LC circuit includes a capacitor C92 connected in series in the path and an inductor L92 that connects the path and the ground. A grounding switch SW91 is connected between the ground and a connection node between the inductor L91 and the capacitor C91. A grounding switch SW92 is connected between the ground and a connection node between the capacitor C92 and the inductor L92.

In the multiplexer 90, one of the thus configured matching circuits 911 is connected between the path 111 associated with the filter 21 of Band 41 and the path 112 associated with the filter 22 of Band 40, and the other one is connected between the path 112 associated with the filter 22 of Band 40 and the path 113 associated with the filter 23 of Band 1Rx.

The transmission lines MSL1, MSL2, MSL3 are respectively connected in association with the paths 111, 112, 113.

Even with the thus configured multiplexer 90, when the following impedance design is applied, the multiplexer 90 is able to perform matching in a pass band(s) even during CA operation for any combination of bands or even curing non-CA operation for any band.

In other words, the impedance of the path 111 viewed from the common terminal 100c is designed so as to be matched in Band 41 and be short or infinite in Band 40 and Band 1Rx. In addition, the impedance of the path 112 viewed from the common terminal 100c is designed so as to be matched in Band 40 and be short or infinite in Band 41 and Band 1Rx. Furthermore, the impedance of the path 113 viewed from the common terminal 100c is designed so as to be matched in Band 1Rx and be short or infinite in Band 40 and Band 41.

FIG. 11 shows Smith charts that show impedances at the common terminal 100c of the multiplexer 90 according to the comparative example. Specifically, the charts show, from the left, the impedance during three-band CA operation, the impedance during non-CA operation for Band 41, the impedance during non-CA operation for Band 40, and the impedance during non-CA operation for Band 1Rx.

As shown in the charts, even with the configuration of the comparative example, matching can be performed in a pass band(s) even during three-band CA operation or even during non-CA operation for any band by switching the grounding switches SW91, SW92 of each of the two matching circuits 911 between an on state and an off state as appropriate. Although the impedance during two-band CA operation is not shown in the chart, matching can also be performed in pass bands similarly.

Figure 12A:
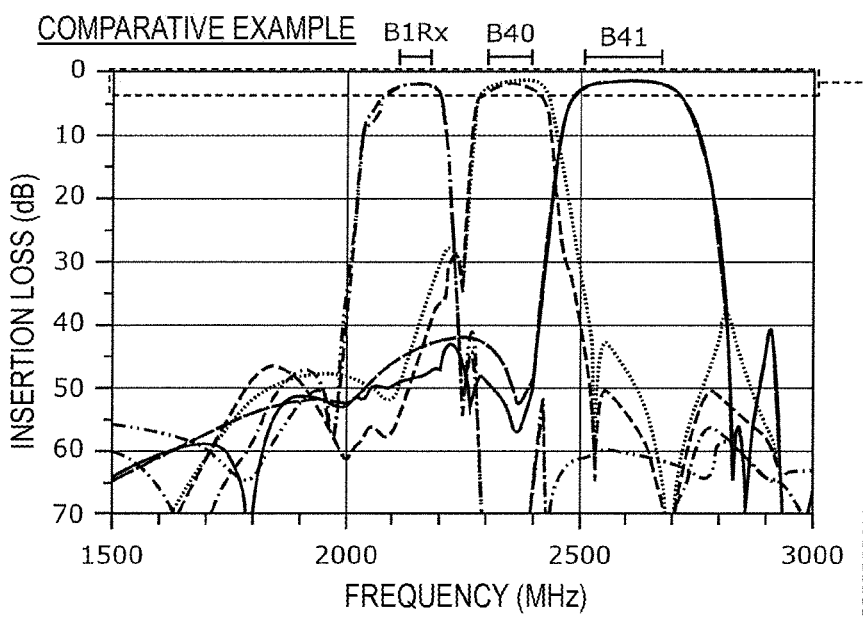
FIGS. 12A and 12B show graphs that show bandpass characteristics during three-band CA operation and bandpass characteristics during non-CA operation of the multiplexer according to the comparative example of the first embodiment.
Figure 12B:
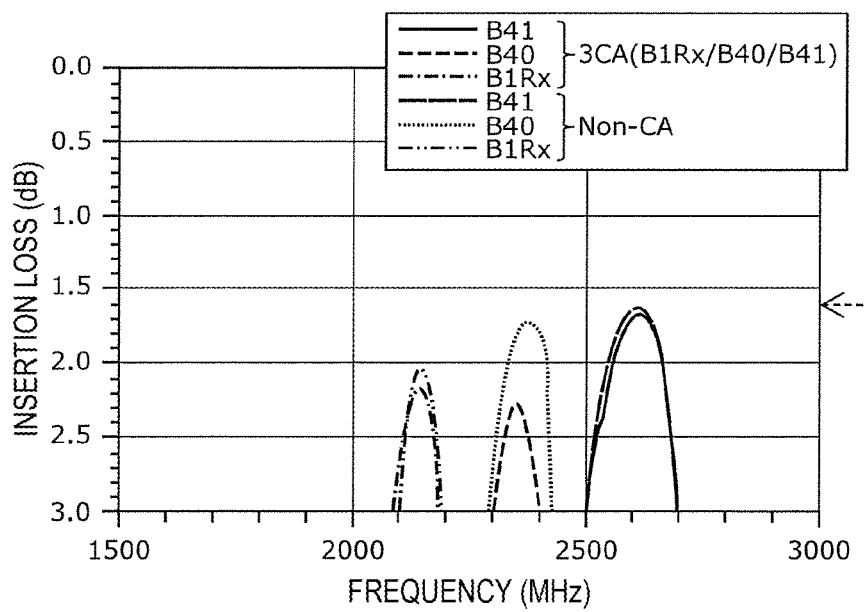

FIGS. 12A and 12B show graphs that show bandpass characteristics during three-band CA operation and bandpass characteristics during non-CA operation of the multiplexer 90 according to the comparative example. Specifically, the graph of FIG. 12A shows all of these bandpass characteristics, and the graph of FIG. 12B shows a main part of the graph of FIG. 12A in magnified view.

As is apparent from the graphs, even with the multiplexer 90 according to the comparative example, a loss in a pass band(s) is relatively reduced when a loss due to mismatching (return loss) is reduced.

Subsequently, the graph of FIG. 8B and the graph of FIG. 12B are compared. FIGS. 13A and 13B show graphs of bandpass characteristics during three-band CA operation and bandpass characteristics during non-CA operation for comparison between the embodiment and the comparative example. Specifically, the graph of FIG. 13A shows the characteristics of the multiplexer 10 according to the embodiment, shown in FIG. 8B, and the graph of FIG. 13B shows the characteristics of the multiplexer 90 according to the comparative example, shown in FIG. 12B.

As is apparent from the comparison between the graph of FIG. 13A and the graph of FIG. 13B, a loss in a pass band(s) in the multiplexer 10 according to the embodiment is reduced as compared to the multiplexer 90 according to the comparative example even during any of three-band CA operation and non-CA operation.

In other words, since an inductor that is used in a radio-frequency circuit often has a low quality factor, a loss in the multiplexer 90 increases because of the inductors having a low quality factor with the configuration of the comparative example in which an LC circuit is provided in each path. In addition, with the configuration of the comparative example, the matching circuit 911 having two LC circuits needs to be provided for every two paths, four inductors are provided in the multiplexer 90 as a whole, so the influence of loss in the multiplexer 90 increases. Furthermore, with the configuration of the comparative example, the two grounding switches SW91, SW92 need to be provided for every two paths, so four switches are provided in the multiplexer 90 as a whole, and there is an inconvenience that an increase in the number of the terminals of the switches interferes with miniaturization.

These inconveniences become more remarkable as the number of bands that the multiplexer 90 supports increases.

In contrast to this, in the present embodiment, since only one inductor needs to be provided in the multiplexer 10 as a whole, the number of inductors that are circuit elements having a low quality factor is reduced as compared to the comparative example, so a loss due to an inductor(s) is reduced. In other words, according to the present embodiment, not only a loss due to mismatching can be reduced but also a loss due to an inductor(s) having a low quality factor is reduced, so a low loss in a pass band(s) is achieved as compared to the comparative example.

When a loss during two-band CA operation is compared between the embodiment and the comparative example as well, the same applies because of the similar reasons.

[6. Advantageous Effects, and Others]

As described above, with the multiplexer 10 according to the present embodiment, the switch SW1 is connected between the ground and the node in the path 111 between the capacitor C1 and the filter 21. The switch SW2 is connected between the ground and the node in the path 112 between the resonant circuit (the resonator reso1 in the present embodiment) and the filter 22. The switch SW3 is connected between the ground and the node in the path 113 between the inductor L1 and the filter 23. Therefore, each of the capacitor C1, the resonant circuit, and the inductor L1, when an associated one of the switch SW1, the switch SW2, and the switch SW3 is set to the on state, functions as the matching element connected between the common terminal 100c and the ground. Thus, in accordance with switching of each of the switch SW1, the switch SW2, and the switch SW3 between the on state and the off state, the combined impedance of the matching element is changed.

Ordinarily, a resonant circuit having a resonant frequency at which the impedance is minimum exhibits an inductive impedance at frequencies higher than the resonant frequency, so the resonant circuit functions as an inductor. On the other hand, the resonant circuit exhibits a capacitive impedance at frequencies lower than the resonant frequency, so the resonant circuit functions as a capacitor. For this reason, the resonant circuit of the matching circuit functions as an inductor in Band 41 and functions as a capacitor in Band 1Rx. Thus, when the switch SW2 is in the on state, the combined impedance can be varied between Band 41 and Band 1Rx.

With this configuration, when the element values of the capacitor C1 and inductor L1 are set as appropriate, even when at least one of the switches SW1 to SW3 is in the off state, matching can be performed for a pass band(s) that is/are the frequency band(s) that pass(es) the path(s) to which the switch(es) set to the off state is/are connected, of Band 41, Band 40, and Band 1Rx.

Therefore, according to this embodiment, while the number of inductors is reduced, even in any one of the case where two or more frequency bands are simultaneously transferred (during CA operation) and the case where only one frequency band is transferred (during non-CA operation), matching can be performed for a pass band(s). Thus, a loss due to the connection of an inductor having a low quality factor is reduced, and a loss due to mismatching (return loss) is reduced, with the result that a low-loss multiplexer that supports CA is achieved.

Specifically, according to the present embodiment, the switch SW1 is set to the off state when the multiplexer 10 transfers a radio-frequency signal in Band 41, and the switch SW1 is set to the on state otherwise, the switch SW2 is set to the off state when the multiplexer 10 transfers a radio-frequency signal in Band 40, and the switch SW2 is set to the on state otherwise, and the switch SW3 is set to the off state when the multiplexer 10 transfers a radio-frequency signal in Band 1Rx, and the switch SW3 is set to the on state otherwise.

In this way, each of the switch SW1, the switch SW2, and the switch SW3 is switched between the on state and the off state in accordance with a frequency band(s) of a radio-frequency signal(s) that the multiplexer 10 transfers. Therefore, when the common terminal 100c-side impedance of each of the filter 21, the filter 22, and the filter 23 and the element values of the capacitor C1 and inductor L1 are adjusted as appropriate, matching can be performed even during non-CA operation for any frequency band or even during CA operation for any combination of frequency bands, so a low loss in a pass band(s) is possible.

Specifically, when the switch SW1 is in the off state, a first impedance of the path 111 viewed from the common terminal 100c is located in the third quadrant that is the left lower side to the center on the Smith chart in Band 41. When the switch SW2 is in the off state, a second impedance of the path 112 viewed from the common terminal 100c is located near the center on the Smith chart in Band 40. When the switch SW3 is in the off state, a third impedance of the path 113 viewed from the common terminal 100c is located in the second quadrant that is the left upper side to the center on the Smith chart in Band 1Rx.

In this regard, when at least one of the switch SW2 and the switch SW3 is in the on state, at least one of the resonant circuit and the inductor L1 is added as the matching element for the filter 21, with the result that the impedance of the common terminal 100c shifts in a counterclockwise direction along a constant conductance circle on the Smith chart. Therefore, the first impedance is located in the third quadrant on the Smith chart, so the impedance of the common terminal 100c when the switch SW1 is in the off state and at least one of the switch SW2 and the switch SW3 is in the on state is more easily brought close to the center on the Smith chart in Band 41.

When at least one of the switch SW1 and the switch SW3 is in the on state, at least one of the capacitor C1 and the inductor L1 is added as the matching element for the filter 22, with the result that the impedance of the common terminal 100c can shift in both directions on a constant conductance circle on the Smith chart. Therefore, the second impedance is located near the center on the Smith chart, so the impedance of the common terminal 100c when the switch SW2 is in the off state and at least one of the switch SW1 and the switch SW3 is in the on state is more easily brought close to the center on the Smith chart in Band 40.

When at least one of the switch SW1 and the switch SW2 is in the on state, at least one of the capacitor C1 and the resonant circuit is added as the matching element for the filter 23, with the result that the impedance of the common terminal 100c shifts in a clockwise direction on a constant conductance circle on the Smith chart. Therefore, the third impedance is located in the second quadrant on the Smith chart, so the impedance of the common terminal 100c when the switch SW3 is in the off state and at least one of the switch SW1 and the switch SW2 is in the on state is more easily brought close to the center on the Smith chart in Band 1Rx.

Therefore, when at least one of the switch SW1, the switch SW2, and the switch SW3 is in the off state and the other switch(es) is/are in the on state, matching can be more easily performed for the path(s) to which the switch(es) set to the off state is/are connected. Thus, in this case, a low loss is further reliably achieved for a radio-frequency signal(s) in a pass band(s), which is/are transferred through the path(s).

When the switch SW1 is in the off state, the first impedance shows a capacitive characteristic in Band 40 and Band 1Rx. When the switch SW2 is in the off state, the second impedance shows an inductive characteristic in at least part of Band 41 and shows a capacitive characteristic in Band 1Rx. When the switch SW3 is in the off state, the third impedance shows an inductive characteristic in Band 41 and Band 40.

With this configuration, when any of the switch SW1, the switch SW2, and the switch SW3 is in the off state, the first impedance, the second impedance, and the third impedance can be brought close to a complex conjugate relation in any of Band 41, Band 40, and Band1Rx. Thus, in any of the frequency bands, the combined impedance of the path 111, the path 112, and the path 113 can be brought close to the center on the Smith chart. Therefore, when any of the switch SW1 the switch SW2, and the switch SW3 is in the off state, a low loss is achieved for any of Band 41, Band 40, and Band 1Rx.

In the present embodiment, the resonant circuit connected in the path 112 is an acoustic wave resonator (that is, the resonator reso1) connected in series in the path 112.

In this regard, the acoustic wave resonator has a resonant frequency at which the impedance is minimum and an anti-resonant frequency at which the impedance is maximum. The anti-resonant frequency is higher in frequency than the resonant frequency. For this reason, with the acoustic wave resonator used as the resonant circuit, when the switch SW2 is in the off state, the impedance of the path 112 can be increased in Band 41. Thus, when the switch SW2 is in the off state, an attenuation in Band 41 is improved (that is, an attenuation is increased) for a radio-frequency signal that passes through the filter 22, so branching characteristics are improved. This is particularly remarkable when the anti-resonant frequency of the acoustic wave resonator is located near Band 41. In addition, this configuration is particularly useful when an inter-band gap that is a frequency interval between Band 41 and Band 40 is narrow.

In the present embodiment, of the one or more acoustic wave resonators that make up the filter 22, the acoustic wave resonator connected closest to the common terminal 100c is a parallel arm resonator, and, when the switch SW2 is in the off state, the acoustic wave resonator that is a component of the resonant circuit and the one or more acoustic wave resonators that make up the filter 22 make up a ladder circuit that passes a radio-frequency signal in Band 40.

With this configuration, the number of acoustic wave resonators that make up the filter 22 can be reduced, so miniaturization is achieved.

The multiplexer 10 according to the present embodiment is applicable to a radio-frequency front-end circuit or a communication device including the radio-frequency front-end circuit.

Figure 14:
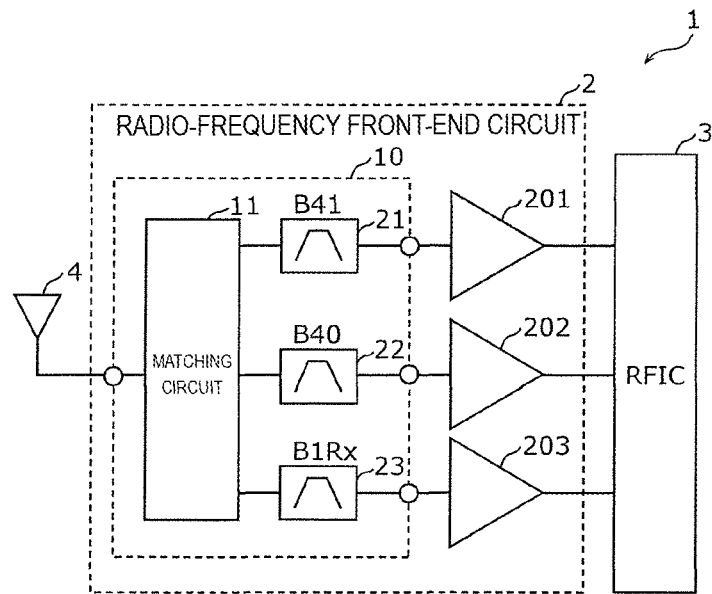
FIG. 14 is a block diagram of a communication device including the multiplexer according to the first embodiment.

FIG. 14 is a block diagram of a communication device 1 including the multiplexer 10 according to the present embodiment.

The communication device 1 shown in the diagram supports Band 41, Band 40, and Band 1Rx, and includes a radio-frequency front-end circuit 2, an RFIC 3, and an antenna 4. The communication device 1 does not need to include the antenna 4.

The radio-frequency front-end circuit 2 is provided at the front end of the communication device 1, and transfers a radio-frequency signal between the antenna 4 and the RFIC 3. Specifically, the radio-frequency front-end circuit 2 includes the above-described multiplexer 10, and amplifier circuits 201 to 203 connected to the multiplexer 10.

In the present embodiment, the amplifier circuits 201, 202, 203 are low-noise amplifiers that respectively support Band 41, Band 40, and Band 1Rx. The amplifier circuits 201, 202, 203 amplify a radio-frequency signal outputted from the multiplexer 10 and output the radio frequency signal to the RFIC 3.

The RFIC 3 is an RF signal processing circuit that processes at least one of a radio frequency signal that is outputted to the radio-frequency front-end circuit 2 and a radio-frequency signal inputted from the radio-frequency front-end circuit 2. In the present embodiment, the RFIC 3 processes a radio-frequency signal inputted from the radio-frequency front-end circuit 2.

The RFIC 3 switches each of the switches SW1 to SW3 between the on state and the off state. For example, the RFIC 3 individually switches each of the switches SW1 to SW3 between the on state and the off state according to a combination of bands during CA operation or a band during non-CA operation. Switching of each of the switches SW1 to SW3 between the on state and the off state may be performed by not only the RFIC 3 but also, for example, a BBIC (baseband integrated circuit), a control IC provided in the radio-frequency front-end circuit 2, or the like.

When the thus configured communication device 1 and radio-frequency front-end circuit 2 include the above-described multiplexer 10, a low loss is achieved. In other words, a low loss is achieved for the communication device 1 and radio-frequency front-end circuit 2 that support CA.

Second Embodiment

In the first embodiment, the multiplexer 10 that supports three bands is described as a multiplexer that supports CA. However, a multiplexer that supports CA may support further more bands. In a second embodiment, a multiplexer that supports four bands will be described as a multiplexer that supports CA.

Figure 15:
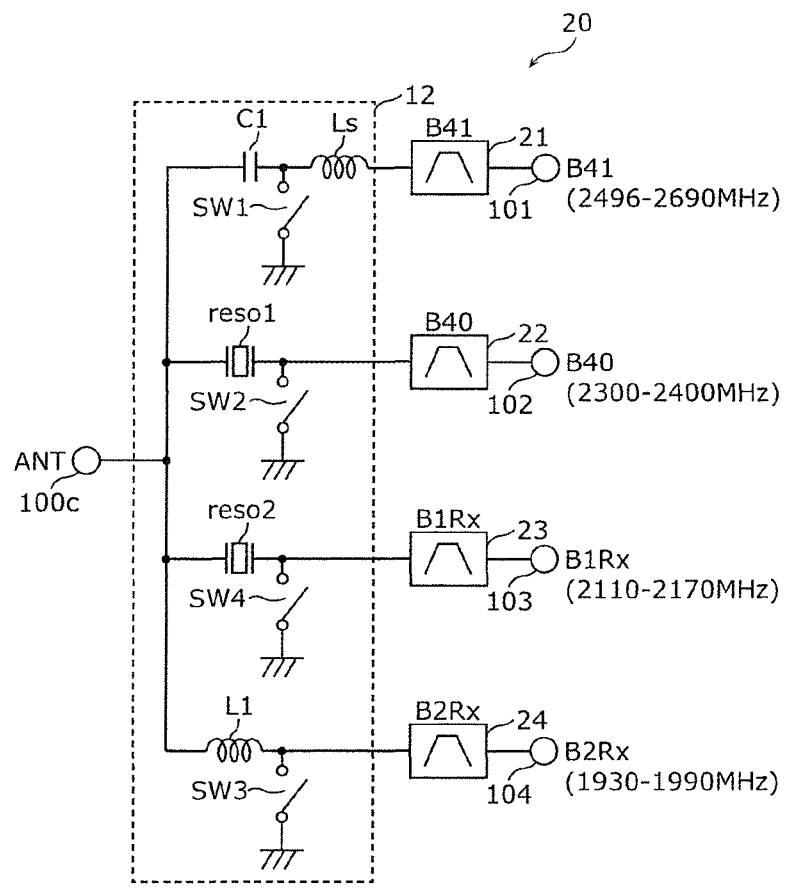
FIG. 15 is a diagram that shows the configuration of a multiplexer according to a second embodiment.

FIG. 15 is a diagram that shows the configuration of the multiplexer 20 according to the second embodiment.

The multiplexer 20 is a receiving quadplexer that further supports a receiving band (1930 MHz to 1990 MHz: "B2Rx" in the diagram, hereinafter, referred to as Band 2Rx) of Band 2, as compared to the multiplexer 10 according to the above-described embodiment. Specifically, the multiplexer 20 includes a matching circuit 12 instead of the matching circuit 11 and further includes a filter 24 as compared to the multiplexer 10.

As compared to the matching circuit 11 in the first embodiment, the matching circuit 12 further includes a resonator reso2 and a switch SW4. The resonator reso2 is connected in series in the path 112 that connects the common terminal 100c and the filter 23. The resonator reso2 is an example of a resonant circuit having a resonant frequency at which an impedance is minimum in Band 1Rx. The resonator reso2 has an anti-resonant frequency in Band 40. The switch SW4 is a second switch connected between the ground and a node in the path between the resonator reso2 and the filter 23.

The filter 24 is connected to the common terminal 100c of the multiplexer 20 via the matching circuit 12. The filter 24 is an example of a third filter that passes a radio-frequency signal in a third frequency band in the present embodiment. One input/output terminal of the filter 24 is connected to the common terminal 100c via the matching circuit 12, and the other input/output terminal of the filter 24 is connected to an individual terminal 104 of the multiplexer 20. The filter 24 passes a radio-frequency signal in Band 41 in the present embodiment.

In the present embodiment, each of the filter 22 and the filter 23 corresponds to a second filter.

Even with the thus configured multiplexer 20 that supports four bands, as in the case of the multiplexer 10 that supports three bands, described in the first embodiment, matching can be performed in a pass band(s) even during any of CA operation and non-CA operation.

Table 2 shows a band(s) to be used, the status (on state or off state) of each of the switches SW1 to SW4 in the paths at that time, and the impedance functions (Z functions) of the capacitor C1, resonator reso1, resonator reso2, and inductor L1 at that time. In Table, "Z Function (B41 Path)", "Z Function (B40 Path)", "Z Function (B1Rx Path)", and "Z function (B2Rx Path)" are respectively the Z function of the capacitor C1, the Z function of the resonator reso1, the Z function of the resonator reso2, and the Z function of the inductor L1. In Table, the solid circle represents that an associated switch is in the off state, and the hyphen represents that an associated switch is in the on state.

TABLE 2

| Usage Band | SW1 (B41 Path) | SW2 (B40 Path) | SW4 (B1Rx Path) | SW3 (B2Rx Path) | Z Function (B41 Path) | Z Function (B40 Path) | Z Function (B1Rx Path) | Z Function (B2Rx Path) |
|---|---|---|---|---|---|---|---|---|
| 4CA (B41/B40/B1Rx/B2Rx) | • | • | • | • | Capacitive | Capacitive | Capacitive | Inductive |
| Non-CA (B41) | • | — | — | — | Capacitive | Capacitive (B41 High Side) Capacitive (B41 Low Side) | Capacitive | Inductive |
| Non-CA (B40) | — | • | — | — | Capacitive | Capacitive | Capacitive (B40 High Side) Capacitive (B40 Low Side) | Inductive |
| Non-CA (B1Rx) | — | — | • | — | Capacitive | Capacitive (B1Rx) | Capacitive | Inductive |
| Non-CA (B2Rx) | — | — | — | • | Capacitive | Capacitive (B2Rx) | Capacitive (B2Rx) | Inductive |
| 3CA (B41/B40/B1Rx) | • | • | • | — | Capacitive | Capacitive | Capacitive | Inductive |
| 3CA (B41/B40/B1Rx) | • | • | — | • | Capacitive | Capacitive | Capacitive (B40 High Side) Capacitive (B40 Low Side) Capacitive (B2Rx) | Inductive |
| 3CA (B41/B1Rx/B2Rx) | • | — | • | • | Capacitive | Capacitive (B41 High Side) Capacitive (B41 Low Side) Capacitive (B1Rx/B2Rx) | Capacitive | Inductive |
| 3CA (B40/B1Rx/B2Rx) | — | • | • | • | Capacitive | Capacitive | Capacitive | Inductive |
| 2CA (B41/B40) | • | • | — | — | Capacitive | Capacitive | Capacitive (B40 High Side) Capacitive (B40 Low Side) | Inductive |
| 2CA (B41/B1Rx) | • | — | • | — | Capacitive | Capacitive (B40 High Side) Capacitive (B41 Low Side) Capacitive (B1Rx) | Capacitive | Inductive |
| 2CA (B41/B2Rx) | • | — | — | • | Capacitive | Capacitive (B41 High Side) Capacitive (B41 Low Side) Capacitive (B2Rx) | Capacitive (B41) Capacitive (B2Rx) | Inductive |
| 2CA (B40/B1Rx) | — | • | • | — | Capacitive | Capacitive | Capacitive | Inductive |
| 2CA (B40/B2Rx) | — | • | — | • | Capacitive | Capacitive | Capacitive (B40 High Side) Capacitive (B40 Low Side) Capacitive (B2Rx) | Inductive |
| 2CA (B1Rx/B2Rx) | — | — | • | • | Capacitive | Capacitive (B1Rx/B2Rx) | Capacitive | Inductive |

With this configuration, the multiplexer 20 is able to perform matching during CA operation for any combination of bands and during non-CA operation for any band, so a loss in a pass band(s) is reduced.

Hereinafter, the characteristics of the multiplexer 20 according to the present embodiment will be described.

Figure 16A:
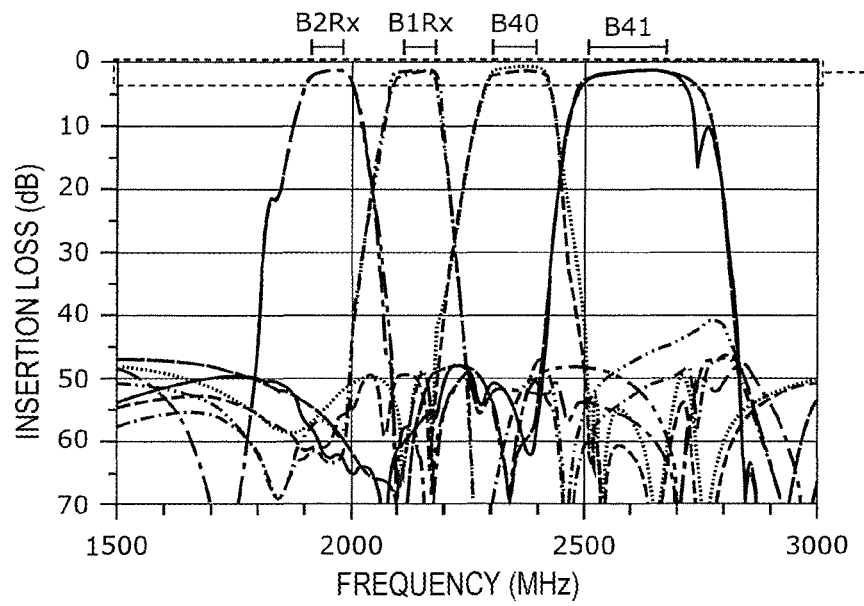
FIGS. 16A and 16B show graphs that show bandpass characteristics during four-band CA operation and bandpass characteristics during non-CA operation of the multiplexer according to the second embodiment.
Figure 16B:
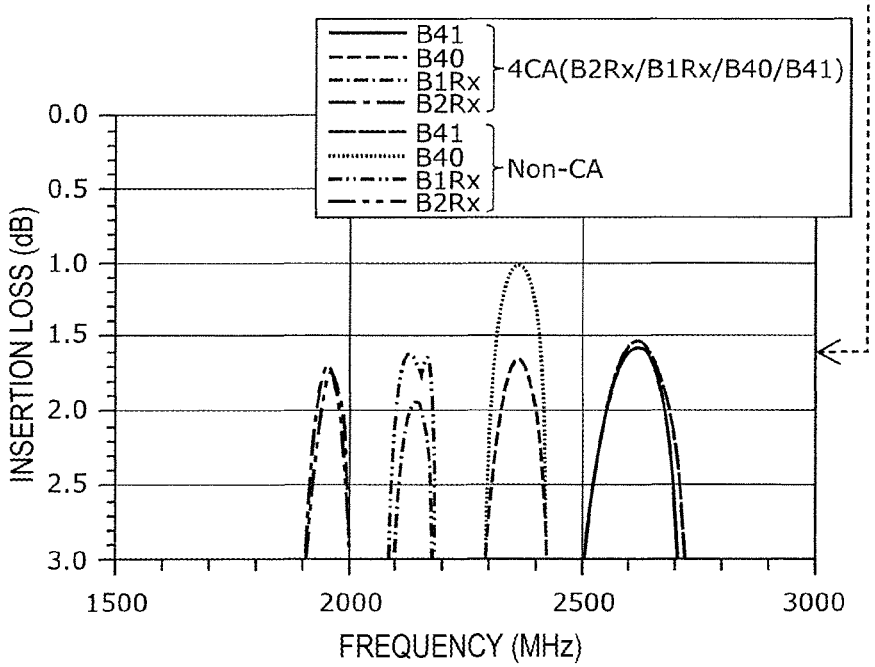

FIGS. 16A and 16B show graphs that show bandpass characteristics during four-band CA operation and bandpass characteristics during non-CA operation of the multiplexer 20 according to the present embodiment. Specifically, the graph of FIG. 16A shows all of these bandpass characteristics, and the graph of FIG. 16B shows a main part of the graph of FIG. 16A in magnified view.

FIGS. 17A, 17B, 17C, 17D and 17E show graphs that individually show bandpass characteristics during three-band CA operation and bandpass characteristics during two-band CA operation of the multiplexer 20 according to the present embodiment. Specifically, the graph of FIG. 17A shows the bandpass characteristics during CA operation for Band 41, Band 40, and Band 1Rx (3CA (Band 41/Band 40/Band 1Rx)). The graph of FIG. 17B shows the bandpass characteristics during CA operation for Band 41, Band 40, and Band 2Rx (3CA (Band 41/Band 40/Band 2Rx)). The graph of FIG. 17C shows the bandpass characteristics during CA operation for Band 41 and Band 2Rx (3CA (Band 41/Band 2Rx)). The graph of FIG. 17D shows the bandpass characteristics during CA operation for Band 41 and Band 40 (2CA (Band 41/Band 40)). The graph of FIG. 17E shows the bandpass characteristics during CA operation for Band 41, Band 1Rx, and Band 2Rx (3CA (Band 41/Band 1Rx/Band 2Rx)).

As is apparent from FIGS. 16A and 16B, and FIGS. 17A, 17B, 17C, 17D and 17E, the multiplexer 20 reduces a loss in a pass band(s) even during CA operation for any combination of bands or even during non-CA operation for any band.

In other words, according to the present embodiment, a low loss is achieved for the multiplexer 20 that supports four-band CA. In the present embodiment, the above-described configuration is not limited to application to a multiplexer that supports four-band CA. A low loss is achieved when the above-described configuration is applied to a multiplexer that supports CA of five or more bands.

In other words, a multiplexer just needs to include a plurality of the second filters that respectively pass radio-frequency signals in mutually different second frequency bands. The matching circuit just needs to include a plurality of resonant circuits associated with the plurality of second filters, and a plurality of the second switches respectively connected between the ground and the node in one of a plurality of the second paths between the plurality of resonant circuits and the plurality of second filters and between the ground and the node in an other one of the plurality of the second paths. Each of the plurality of resonant circuits just needs to have a resonant frequency in the second frequency band of an associated one of the plurality of second filters.

With this configuration, a low loss is achieved for a multiplexer that supports CA of four or more bands.

When the resonant circuit is an acoustic wave resonator having a resonant frequency and an anti-resonant frequency, the acoustic wave resonator desirably has the following anti-resonant frequency from the viewpoint of improvement in branching characteristics. In other words, of a first frequency band, a plurality of mutually different second frequency bands, and a third frequency band, the anti-resonant frequency of the acoustic wave resonator is desirably located in the frequency band that is next to the band, containing the resonant frequency of the acoustic wave resonator, on a higher frequency side. Such a configuration improves branching characteristics, so such a configuration is useful in a multiplexer that can support CA of four or more bands with a narrow band gap.

Third Embodiment

Up to here, a plurality of filters of a multiplexer supports a plurality of bands defined in 3GPP. Alternatively, a plurality of these filters may support a further wide band. In a third embodiment, a multiplexer that supports a wide band will be described.

Figure 18:
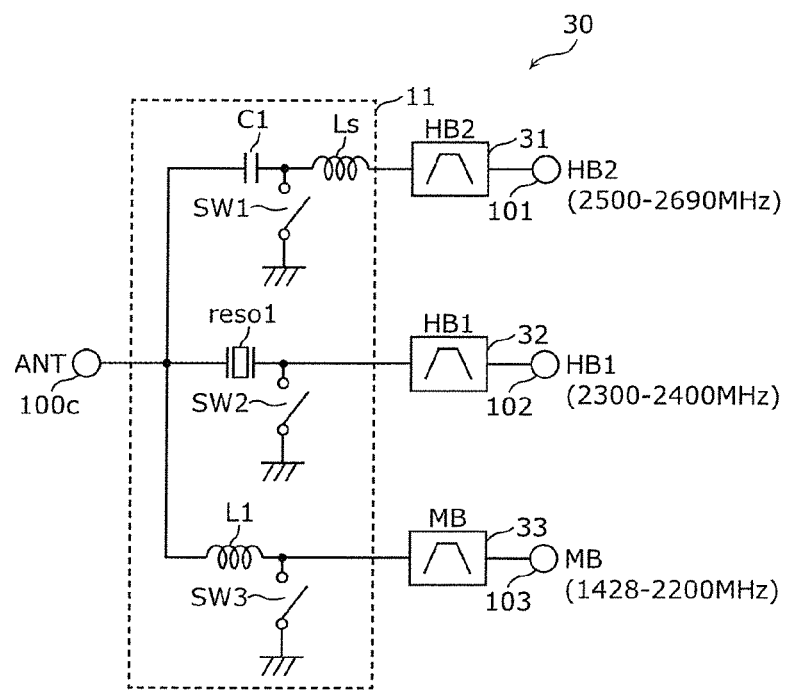
FIG. 18 is a diagram that shows the configuration of a multiplexer according to a third embodiment.

FIG. 18 is a diagram that shows the configuration of the multiplexer 30 according to the third embodiment.

The multiplexer 30 is a triplexer that supports an HB2 band (2500 MHz to 2690 MHz), an HB1 band (2300 MHz to 2400 MHz), and an MB band (1428 MHz to 2200 MHz). The multiplexer 30 includes filters 31 to 33 instead of the filters 21 to 23 as compared to the multiplexer 10 according to the first embodiment. In other words, the multiplexer 30 includes the filter 31 that supports the HB2 band as a first filter, includes the filter 32 that supports the HB1 band as a second filter, and includes the filter 33 that supports the MB band as a third filter.

Even with the thus configured multiplexer 30, as in the case of the multiplexer 10 described in the first embodiment, matching can be performed in a pass band(s) even during any of CA operation and non-CA operation.

Figure 19A:
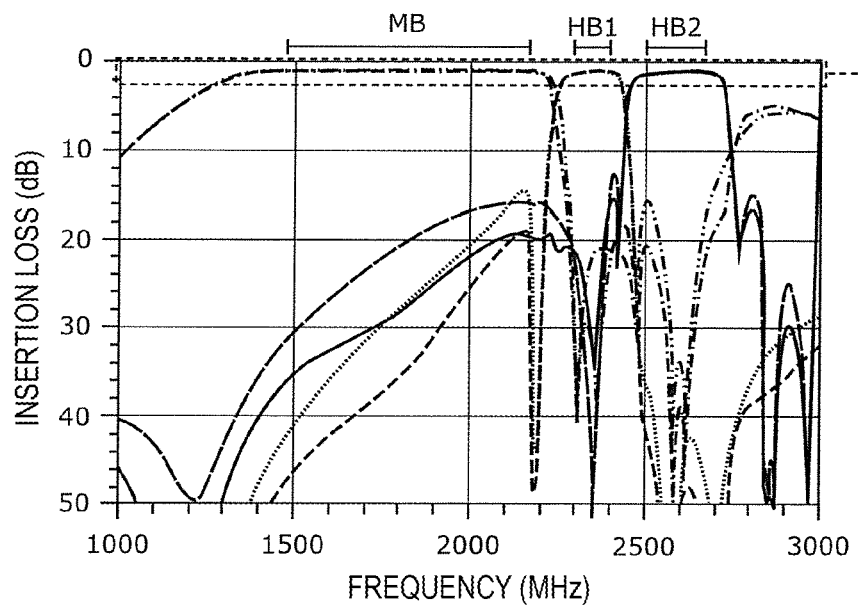
FIGS. 19A and 19B show graphs that show bandpass characteristics during three-band CA operation and bandpass characteristics during non-CA operation of the multiplexer according to the third embodiment.
Figure 19B:
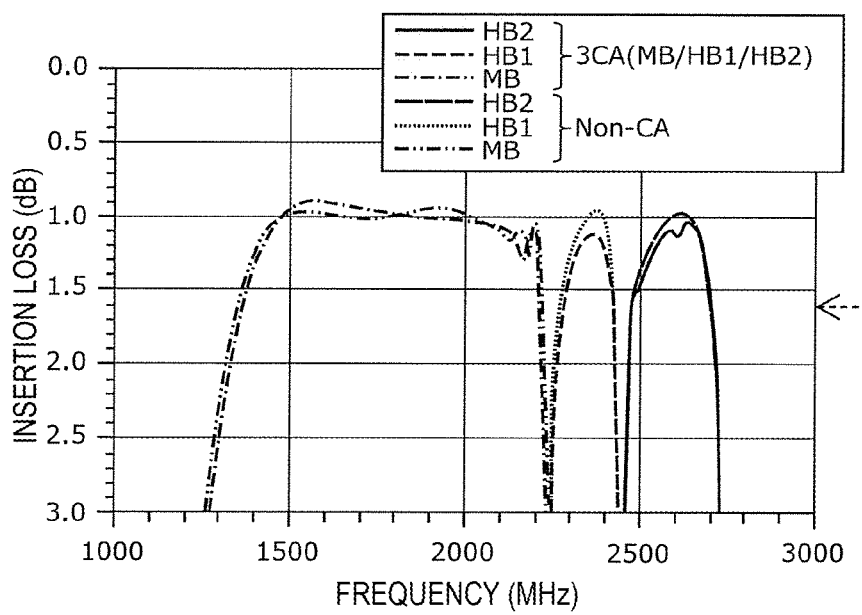

FIGS. 19A and 19B show graphs that show bandpass characteristics during three-band CA operation and bandpass characteristics during non-CA operation of the multiplexer 30 according to the present embodiment. Specifically, the graph of FIG. 19A shows all of these bandpass characteristics, and the graph of FIG. 19B shows a main part of the graph of FIG. 19A in magnified view.

FIGS. 20A, 20B, 20C, 20D, 20E and 20F show graphs that individually show bandpass characteristics during two-band CA operation and bandpass characteristics during non-CA operation of the multiplexer 30 according to the present embodiment. Specifically, the graph of FIG. 20A shows the bandpass characteristics during CA operation for the HB1 band and the HB2 band (2CA (HB1/HB2)). The graph of FIG. 20B shows the bandpass characteristics during CA operation for the MB band and the HB2 band (2CA (MB/HB2)). The graph of FIG. 20C shows the bandpass characteristics during CA operation for the MB band and the HB1 band (2CA (MB/HB1)). The graph of FIG. 20D shows the bandpass characteristics during non-CA operation for the HB2 band (Non-CA (HB2)). The graph of FIG. 20E shows the bandpass characteristics during non-CA operation for the HB1 band (Non-CA (HB1)). The graph of FIG. 20F shows the bandpass characteristics during non-CA operation for the MB band (Non-CA (MB)).

As is apparent from FIGS. 19A and 19B, and FIGS. 20A, 20B, 20C, 20D, 20E and 20F, the multiplexer 30 reduces a loss in a pass band(s) even during CA operation for any combination of bands or even during non-CA operation for any band.

The multiplexer 30 is also applicable to a radio-frequency front-end circuit and a communication device including the radio-frequency front-end circuit, as in the case of the multiplexer 10 according to the first embodiment.

Figure 21:
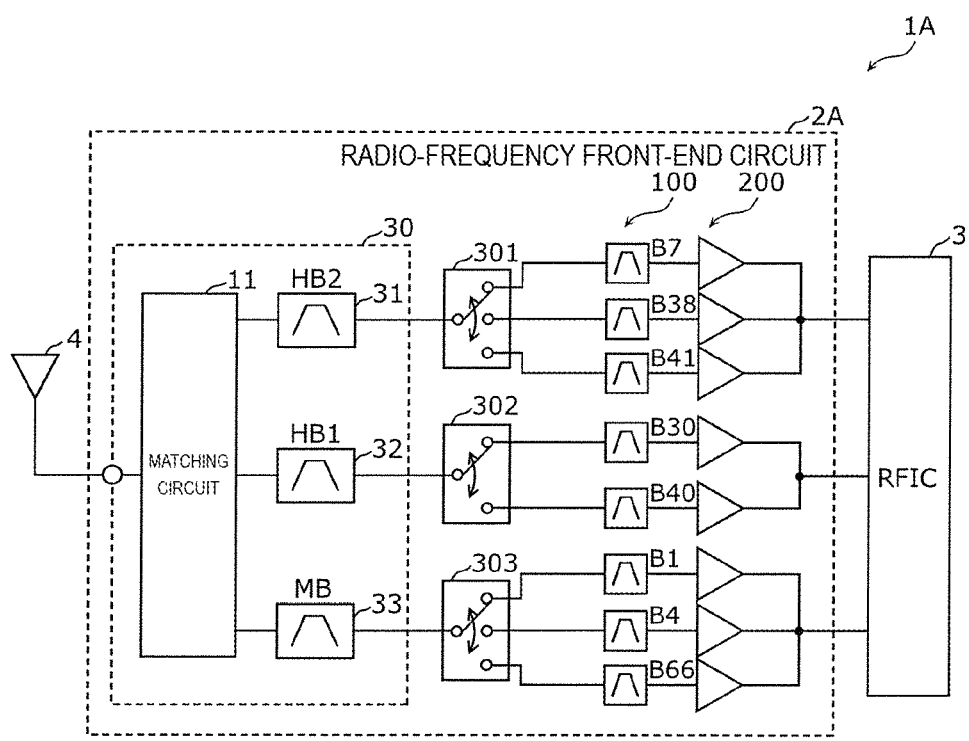
FIG. 21 is a block diagram of a communication device including the multiplexer according to the third embodiment.

FIG. 21 is a block diagram of a communication device 1A including the multiplexer 30 according to the present embodiment.

The communication device 1A shown in the diagram supports Band 7, Band 38, and Band 41 contained in the HB2 band, Band 30 and Band 40 contained in the HB1 band, and Band 1, Band 4, and Band 66 contained in the MB band, and differs from the communication device 1 according to the first embodiment in the configuration of a radio-frequency front-end circuit 2A. Specifically, the radio-frequency front-end circuit 2A includes the above-described multiplexer 30, switches 301 to 303 for changing bands, connected to the multiplexer 30, a filter group 100 made up of filters associated with the bands, and an amplifier circuit group 200 made up of amplifier circuits associated with the bands. A common terminal of each of the switches 301 to 303 is connected to an associated one of the filters 31 to 33, and a plurality of selection terminals of each of the switches 301 to 303 is connected to the filter group 100. Each of the switches 301 to 303 switches the selection terminal to be connected to the common terminal in accordance with a control signal from a control unit such as the RFIC 3. Thus, during CA operation or during non-CA operation, the band(s) to be selected is/are changed. Each of the plurality of amplifier circuits of the amplifier circuit group 200 is a low-noise amplifier that amplifies a radio-frequency signal that has passed through the filter group 100.

The thus configured communication device 1A and radio-frequency front-end circuit 2A include the above-described multiplexer 30, so a low loss is achieved.

Fourth Embodiment

The multiplexer that supports a wide band, described in the third embodiment, may support four bands, as in the case of the second embodiment. In a fourth embodiment, such a multiplexer will be described.

Figure 22:
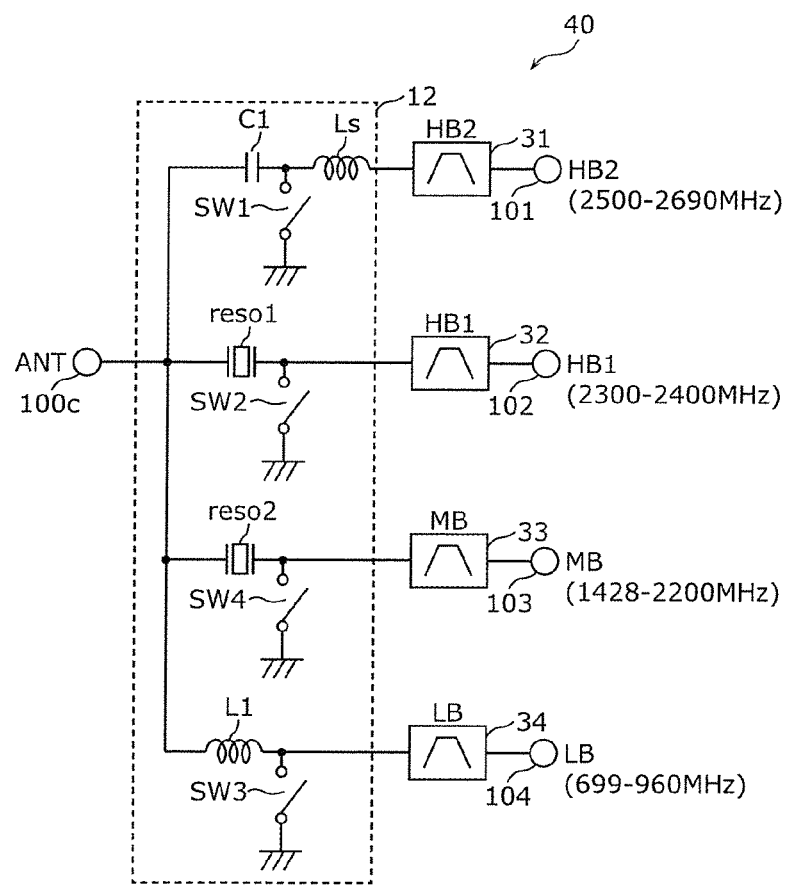
FIG. 22 is a diagram that shows the configuration of a multiplexer according to a fourth embodiment.

FIG. 22 is a diagram that shows the configuration of the multiplexer 40 according to the fourth embodiment.

The multiplexer 40 is a quadplexer that further supports an LB band (699 MHz to 960 MHz) as compared to the multiplexer according to the third embodiment. The multiplexer 40 includes filters 31 to 34 instead of the filters 21 to 24 as compared to the multiplexer 20 according to the second embodiment. In other words, the multiplexer 40 includes the filter 31 that supports the HB2 band as a first filter, includes the filter 32 that supports the HB1 band and the filter 33 that supports the MB band as two second filters, and includes the filter 34 that supports the LB band as a third filter.

Even with the thus configured multiplexer 40, as in the case of the multiplexer 20 described in the second embodiment, matching can be performed in a pass band(s) even during any of CA operation and non-CA operation.

Figure 23A:
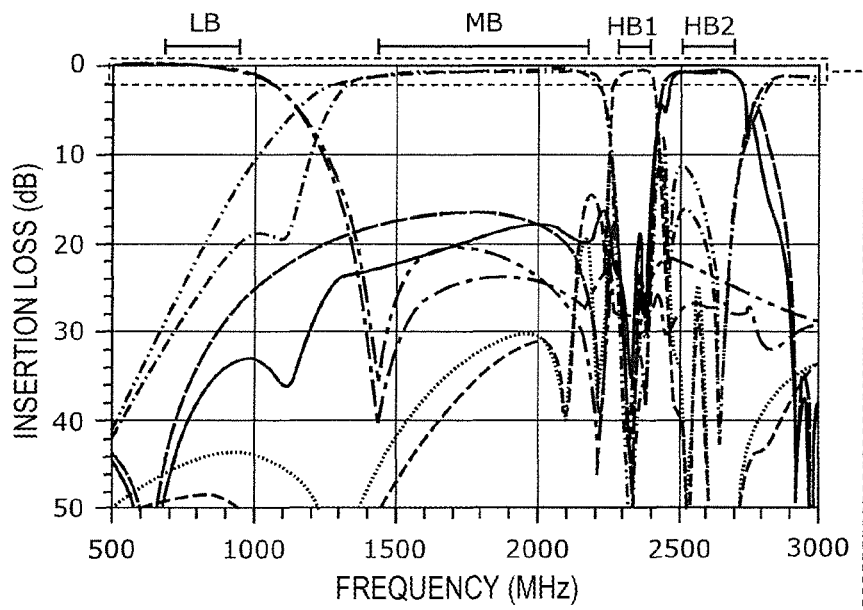
FIGS. 23A and 23B show graphs that show bandpass characteristics during four-band CA operation and bandpass characteristics during non-CA operation of the multiplexer according to the fourth embodiment.
Figure 23B:
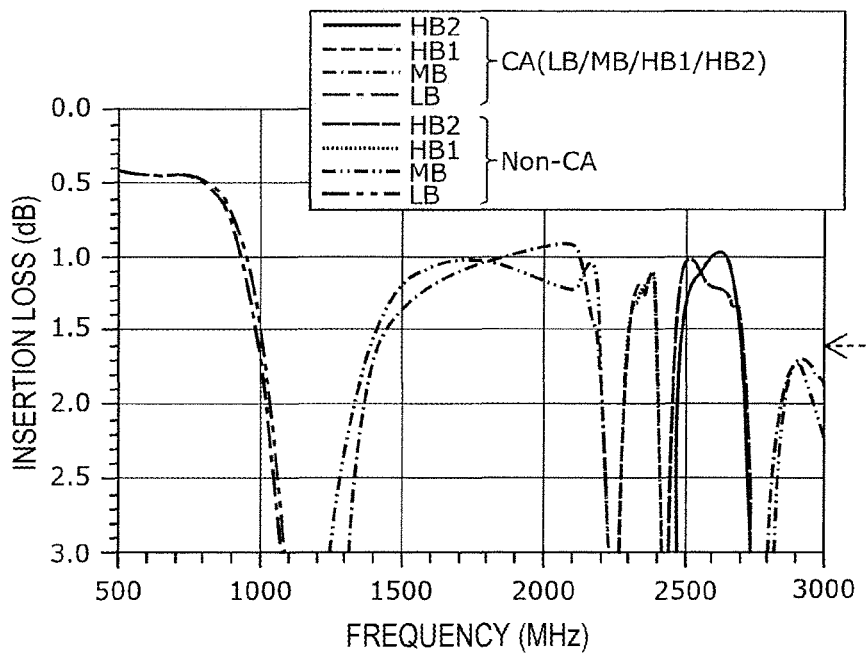

FIGS. 23A and 23B show graphs that show bandpass characteristics during four-band CA operation and bandpass characteristics during non-CA operation of the multiplexer 40 according to the present embodiment. Specifically, the graph of FIG. 23A shows all of these bandpass characteristics, and the graph of FIG. 23B shows a main part of the graph of FIG. 23A in magnified view.

Figures 24A, 24D:
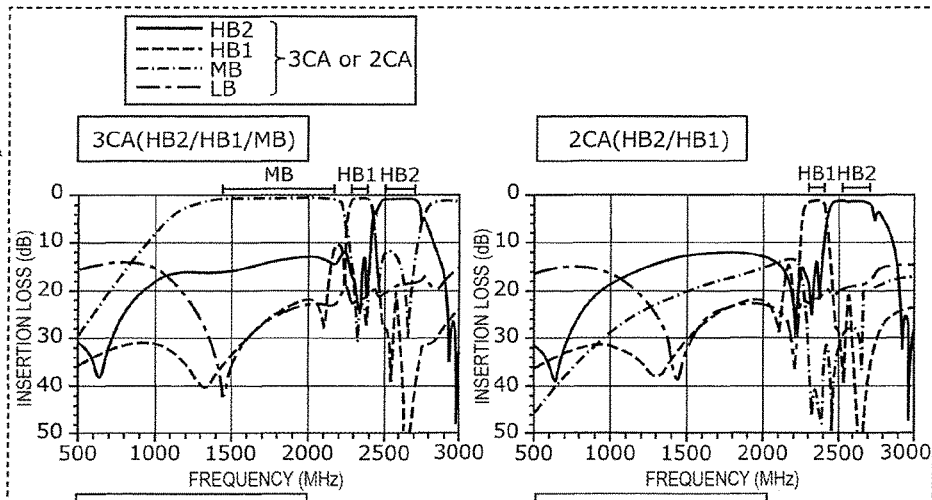
FIGS. 24A, 24B, 24C, 24D and 24E show graphs that individually show bandpass characteristics during three-band CA operation and bandpass characteristics during two-band CA operation of the multiplexer according to the fourth embodiment.
Figures 24B, 24E:
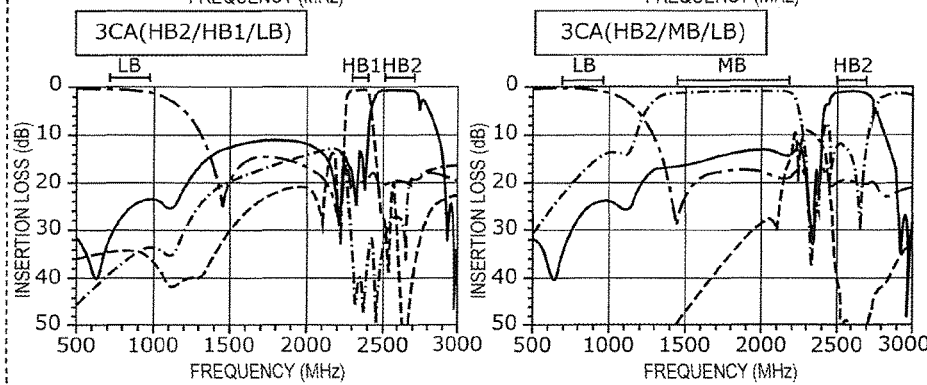
Figure 24C:
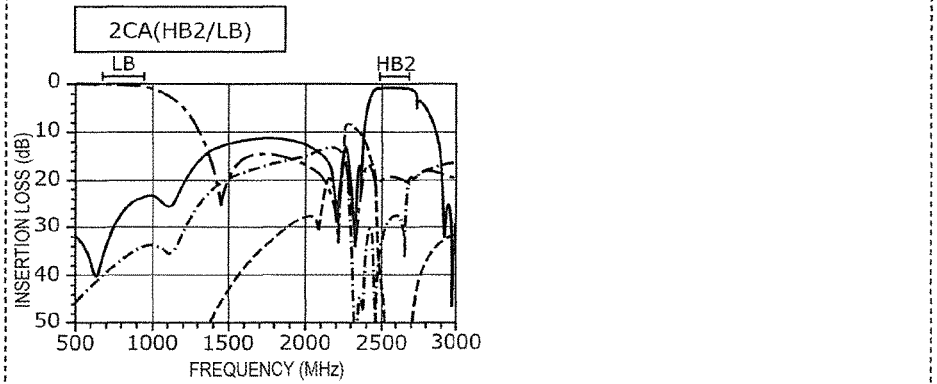

FIGS. 24A, 24B, 24C, 24D and 24E shows graphs that individually show bandpass characteristics during three-band CA operation and bandpass characteristics during two-band CA operation of the multiplexer 40 according to the present embodiment. Specifically, the graph of FIG. 24A shows the bandpass characteristics during CA operation for the HB2 band, the HB1 band, and the MB band (3CA (HB2/HB1/MB)). The graph of FIG. 24B shows the bandpass characteristics during CA operation for the HB2 band, the HB1 band, and the LB band (3CA (HB2/HB1/LB)). The graph of FIG. 24C shows the bandpass characteristics during CA operation for the HB2 band and the LB band (2CA (HB2/LB)). The graph of FIG. 24D shows the bandpass characteristics during CA operation for the HB2 band and the HB1 band (2CA (HB2/HB1)). The graph of FIG. 24E shows the bandpass characteristics during CA operation for the HB2 band, the MB band, and the LB band (3CA (HB2/MB/LB)).

As is apparent from FIGS. 23A and 23B, and FIGS. 24A, 24B, 24C, 24D and 24E, the multiplexer 40 reduces a loss in a pass band(s) even during CA operation for any combination of bands or even during non-CA operation for any band.

In other words, according to the present embodiment, a low loss is achieved for the multiplexer 40 that supports four-band CA.

(Modifications)

The multiplexer according to the embodiment of the present disclosure and the radio-frequency front-end circuit and communication device including the multiplexer are described by way of the embodiments. The present disclosure also encompasses modifications that are obtained by applying various alterations that are conceived of by persons skilled in the art to the above-described embodiments or modifications without departing from the purport of the present disclosure, and various devices that include the multiplexer according to the present disclosure, the radio-frequency front-end circuit including the multiplexer, and the communication device including the multiplexer.

Figure 25:
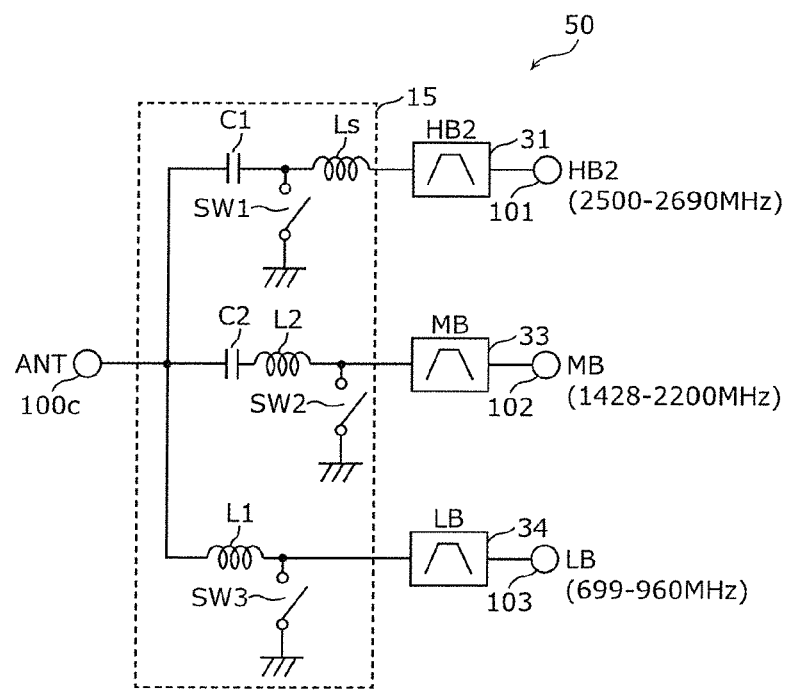
FIG. 25 is a diagram that shows the configuration of a multiplexer according to a first modification.

For example, in the above description, the resonator is described as the resonant circuit connected in series in the second path connecting the common terminal 100c and the second filter as an example. However, the configuration of the resonant circuit is not limited thereto. For example, the resonant circuit may be made up of a resonator and an impedance element, such as a capacitor connected in series with the resonator. Furthermore, the resonant circuit is not limited to the configuration including a resonator. Alternatively, for example, as shown in FIG. 25, the resonant circuit may be an LC series resonant circuit in which an inductor L2 and a capacitor C2 are connected in series. FIG. 25 is a diagram that shows the configuration of a multiplexer 50 according to a first modification.

The multiplexer 50 shown in the diagram is a triplexer that supports the HB2 band, the MB band, and the LB band. The multiplexer 50 differs from the multiplexer 30 according to the third embodiment in the configuration of a matching circuit 15, and includes a filter 33 that supports the MB band as a second filter and includes a filter 34 that supports the LB band as a third filter. The matching circuit 15 includes the above-described LC series resonant circuit instead of the resonator reso1, as compared to the matching circuit 11 in the third embodiment.

Figure 26A:
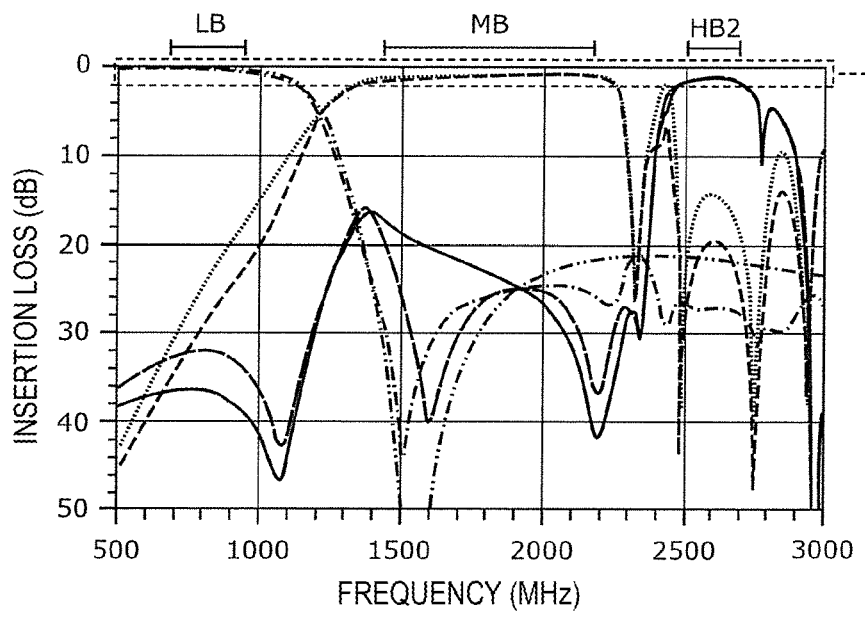
FIGS. 26A and 26B show graphs that show bandpass characteristics during three-band CA operation and bandpass characteristics during non-CA operation of the multiplexer according to the first modification.
Figure 26B:
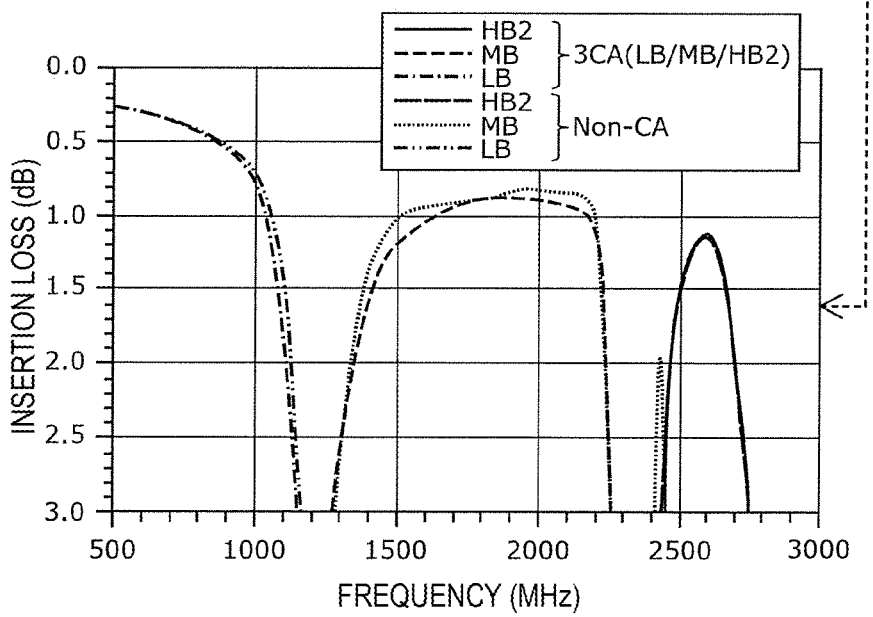

FIGS. 26A and 26B show graphs that show bandpass characteristics during three-band CA operation and bandpass characteristics during non-CA operation of the multiplexer 50. Specifically, the graph of FIG. 26A shows all of these bandpass characteristics, and the graph of FIG. 26B shows a main part of the graph of FIG. 26A in magnified view.

FIGS. 27A, 27B, 27C, 27D, 27E and 27F shows graphs that show bandpass characteristics during two-band CA operation and bandpass characteristics during non-CA operation of the multiplexer 50. Specifically, the graph of FIG. 27A shows the bandpass characteristics during CA operation for the MB band and the HB2 band (2CA (MB/HB2)). The graph of FIG. 27B shows the bandpass characteristics during CA operation for the LB band and the HB2 band (2CA (LB/HB2)). The graph of FIG. 27C shows the bandpass characteristics during CA operation for the LB band and the MB band (2CA (LB/MB)). The graph of FIG. 27D shows the bandpass characteristics during non-CA operation for the HB2 band (Non-CA (HB2)). The graph of FIG. 27E shows the bandpass characteristics during non-CA operation for the MB band (Non-CA (MB)). The graph of FIG. 27F shows the bandpass characteristics during non-CA operation for the LB band (Non-CA (LB)).

As is apparent from FIGS. 26A and 26B, and FIGS. 27A, 27B, 27C, 27D, 27E and 27F, the multiplexer 50 reduces a loss in a pass band(s) even during CA operation for any combination of bands or even during non-CA operation for any band.

With the multiplexer 50, when the resonant circuit is made up of the inductor L2 and the capacitor C2 whose element values are easily adjustable, matching can be performed with higher accuracy. Therefore, a loss due to mismatching is further reduced, so a further low loss is achieved.

Figure 28:
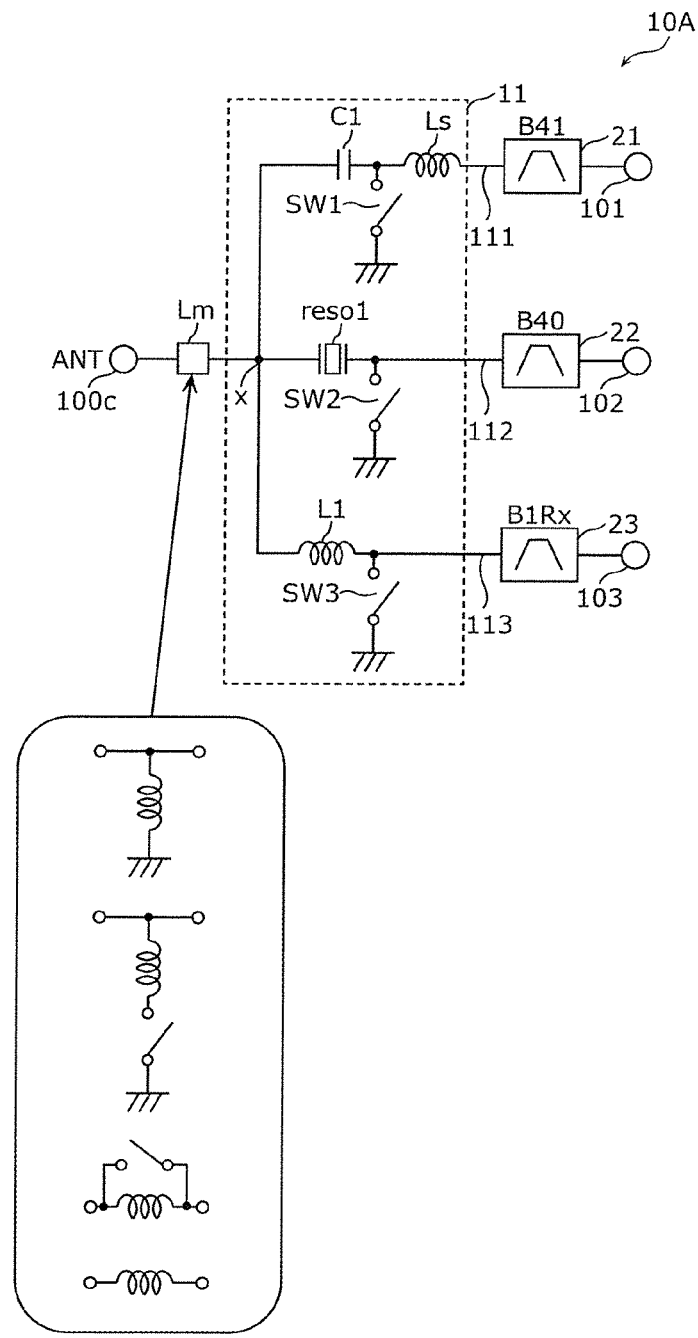
FIG. 28 is a diagram that shows the configuration of a multiplexer according to a second modification.

As in the case of the multiplexer 10A shown in FIG. 28, the paths 111 to 113 that are the first to third paths may be connected in common to one another and then connected to the common terminal 100c, and an inductor (third inductor) may be connected in the common connection portion of these paths. FIG. 28 is a diagram that shows the configuration of the multiplexer 10A according to a second modification. The multiplexer 10A shown in the diagram is almost similar to the multiplexer 10 according to the first embodiment, except for the point that a circuit Lm including an inductor is connected between the common terminal 100c and a node to which the paths 111 to 113 are connected in common. Examples of the circuit Lm include an inductor connected between the ground and the common connection portion of the paths 111 to 113, a series circuit made up of the inductor and a switch connected in series with the inductor, an inductor provided in series in the common connection portion, or a parallel circuit made up of the inductor and a switch connected in parallel with the inductor, as shown on the lower side of the diagram.

Since such an inductor (third inductor) is provided, minute adjustment of matching can be performed with not only the matching circuit 11 but also the inductor, so matching can be performed with higher accuracy. Thus, a return loss due to mismatching is further reduced, so a further low loss is achieved. This is particularly remarkable when the filters 21 to 23 have a capacitive impedance, such as acoustic wave filters.

However, when the inductor is provided, a loss in the multiplexer 10A can increase because of the quality factor of the inductor. For this reason, such an inductor is provided as appropriate in consideration of a return loss due to mismatching, a loss due to the quality factor of the inductor, or the like.

In the above description, the three or more-band multiplexers are described as examples; however, the present disclosure may be applied to a two-band multiplexer.

Figure 29:
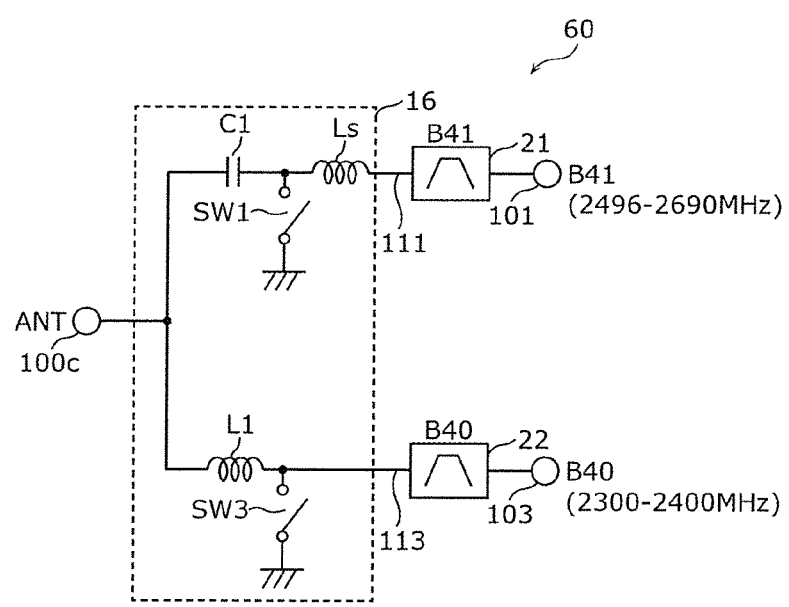
FIG. 29 is a diagram that shows the configuration of a multiplexer according to a third modification.

FIG. 29 is a diagram that shows the configuration of a multiplexer 60 according to a third modification. The multiplexer 60 shown in the diagram includes components associated with the path 111 and the path 113 and does not include a component associated with the path 112, as compared to the multiplexer 10 according to the first embodiment. In other words, a matching circuit 16 in the present embodiment does not include the resonator reso1 or the switch SW2, as compared to the matching circuit 11 in the first embodiment. The multiplexer 60 includes the filter 22 that supports Band 40 instead of the filter 23 that supports Band 1Rx, as a third filter. Namely, in the present modification, Band 41 corresponds to the first frequency band, and Band 40 corresponds to the third frequency band.

Figure 30A:
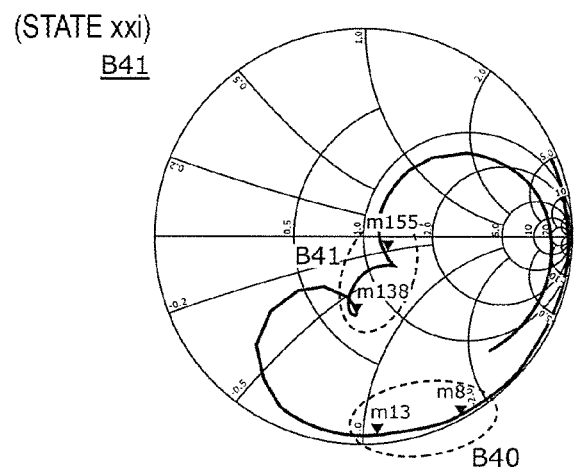
FIG. 30A is a Smith chart that shows the impedance of a path associated with Band 41 and viewed from a common terminal in the third modification.

FIG. 30A is a Smith chart that shows the impedance (hereinafter, state xxi) of the path 111 associated with Band 41 and viewed from the common terminal 100c when the switch SW1 is in the off state in the third modification. As shown in the chart, the impedance is located in the third quadrant that is the left lower side to the center on the Smith chart in Band 41, and shows a capacitive characteristic in Band 40.

Figure 30B:
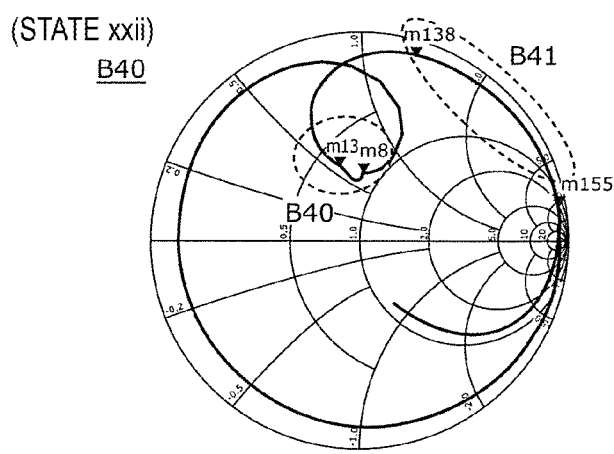
FIG. 30B is a Smith chart that shows the impedance of a path associated with Band 40 and viewed from the common terminal in the third modification.

FIG. 30B is a Smith chart that shows the impedance (hereinafter, state xxii) of the path 113 associated with Band 40 and viewed from the common terminal 100c when the switch SW3 is in the off state in the third modification. As shown in the chart, the impedance is located in the second quadrant that is the left upper side to the center on the Smith chart in Band 40, and shows an inductive characteristic in Band 41.

With such impedance design, the multiplexer 60 according to the present modification is able to perform matching even during any operation when each of the switches SW1, SW3 of the matching circuit 16 is switched between the on state and the off state as appropriate. Hereinafter, the mechanism will be described.

Figure 31:
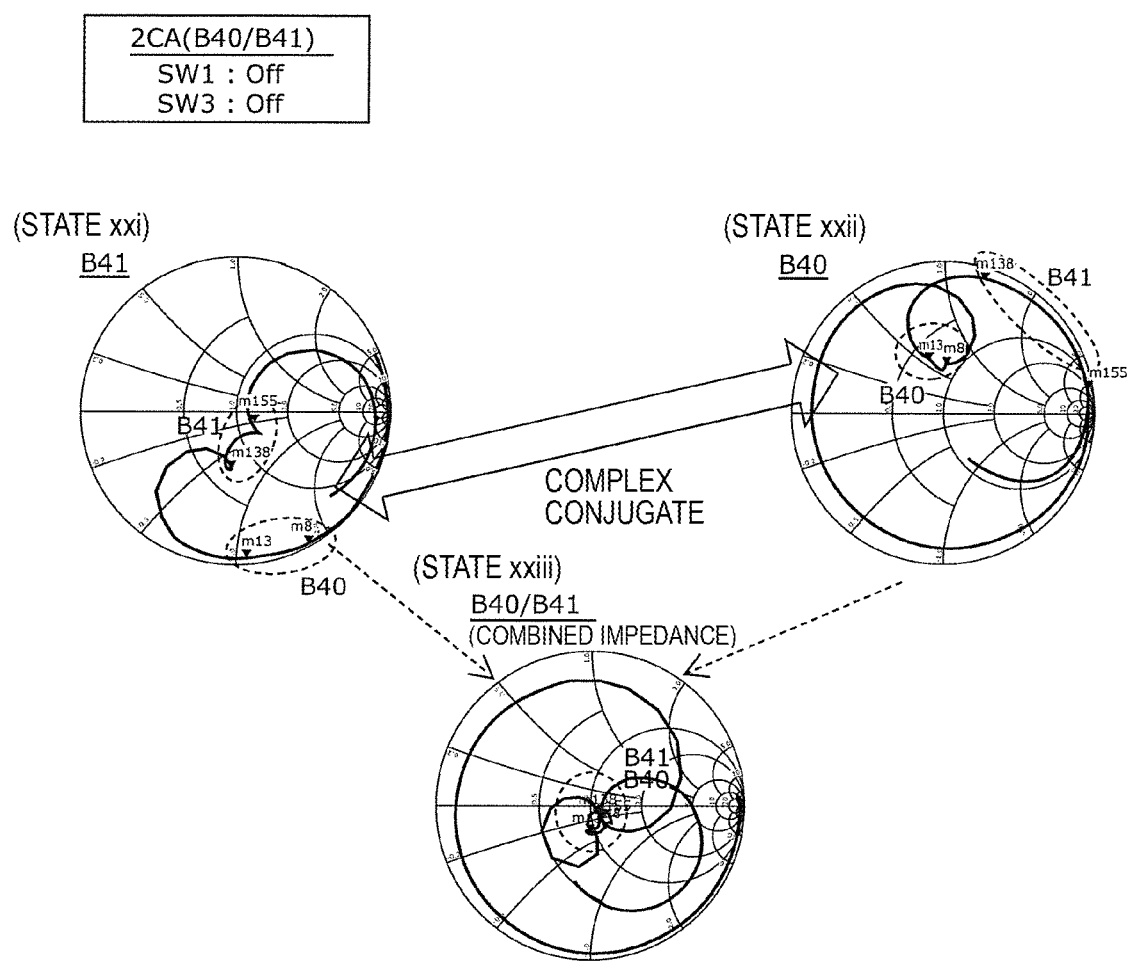
FIG. 31 is a schematic view that illustrates the mechanism of matching during two-band CA operation in the third modification.

FIG. 31 is a schematic view that illustrates the mechanism of matching during two-band CA operation (2CA (Band 40/Band 41)) in the third modification.

During two-band CA operation, any of the switches SW1, SW3 is set to the off state. With this configuration, the impedance of the common terminal 100c is a combined impedance of the state xxi and the state xxii, shown at the top of the chart. At this time, with the above-described impedance design, the state xxi and the state xxii can be brought close to a complex conjugate relation for any of Band 41 and Band 40. Thus, the combined impedance of the state xxi and the state xxii (hereinafter, state xxiii) gathers near the center on the Smith chart in any of Bands 41, 40.

Therefore, the multiplexer 60 is able to perform matching for any of the two bands during CA operation.

Figure 32A:
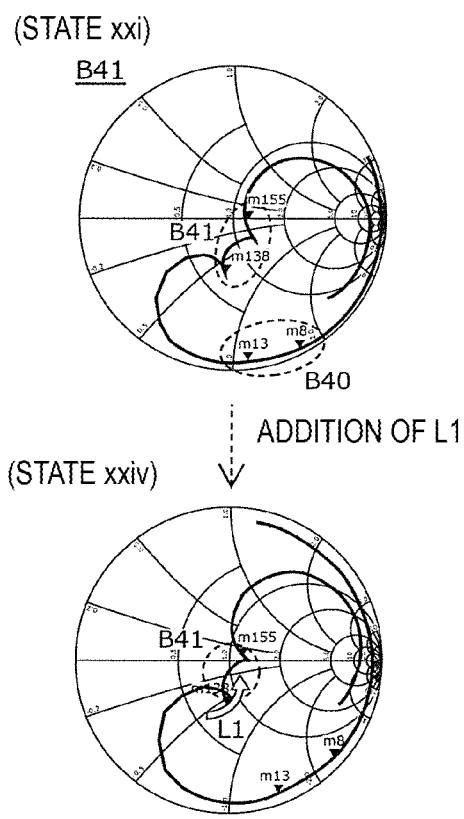
FIG. 32A is a schematic view that illustrates the mechanism of matching during non-CA operation for Band 41 in the third modification.

FIG. 32A is a schematic view that illustrates the mechanism of matching during non-CA operation for Band 41 (Non-CA (Band 41)) in the third modification.

During non-CA operation for Band 41, the switch SW1 is set to the off state, and the switch SW3 is set to the on state. Thus, at this time, the inductor L1 functions as the matching element connected between the common terminal 100c and the ground for the filter 21 of Band 41.

With this configuration, the impedance of the common terminal 100c is an impedance converted by the addition of the inductor L1 to the state xxi shown at the top of the drawing. Specifically, the impedance shifts in a counterclockwise direction along a constant conductance circle on the Smith chart by the addition of the inductor L1, so the impedance is converted from the state xxi to the state xxiv, and approaches the center on the Smith chart in Band 41.

FIG. 32B is a schematic view that illustrates the mechanism of matching during non-CA operation for Band 40 (Non-CA (Band 40)) in the third modification.

During non-CA operation for Band 40, the switch SW1 is set to the on state, and the switch SW3 is set to the off state. Thus, at this time, the capacitor C1 functions as the matching element connected between the common terminal 100c and the ground for the filter 22 of Band 40.

With this configuration, the impedance of the common terminal 100c is an impedance converted by the addition of the capacitor C1 to the state xxii shown at the top of the drawing. Specifically, the impedance shifts in a clockwise direction along a constant conductance circle on the Smith chart by the addition of the capacitor C1, so the impedance is converted from the state xxii to the state xxv, and approaches the center on the Smith chart in Band 40.

Therefore, the multiplexer 60 is able to perform matching during non-CA operation for any of Band 40 and Band 41.

Figure 33A:
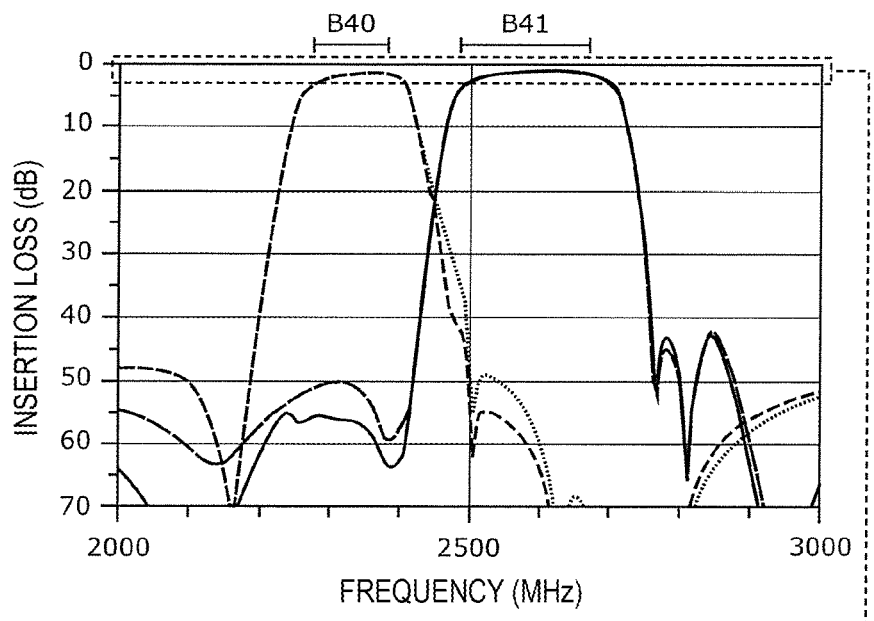
FIGS. 33A and 33B show graphs that show bandpass characteristics during CA operation and bandpass characteristics during non-CA operation of the multiplexer according to the third modification.
Figure 33B:
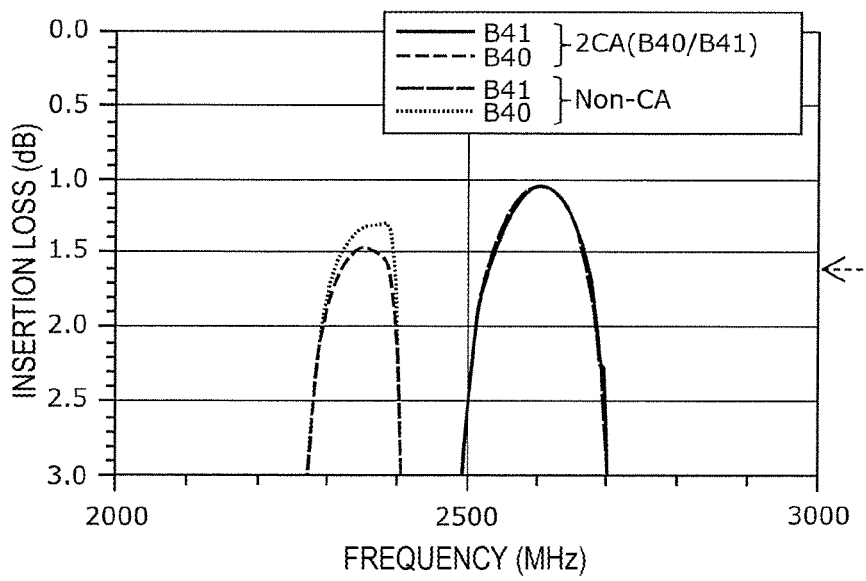

FIGS. 33A and 33B show graphs that show bandpass characteristics during CA operation and bandpass characteristics during non-CA operation of the multiplexer 60 according to the third modification. Specifically, the graph of FIG. 33A shows all of these bandpass characteristics, and the graph of FIG. 33B shows a main part of the graph of FIG. 33A in magnified view.

As is apparent from the graphs, the multiplexer 60 reduces a loss in a pass band(s) even during CA operation or even during non-CA operation for any band. This results from not only the fact that a loss due to mismatching (return loss) is reduced by the above-described mechanism of matching but also the fact that a loss in the multiplexer 60 due to a circuit element(s) having a low quality factor is reduced as in the case of the three or more-band multiplexers described above. This will be described in comparison with the above-described comparative example in which the matching circuits 911 are provided instead of the matching circuit 16.

FIGS. 34A and 34B show graphs of bandpass characteristics during CA operation and bandpass characteristics during non-CA operation for comparison between the third modification and the comparative example. Specifically, the graph of FIG. 34A shows the characteristics of the multiplexer 60 according to the third modification, shown in FIG.

33B, and the graph of FIG. 34B shows the characteristics of the multiplexer according to the comparative example.

As is apparent from the comparison between the graph of FIG. 34A and the graph of FIG. 34B, a loss in a pass band(s) in the two-band multiplexer 60 is reduced as compared to the comparative example that uses the matching circuits 911, even during any of CA operation and non-CA operation. In other words, the number of inductors having a low quality factor is reduced, so a low loss is achieved.

Figure 35:
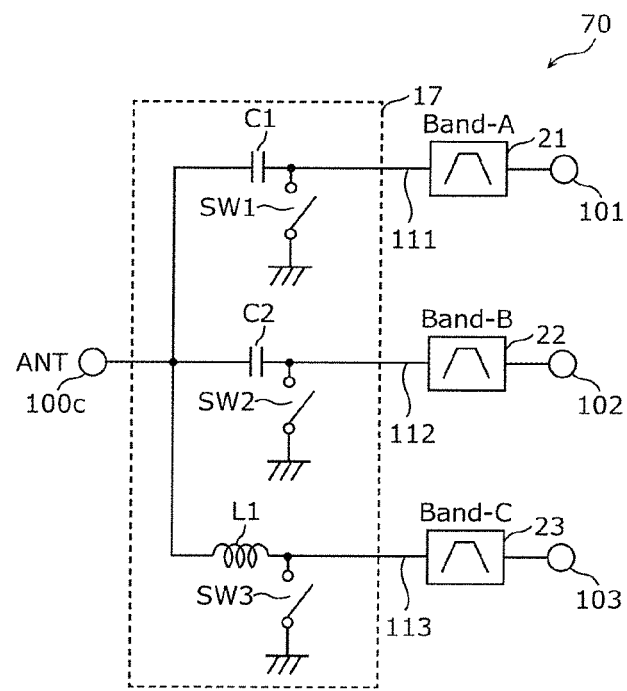
FIG. 35 is a diagram that shows the configuration of a multiplexer according to a fourth modification.

FIG. 35 is a diagram that shows the configuration of a multiplexer 70 according to a fourth modification. The multiplexer 70 shown in the diagram differs from the multiplexer 60 according to the third modification in that the path 112 and the filter 22 are added. In other words, the multiplexer 70 according to the fourth modification includes a matching circuit element and the filter 22, disposed in the path 112, as compared to the multiplexer 60 according to the third modification.

The multiplexer 70 includes the common terminal 100*c*, a matching circuit 17, and the filters 21, 22, 23.

The filter 21 is connected to the common terminal 100*c* via the matching circuit 17. The filter 21 is a first filter that passes a radio-frequency signal in Band-A (first frequency band). The filter 23 is connected to the common terminal 100*c* via the matching circuit 17. The filter 23 is a third filter that passes a radio-frequency signal in Band-C (third frequency band) lower in frequency than Band-A (first frequency band). The filter 22 is connected to the common terminal 100*c* via the matching circuit 17. The filter 22 is a second filter that passes a radio-frequency signal in Band-B (second frequency band) lower in frequency than Band-A (first frequency band) and higher in frequency than Band-C (third frequency band).

The matching circuit 17 includes the capacitors C1, C2, the inductor L1, and the switches SW1, SW2, SW3.

The capacitor C1 is a first capacitor connected in series in the path 111 (first path) connecting the common terminal 100*c* and the filter 21. The capacitor C2 is a second capacitor connected in series in the path 112 (second path) connecting the common terminal 100*c* and the filter 22. The inductor L1 is a first inductor connected in series in the path 113 (third path) connecting the common terminal 100*c* and the filter 23.

The switch SW1 is a first switch connected between a ground and a node in the path 111 between the capacitor C1 and the filter 21. The switch SW2 is a second switch connected between the ground and a node in the path 112 between the capacitor C2 and the filter 22. The switch SW3 is a third switch connected between the ground and a node in the path 113 between the inductor L1 and the filter 23.

Figure 36A:
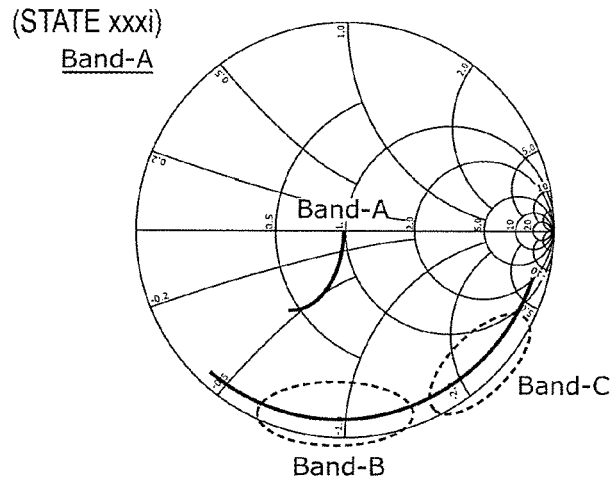
FIG. 36A is a Smith chart that shows the impedance of a path associated with Band-A and viewed from a common terminal in the fourth modification.

FIG. 36A is a Smith chart that shows the impedance (hereinafter, state xxxi) of the path 111 associated with Band-A and viewed from the common terminal 100*c* when the switch SW1 is in the off state in the present modification. As shown in the chart, when the switch SW1 is in the off state, the impedance (state xxxi) of the path 111 associated with Band-A and viewed from the common terminal 100*c* is set so as to be located in the third quadrant on the Smith chart in Band-A. The impedance is set so as to be located in the third quadrant or the fourth quadrant on the Smith chart in Band-B and Band-C lower in frequency than Band-A. In other words, the impedance is set so as to show a capacitive characteristic in Band-B and Band-C. In the present modification, the impedance is set so as to be located in the third quadrant and the fourth quadrant on the Smith chart in Band-B and is set so as to be located in the fourth quadrant on the Smith chart in Band-C.

Figure 36B:
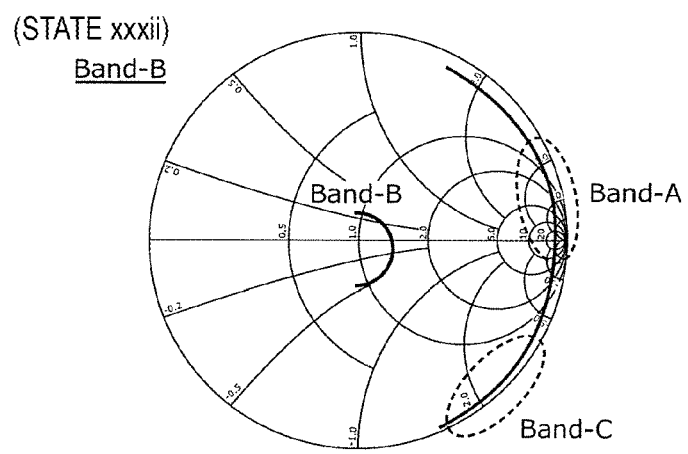
FIG. 36B is a Smith chart that shows the impedance of a path associated with Band-B and viewed from the common terminal in the fourth modification.

FIG. 36B is a Smith chart that shows the impedance (hereinafter, state xxxii) of the path 112 associated with Band-B and viewed from the common terminal 100*c* when the switch SW2 is in the off state in the present modification. As shown in the chart, when the switch SW2 is in the off state, the impedance of the path 112 associated with Band-B and viewed from the common terminal 100*c* is set so as to be located near the center on the Smith chart in Band-B. In addition, the impedance is set so as to be at least partially located in the first quadrant or the second quadrant on the Smith chart in Band-A higher in frequency than Band-B, and is set so as to be located in the third quadrant or the fourth quadrant on the Smith chart in Band-C lower in frequency than Band-B. In other words, the impedance is set so as to show an inductive characteristic in at least part of Band-A and show a capacitive characteristic in Band-C. In the present modification, the impedance is set so as to show an inductive characteristic in one part of Band-A and show a capacitive characteristic in the other part of Band-A. In other words, the impedance is set in a range that straddles over the real axis on the Smith chart in Band-A. Specifically, the impedance is located in the first quadrant on the Smith chart in one part of Band-A and is located in the fourth quadrant on the Smith chart in the other part of Band-A. In addition, the impedance is located in the fourth quadrant on the Smith chart in Band-C.

Figure 36C:
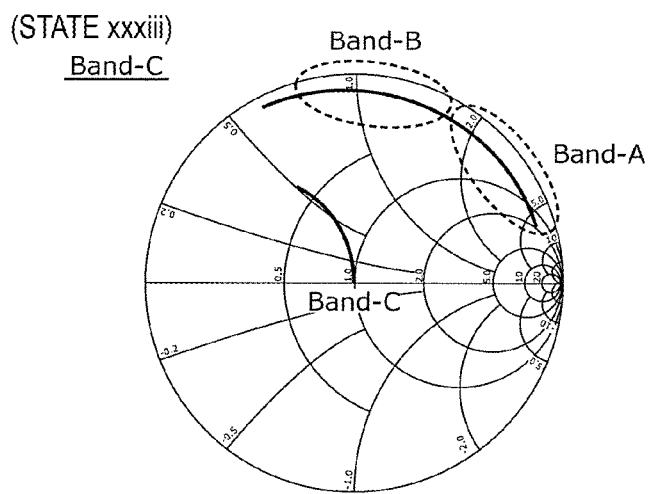
FIG. 36C is a Smith chart that shows the impedance of a path associated with Band-C and viewed from the common terminal in the fourth modification.

FIG. 36C is a Smith chart that shows the impedance (hereinafter, state xxxiii) of the path 113 associated with Band-C and viewed from the common terminal 100*c* when the switch SW3 is in the off state in the present modification. As shown in the chart, when the switch SW3 is in the off state, the impedance of the path 113 associated with Band-C and viewed from the common terminal 100*c* is set so as to be located in the second quadrant on the Smith chart in Band-C. The impedance is set so as to be located in the first quadrant or the second quadrant on the Smith chart in Band-A and Band-B higher in frequency than Band-C. In other words, the impedance shows an inductive characteristic in Band-A and Band-B. In the present modification, the impedance is set so as to be located in the first quadrant on the Smith chart in Band-A and is set so as to be located in the first quadrant and the second quadrant on the Smith chart in Band-B.

The impedance (state xxxi) shown in FIG. 36A, the impedance (state xxxii) shown in FIG. 36B, and the impedance (state xxxiii) shown in FIG. 36C are set to have a complex conjugate relation in Band-A, Band-B, and Band-C. In other words, the states xxxi to xxxiii are set such that the complex components are cancelled by one another in Band-A, Band-B, and Band-C.

Settings of impedances described above are achieved by adjusting the common terminal 100*c*-side impedances of the filters 21 to 23 and the element values of the capacitors C1, C2 and inductors L1, Ls that make up the matching circuit 17 as appropriate.

In this regard, in the present embodiment, as described above, the filters 21 to 23 are acoustic wave filters. Therefore, in each of the filters 21 to 23, the common terminal 100*c*-side impedance can be adjusted by designing the impedance of the acoustic wave resonator connected closest to the common terminal 100*c* such that the impedance is higher or lower than that of each of the other acoustic wave resonator(s). For example, when the filters 21 to 23 each are made up of SAW resonators, the common terminal 100*c*-side impedance can be adjusted by adjusting electrode parameters, such as the pitch, overlap width, number of pairs of electrode fingers, and reflector-to-interdigital transducer electrode gap, of electrode fingers that make up an interdigital transducer electrode.

With the above-described impedance design of the paths 111 to 113, the multiplexer 70 according to the present modification is able to perform matching during any operation when each of the switches SW1 to SW3 of the matching circuit 17 is switched between the on state and the off state as appropriate.

Figure 37:
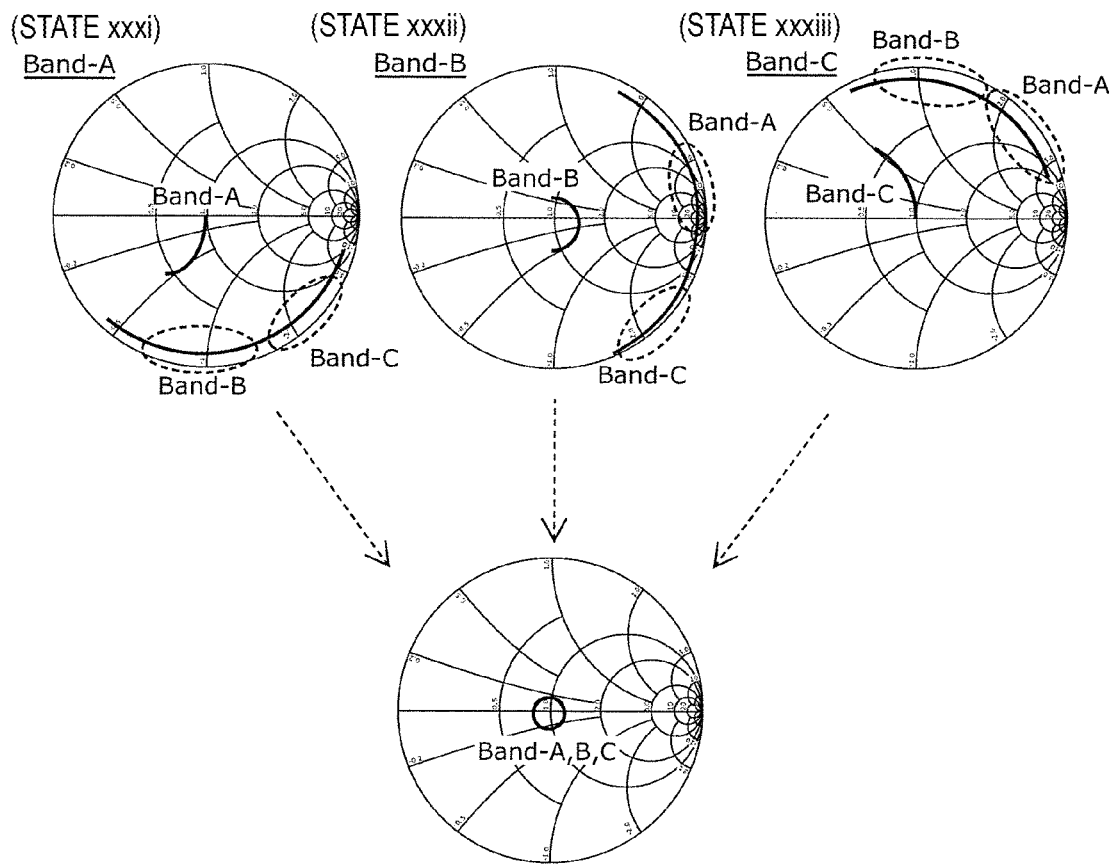
FIG. 37 is a schematic view that illustrates matching during three-band CA operation in the fourth modification.

FIG. 37 is a schematic view that illustrates matching during three-band CA operation (3CA (Band-A/Band-B/Band-C)) in the present modification. During three-band CA operation, that is, when the multiplexer 70 simultaneously transfers a radio-frequency signal in Band-A, a radio-frequency signal in Band-B, and a radio-frequency signal in Band-C, each of the switch SW1, the switch SW2, and the switch SW3 is set to the off state. With this configuration, the impedance of the common terminal 100c is a combined impedance of the states xxxi to xxxiii shown at the top of the chart.

Specifically, in the present modification, as described above, the combined impedance of the state xxxi to the state xxxiii is set so as to have a complex conjugate relation in Band-A, Band-B, and Band-C. Thus, the combined impedance gathers near the center on the Smith chart in any of Band-A, Band-B, and Band-C, as shown at the bottom of the chart.

Therefore, the multiplexer 70 is able to perform matching for any of the three bands during three-band CA operation. In other words, the impedance of the common terminal 100c is matched to about 50Ω in all Band-A, Band-B, and Band-C.

During non-CA operation for Band-A, Band-B, or Band-C, as in the case of the multiplexer 10 according to the first embodiment, the impedance of the common terminal 100c can be matched to about 50Ω in each of Band-A, Band-B, and Band-C when each of the switches SW1, SW2, SW3 is set to the on state or off state as appropriate.

During 2CA operation in which, of Band-A, Band-B, and Band-C, two bands are simultaneously operated, as in the case of the multiplexer 10 according to the first embodiment, the impedance of the common terminal 100c can be matched to about 50Ω in two bands selected from among Band-A, Band-B, and Band-C when each of the switches SW1, SW2, SW3 is set to the on state or off state as appropriate.

As described above, the multiplexer 70 according to the present modification is able to perform matching in a pass band(s) during any of CA operation and non-CA operation.

In the multiplexer 70 according to the present modification, an inductor L2 (second inductor) may be disposed in series instead of the capacitor C2 disposed in the second path. With the multiplexer 70 according to the present modification, in which the capacitor C2 is disposed in series in the second path, an insertion loss in a pass band(s) is reduced. On the other hand, with the multiplexer in which the inductor L2 is disposed in series in the second path, a large attenuation in a harmonic band is ensured.

Figure 38:
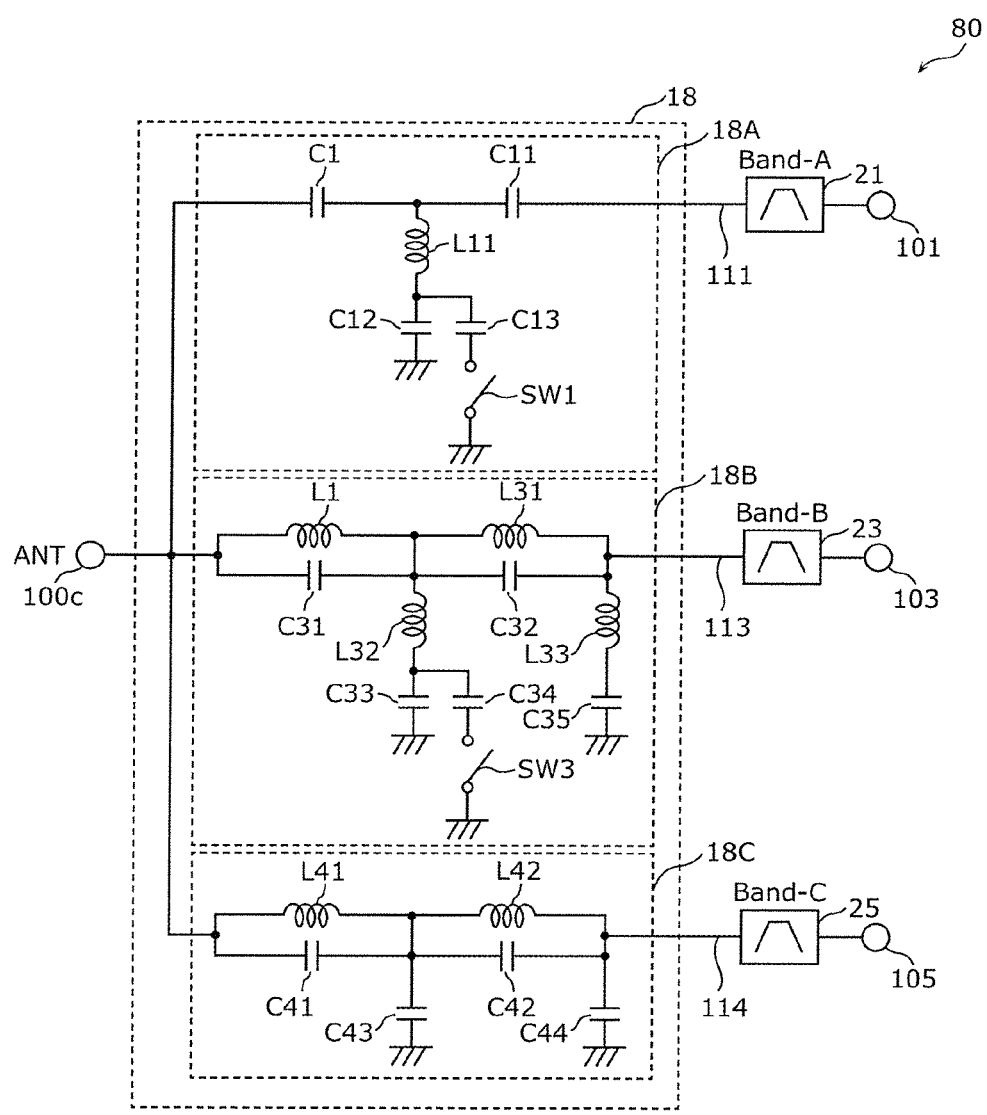
FIG. 38 is a diagram that shows the configuration of a multiplexer according to a fifth modification.

FIG. 38 is a diagram that shows the configuration of a multiplexer 80 according to a fifth modification. The multiplexer 80 shown in the diagram differs from the multiplexer 60 according to the third modification in that a filter circuit 18C and a filter 25, disposed in a path 114, are added and a matching circuit 18 has a filter function.

The multiplexer 80 includes the common terminal 100c, the matching circuit 18, and the filters 21, 23, 25.

The filter 21 is connected to the common terminal 100c via the matching circuit 18. The filter 21 is a first filter that passes a radio-frequency signal in Band-A (first frequency band). The filter 23 is connected to the common terminal 100c via the matching circuit 18. The filter 23 is a third filter that passes a radio-frequency signal in Band-B (third frequency band) lower in frequency than Band-A (first frequency band). The filter 25 is connected to the common terminal 100c via the matching circuit 18. The filter 25 is a fourth filter that passes a radio-frequency signal in Band-C (fourth frequency band) different from Band-A (first frequency band) or Band-B (third frequency band).

The matching circuit 18 includes a high pass filter 18A and low pass filters 18B, 18C.

The high pass filter 18A is disposed between the common terminal 100c and the filter 21. The high pass filter 18A includes an inductor L11, capacitors C1 (first capacitor), C11, C12, C13, and the switch SW1 (first switch). The capacitors C1, C11 are disposed in series in the path 111 (first path) connecting the common terminal 100c and the filter 21. The inductor L11 and the capacitor C12 make up an LC series circuit. A circuit in which the capacitor C13 and the switch SW1 are connected in series is connected between the ground and a connection node between the inductor L11 and the capacitor C12. With the above configuration, when the switch SW1 is switched between the on state and the off state, a lower frequency-side attenuation pole and pass band lower frequency-side edge of the high pass filter 18A change. In other words, the high pass filter 18A is a filter that includes the capacitor C1 and that passes a radio-frequency signal in Band-A (first frequency band). The high pass filter 18A may be a band pass filter having a predetermined pass band.

The low pass filter 18B is disposed between the common terminal 100c and the filter 23. The low pass filter 18B includes inductors L1 (first inductor), L31, L32, L33, capacitors C31, C32, C33, C34, C35, and the switch SW3 (third switch). The inductors L1, L31 are disposed in series in the path 113 (third path) connecting the common terminal 100c and the filter 23. More specifically, a series arm circuit in which the inductor L1 and the capacitor C31 are connected in parallel and a series arm circuit in which the inductor L31 and the capacitor C32 are connected in parallel are connected in series with each other in the path 113. The two series arm circuits each are an LC parallel resonant circuit. The inductor L32 and the capacitor C33 make up an LC series circuit. A circuit in which the capacitor C34 and the switch SW3 are connected in series is connected between the ground and a connection node between the inductor L32 and the capacitor C33. With the above configuration, when the switch SW3 is switched between the on state and the off state, a higher frequency-side attenuation pole and pass band higher frequency-side edge of the low pass filter 18B change. In other words, the low pass filter 18B is a filter that includes the inductor L1 and that passes a radio-frequency signal in Band-B (third frequency band). The low pass filter 18B may be a band pass filter having a predetermined pass band.

The low pass filter 18C is disposed between the common terminal 100c and the filter 25. The low pass filter 18C is a fourth circuit including inductors L41, L42 and capacitors C41, C42, C43, C44. More specifically, a series arm circuit in which the inductor L41 and the capacitor C41 are connected in parallel and a series arm circuit in which the inductor L42 and the capacitor C42 are connected in parallel are connected in series with each other in the path 114 (fourth path) connecting the common terminal 100c and the filter 25. In other words, the low pass filter 18C is a fixed frequency filter circuit that includes one or more inductors and one or more capacitors and that does not include a switch. Namely, the low pass filter 18C is a filter that includes a capacitor(s) or an inductor(s) provided in the fourth path connecting the common terminal 100c and the filter 25 without including a switch and that passes a radio-frequency signal in Band-C (fourth frequency band). The low pass filter 18C may be a band pass filter having a predetermined pass band.

Even with the multiplexer 80 according to the fifth modification, a loss in a pass band(s) is reduced by the matching circuit 18 during any of CA operation and non-CA operation.

The present disclosure also encompasses the configuration in which the filter 25 and the low pass filter 18C are not disposed in the multiplexer 80 according to the fifth modification, that is, the configuration in which, in the multiplexer 80 according to the fifth modification, only the high pass filter 18A and the filter 21, disposed in the path 111 for Band-A (first frequency band), and the low pass filter 18B and the filter 23, disposed in the path 113 for Band-B (third frequency band), are provided.

In the above-description, the multiplexers that are used in a 50Ω system are described as examples. Therefore, the description is made on the assumption that matching the impedance of the common terminal 100c to about 50Ω means "matching". However, the multiplexers are not limited thereto, and may be used in other impedance systems, such as a 75Ω system. In other words, matching means reducing a loss due to mismatching (ideally, reducing a loss to zero) by bringing the impedance at the common terminal 100c of a multiplexer close to the impedance of a transmission system in which the multiplexer is used.

In the above description, each of the plurality of filters that make up the multiplexer is an acoustic wave filter. However, the configuration of the plurality of filters is not limited thereto. Alternatively, each of the plurality of filters may be, for example, a dielectric filter or an LC filter, or may be a filter in which at least one of a plurality of capacitors that make up an LC filter is replaced with an acoustic wave resonator.

For example, in each of the multiplexers, an inductor or a capacitor may be further connected, or a circuit element other than an inductor or a capacitor, such as a resistive element may be connected.

The above-described multiplexers may be used not only as multiplexers that branch a radio-frequency signal inputted from the antenna 4 to the common terminal 100c or combine a plurality of radio-frequency signals input to individual terminals but also as, for example, a combiner that combines radio-frequency signals inputted from amplifier circuits or other circuits to a plurality of individual terminals and output the combined radio-frequency signals from the common terminal 100c to an RFIC, or the like.

The plurality of filters of each of the multiplexers is not limited to the above configuration. For example, at least one of the plurality of filters is not limited to a ladder circuit and may be configured as a longitudinally-coupled resonator. Furthermore, for example, at least one of the plurality of filters is not limited to an acoustic wave filter and may be a dielectric filter, an LC filter, or another filter.

The present disclosure is widely usable in communication equipment, such as cellular phones, as a multiplexer that is used in a low-loss radio-frequency front-end circuit or communication device that supports a plurality of frequency bands.

1, 1A communication device
2, 2A radio-frequency front-end circuit
3 RFIC
4 antenna
10, 10A, 20, 30, 40, 50, 60, 70, 80, 90 multiplexer
11, 12, 15, 16, 17, 18, 911 matching circuit
18A high pass filter
18B, 18C low pass filter
21 to 25, 31 to 34 filter
100c common terminal
101 to 105 individual terminal
111, 112, 113, 114 path
200 amplifier circuit group
201 to 203 amplifier circuit
C1, C11, C12, C13, C2, C31, C32, C33, C34, C35, C41, C42, C43, C44, C91, C92 capacitor
L1, L11, L2, L31, L32, L33, L41, L42, L91, L92, Ls inductor
MSL1 to MSL3 transmission line
p21 to p23, p31 to p33 parallel arm resonator
reso1, reso2 resonator
s21 to s23, s31 to s34 series arm resonator
SW1 to SW4 switch
SW91, SW92 grounding switch

The invention claimed is:

1. A multiplexer comprising:
a common terminal;
a matching circuit;
a first filter connected to the common terminal via a first path through the matching circuit, the first filter being configured to pass a radio-frequency signal in a first frequency band;
a second filter connected to the common terminal via a second path through the matching circuit, the second filter being configured to pass a radio-frequency signal in a second frequency band, the second frequency band being lower in frequency than the first frequency band; and
a third filter connected to the common terminal via a third path through the matching circuit, the third filter being configured to pass a radio-frequency signal in a third frequency band, the third frequency band being lower in frequency than the second frequency band, wherein:
the matching circuit comprises:
a first capacitor connected in the first path,
a first switch connected between ground and a node in the first path, the node in the first path being between the first capacitor and the first filter,
a resonant circuit connected in the second path, the resonant circuit having a resonant frequency in the second frequency band, and the resonant frequency being a frequency at which an impedance is a minimum,
a second switch connected between ground and a node in the second path, the node in the second path being between the resonant circuit and the second filter,
a first inductor connected in the third path, and
a third switch connected between ground and a node in the third path, the node in the third path being between the first inductor and the third filter.

2. The multiplexer according to claim 1, wherein:
when the first switch is in an OFF state, a first impedance of the first path in the first frequency band, as viewed from the common terminal, is located in a lower left quadrant of a Smith chart,
when the second switch is in an OFF state, a second impedance of the second path in the second frequency band, as viewed from the common terminal, is located near a center of a Smith chart, and
when the third switch is in an OFF state, a third impedance of the third path in the third frequency band, as viewed from the common terminal, is located in an upper left quadrant of a Smith chart.

3. The multiplexer according to claim 2, wherein:
when the first switch is in the OFF state, the first impedance has a capacitive characteristic in the second frequency band and the third frequency band,
when the second switch is in the OFF state, the second impedance has an inductive characteristic in at least part of the first frequency band, and has a capacitive characteristic in the third frequency band, and
when the third switch is in the OFF state, the third impedance has an inductive characteristic in the first frequency band and the second frequency band.

4. The multiplexer according to claim 1, wherein the resonant circuit comprises an acoustic wave resonator.

5. The multiplexer according to claim 4, wherein:
the second filter is an acoustic wave filter comprising one or more acoustic wave resonators, and
when the second switch is in an OFF state, the acoustic wave resonator of the resonant circuit and the one or more acoustic wave resonators of the second filter form a ladder circuit that passes the radio-frequency signal in the second frequency band.

6. A radio-frequency front-end circuit comprising:
the multiplexer according to claim 1; and
an amplifier circuit connected to the multiplexer.

7. A communication device comprising:
the radio-frequency front-end circuit according to claim 6; and
a radio-frequency (RF) signal processing circuit configured to process a radio-frequency signal output to the radio-frequency front-end circuit or a radio-frequency signal input from the radio-frequency front-end circuit,
wherein the RF signal processing circuit is further configured to switch each of the first switch, the second switch, and the third switch between an ON state and an OFF state.

8. The multiplexer according to claim 1, wherein:
the first switch is set to an OFF state when the multiplexer passes the radio-frequency signal in the first frequency band, and the first switch is set to an ON state otherwise,
the second switch is set to an OFF state when the multiplexer passes the radio-frequency signal in the second frequency band, and the second switch is set to an ON state otherwise, and
the third switch is set to an OFF state when the multiplexer passes the radio-frequency signal in the third frequency band, and the third switch is set to an ON state otherwise.

9. The multiplexer according to claim 1, wherein:
when the multiplexer passes only the radio-frequency signal in the first frequency band, the first switch is set to an OFF state, and the second switch and the third switch each are set to an ON state,
when the multiplexer passes only the radio-frequency signal in the second frequency band, the second switch is set to an OFF state, and the first switch and the third switch each are set to an ON state, and
when the multiplexer passes only the radio-frequency signal in the third frequency band, the third switch is set to an OFF state, and the first switch and the second switch each are set to an ON state.

10. The multiplexer according to claim 1, wherein:
when the multiplexer simultaneously passes the radio-frequency signal in the first frequency band and the radio-frequency signal in the second frequency band, the first switch and the second switch each are set to an OFF state, and the third switch is set to an ON state,
when the multiplexer simultaneously passes the radio-frequency signal in the first frequency band and the radio-frequency signal in the third frequency band, the first switch and the third switch each are set to an OFF state, and the second switch is set to an ON state, and
when the multiplexer simultaneously passes the radio-frequency signal in the second frequency band and the radio-frequency signal in the third frequency band, the second switch and the third switch each are set to an OFF state, and the first switch is set to an ON state.

11. The multiplexer according to claim 1, wherein when the multiplexer simultaneously passes the radio-frequency signal in the first frequency band, the radio-frequency signal in the second frequency band, and the radio-frequency signal in the third frequency band, the first switch, the second switch, and the third switch each are set to an OFF state.

12. The multiplexer according to claim 1, wherein the resonant circuit comprises an LC series resonant circuit in which an inductor and a capacitor are connected in series.

13. The multiplexer according to claim 1, wherein:
the first filter is an acoustic wave filter comprising one or more acoustic wave resonators, and
a second inductor is connected in the first path between the first filter and the node in the first path, or in the first filter in a path that connects input/output terminals of the first filter.

14. The multiplexer according to claim 1, wherein each of the first filter, the second filter, and the third filter is an acoustic wave filter comprising one or more acoustic wave resonators.

15. The multiplexer according to claim 1, wherein:
the first path, the second path, and the third path are connected to the common terminal, and
the multiplexer further comprises a third inductor connected to the common terminal.

16. The multiplexer according to claim 1, wherein:
the multiplexer comprises a plurality of the second filters that respectively pass mutually different radio-frequency signals in the second frequency band via a plurality of second paths,
the matching circuit comprises:
a plurality of the resonant circuits, each of the resonant circuits associated with a different one of the plurality of second filters and different one of the plurality of second paths, and
a plurality of the second switches, each of the plurality of second switches respectively connected between ground and a node in one of the plurality of second paths between one of the plurality of resonant circuits and one of the plurality of second filters, and between ground and a node in another one of the plurality of second paths, and
each of the plurality of resonant circuits has a resonant frequency in the second frequency band of an associated one of the plurality of second filters.

17. A multiplexer comprising:
a common terminal;
a matching circuit;
a first filter connected to the common terminal via a first path through the matching circuit, the first filter being configured to pass a radio-frequency signal in a first frequency band; and
a third filter connected to the common terminal via a third path through the matching circuit, the third filter being configured to pass a radio-frequency signal in a third frequency band, the third frequency band being lower in frequency than the first frequency band, wherein:

the matching circuit comprises:
- a first capacitor connected in the first path,
- a first switch connected between ground and a node in the first path, the node in the first path being between the first capacitor and the first filter,
- a first inductor connected in the third path, and
- a third switch connected between ground and a node in the third path, the node in the third path being between the first inductor and the third filter, when the first switch is in an OFF state, a first impedance of the first path in the first frequency band, as viewed from the common terminal, is located in a lower left quadrant of a Smith chart, and has a capacitive characteristic in the third frequency band, and when the third switch is in an OFF state, an impedance of the third path in the third frequency band, as viewed from the common terminal, is located in an upper left quadrant of a Smith chart, and has an inductive characteristic in the first frequency band.

18. The multiplexer according to claim 17, further comprising:
a second filter connected to the common terminal via a second path through the matching circuit, the second filter being configured to pass a radio-frequency signal in a second frequency band, the second frequency band being lower in frequency than the first frequency band and higher in frequency than the third frequency band, wherein:

the matching circuit further comprises:
- a second capacitor or a second inductor connected in the second path, and
- a second switch connected between ground and a node in the second path, the node in the second path being between the second filter and the second capacitor or the second inductor, and when the second switch is in an OFF state, an impedance of the second path in the second frequency band, as viewed from the common terminal, is located near a center of a Smith chart, has an inductive characteristic in at least part of the first frequency band, and has a capacitive characteristic in the third frequency band.

19. The multiplexer according to claim 17, wherein the matching circuit comprises:
- a filter that comprises the first capacitor and that is configured to pass the radio-frequency signal in the first frequency band, and
- a filter that comprises the first inductor and that is configured to pass the radio-frequency signal in the third frequency band.

20. The multiplexer according to claim 17, further comprising:
a fourth filter connected to the common terminal via a fourth path through the matching circuit, the fourth filter being configured to pass a radio-frequency signal in a fourth frequency band, the fourth frequency band being different from the first frequency band or the third frequency band, and the matching circuit further comprises a filter that comprises a capacitor or an inductor connected in the fourth path without a switch, the filter of the matching circuit being configured to pass the radio-frequency signal in the fourth frequency band.

* * * * *

UNITED STATES PATENT AND TRADEMARK OFFICE
CERTIFICATE OF CORRECTION

PATENT NO. : 11,043,934 B2
APPLICATION NO. : 16/684690
DATED : June 22, 2021
INVENTOR(S) : Hirotsugu Mori It is certified that error appears in the above-identified patent and that said Letters Patent is hereby corrected as shown below:

In the Specification

Column 20, Line 60, "the reso1 functions as" should read -- the resonator reso1 functions as --.

Column 32, Line 56, "Band 2Rx (3CA (Band" should read -- "Band 2Rx (2CA (Band --.

Signed and Sealed this
Tenth Day of May, 2022

Katherine Kelly Vidal
*Director of the United States Patent and Trademark Office*